United States Patent
Hatakeyama et al.

(10) Patent No.: US 9,040,223 B2
(45) Date of Patent: *May 26, 2015

(54) RESIST COMPOSITION, PATTERNING PROCESS AND POLYMER

(71) Applicant: SHIN-ETSU CHEMICAL CO., LTD., Tokyo (JP)

(72) Inventors: Jun Hatakeyama, Joetsu (JP); Koji Hasegawa, Joetsu (JP); Kenji Funatsu, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/100,088

(22) Filed: Dec. 9, 2013

(65) Prior Publication Data

US 2014/0178820 A1    Jun. 26, 2014

(30) Foreign Application Priority Data

Dec. 26, 2012 (JP) ................................. 2012-281961

(51) Int. Cl.
| | | |
|---|---|---|
| G03F 7/004 | (2006.01) | |
| G03F 7/039 | (2006.01) | |
| G03F 7/30 | (2006.01) | |
| C08F 214/18 | (2006.01) | |
| G03F 7/32 | (2006.01) | |

(52) U.S. Cl.
CPC ............. G03F 7/0046 (2013.01); G03F 7/30 (2013.01); C08F 214/182 (2013.01); C08F 214/186 (2013.01); G03F 7/0045 (2013.01); G03F 7/0392 (2013.01); G03F 7/0397 (2013.01); G03F 7/322 (2013.01); G03F 7/325 (2013.01)

(58) Field of Classification Search
None
See application file for complete search history.

(56) References Cited

U.S. PATENT DOCUMENTS

| | | | |
|---|---|---|---|
| 5,879,851 A | 3/1999 | Takahashi et al. | |
| 6,448,420 B1 | 9/2002 | Kinsho et al. | |
| 6,746,817 B2 | 6/2004 | Takeda et al. | |
| 7,482,108 B2 | 1/2009 | Matsumaru et al. | |
| 7,537,880 B2 | 5/2009 | Harada et al. | |
| 7,598,016 B2 | 10/2009 | Kobayashi et al. | |
| 2004/0005512 A1* | 1/2004 | Mizutani et al. | 430/270.1 |
| 2005/0079446 A1* | 4/2005 | Hatakeyama et al. | 430/281.1 |
| 2006/0147836 A1* | 7/2006 | Hatakeyama et al. | 430/270.1 |
| 2008/0090172 A1 | 4/2008 | Hatakeyama et al. | |
| 2014/0162188 A1* | 6/2014 | Hatakeyama et al. | 430/270.1 |

FOREIGN PATENT DOCUMENTS

| | | |
|---|---|---|
| EP | 0 473 547 A1 | 3/1992 |
| JP | 4-230645 A | 8/1992 |
| JP | 3429592 B2 | 7/2003 |
| JP | 2005-84365 A | 3/2005 |
| JP | 2006-45311 A | 2/2006 |
| JP | 2006-169302 A | 6/2006 |
| JP | 2006-178317 A | 7/2006 |
| JP | 3865048 B2 | 1/2007 |
| JP | 2008-239918 A | 10/2008 |
| JP | 4771974 B2 | 9/2011 |
| JP | 4900603 B2 | 3/2012 |

* cited by examiner

*Primary Examiner* — Sin Lee
(74) *Attorney, Agent, or Firm* — Westerman, Hattori, Daniels & Adrian, LLP

(57) ABSTRACT

An additive polymer comprising recurring styrene units having an ester group bonded to a $CF_3$—$C(OR^2)$—$R^3$ group (wherein $R^2$ is H, acyl or acid labile group, $R^3$ is H, $CH_3$ or $CF_3$) such as 1,1,1,3,3,3-hexafluoro-2-propanol is added to a polymer capable of increasing alkali solubility under the action of acid to formulate a resist composition. The resist composition can minimize outgassing from a resist film during the EUV lithography and form a resist film having a hydrophilic surface sufficient to prevent formation of blob defects on the film after development.

11 Claims, No Drawings

RESIST COMPOSITION, PATTERNING PROCESS AND POLYMER

CROSS-REFERENCE TO RELATED APPLICATION

This non-provisional application claims priority under 35 U.S.C. §119(a) on Patent Application No. 2012-281961 filed in Japan on Dec. 26, 2012, the entire contents of which are hereby incorporated by reference.

TECHNICAL FIELD

This invention relates to a resist composition, and more particularly to a chemically amplified positive resist composition comprising a polymer comprising recurring units having an acid labile group in blend with an additive polymer comprising recurring styrene units having an ester group bonded to a $CF_3$—$C(OR^2)$—$R^3$ group (wherein $R^2$ and $R^3$ are as defined herein) such as 1,1,1,3,3,3-hexafluoro-2-propanol; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration. Resist materials for EB lithography are practically used in the mask image writing application. Recently, the mask manufacturing technology becomes of greater interest. Reduction projection exposure systems or steppers have been used since the time when the exposure light was g-line. While their demagnification factor was 1/5, a factor of 1/4 is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of 1/4 and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 keV to 30 keV and reached 50 keV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EB lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The dry etch resistance of resist film must be improved before the film can be reduced in thickness.

It is generally believed that there is a correlation between the carbon density and the dry etch resistance of resist film. For EB writing which is not affected by absorption, resist materials based on novolac resins having better etch resistance have been developed. Indene copolymers described in Patent Document 1 and acenaphthylene copolymers described in Patent Document 2 are expected to have improved etch resistance due to a high carbon density and a robust main chain structure based on cycloolefin structure.

Also, with respect to the soft x-ray (EUV) lithography at wavelength 5-20 nm, the reduced absorption of carbon atoms was reported. Increasing the carbon density is effective not only for improving dry etch resistance, but also for increasing the transmittance in the soft x-ray wavelength region.

A tradeoff among sensitivity, edge roughness and resolution is reported. Increasing sensitivity leads to reductions of edge roughness and resolution. Controlling acid diffusion improves resolution at the sacrifice of edge roughness and sensitivity. Addition of an acid generator capable of generating a bulky acid is effective for suppressing acid diffusion, but leads to reductions of edge roughness and sensitivity as pointed out above. It is then proposed to copolymerize a polymer with an acid generator in the form of an onium salt having polymerizable olefin. Patent Documents 3 to 5 disclose sulfonium salts having polymerizable olefin capable of generating a sulfonic acid and similar iodonium salts. A photoresist using a base polymer having a polymerizable acid generator copolymerized therein exhibits reduced edge roughness due to controlled acid diffusion and uniform dispersion of acid generator within the polymer, succeeding in improving both resolution and edge roughness at the same time.

One problem in the EUV lithography is that outgassing components from a resist film during exposure adsorb to the surface of a reflecting mirror and mask in the exposure tool to reduce their reflectivity. It is proposed to form a protective film atop the resist film for the purpose of reducing the outgassing. Then, a coater cup is necessary for coating of the protective film. At the early stage of the immersion lithography, a protective film was applied in order to prevent the acid generator from being leached out of the resist film into water. However, the provision of a protective film brings about a drop of throughput and a rise of material cost. Because of these problems, the protective film is gradually going out of use. Under the circumstances, it would be desirable to have a resist material for the EUV lithography which can eliminate or reduce outgassing without the aid of protective film.

Patent Documents 6 and 7 disclose resist materials wherein a copolymer of a styrene derivative with recurring units of fluorinated methacrylate or a copolymer of vinylnaphthalene with recurring units of fluorinated methacrylate is added to a base polymer. When these resist materials are spin coated, the polymer having styrene units or vinylnaphthalene units segregates in a surface layer of the coating, achieving both water-repellent and anti-reflection effects. Patent Documents 6 and 7 also refer to the suppression of outgassing in the EUV lithography. However, the copolymerization of fluorinated methacrylate units with styrene or vinylnaphthalene units achieves insufficient suppression of outgassing. There exists a desire to have a resist surface modifying material capable of effectively shutting off outgassing.

CITATION LIST

Patent Document 1: JP 3865048
Patent Document 2: JP-A 2006-169302
Patent Document 3: JP-A H04-230645
Patent Document 4: JP-A 2005-084365
Patent Document 5: JP-A 2006-045311
Patent Document 6: JP 4771974
Patent Document 7: JP 4900603

DISCLOSURE OF INVENTION

An object of the present invention is to provide a resist composition which can minimize outgassing from a resist film and prevent formation of blob defects during the EUV lithography; and a pattern forming process using the same. Another object of the invention is to provide a polymer useful as additive to the resist composition.

The inventors have found that a satisfactory resist composition is obtainable by combining a polymer capable of increasing alkali solubility under the action of acid as base resin with a polymer comprising recurring styrene units having an ester group bonded to a $CF_3$—$C(OR^2)$—$R^3$ group (wherein $R^2$ is H, acyl or acid labile group, $R^3$ is H, $CH_3$ or $CF_3$) such as 1,1,1,3,3,3-hexafluoro-2-propanol as polymeric additive.

According to the invention, a fluorochemical surfactant of polymer type comprising recurring styrene units having an ester group bonded to a $CF_3$—$C(OR^2)$—$R^3$ group (wherein $R^2$ is H, acyl or acid labile group, $R^3$ is H, $CH_3$ or $CF_3$) such as 1,1,1,3,3,3-hexafluoro-2-propanol (HFA) is added to a polymer or base resin to formulate a resist material. When the resist material is coated, a layer of the polymer comprising recurring styrene units having an ester group bonded to a $CF_3$—$C(OR^2)$—$R^3$ group such as HFA is formed on the surface of the resist film. This surface layer has a high film density enough to prevent outgassing components from escaping from within the resist film. In addition, since the polymer comprising recurring styrene units having an ester group bonded to a $CF_3$—$C(OR^2)$—$R^3$ group such as HFA dissolves in an alkaline developer, it renders the resist surface after exposure and development more hydrophilic and is thus effective for suppressing formation of blob and bridge defects. By virtue of these advantages, the resist material is best suited as a mask blank resist material having long-term stability after coating and stability against exposure in vacuum and an EUV resist material featuring minimal outgassing in vacuum. A pattern forming process using the resist material is also provided.

In one aspect, the invention provides a resist composition comprising a polymer capable of increasing alkali solubility under the action of acid as base resin, and a polymer comprising recurring units (p) of the general formula (1) as polymeric additive.

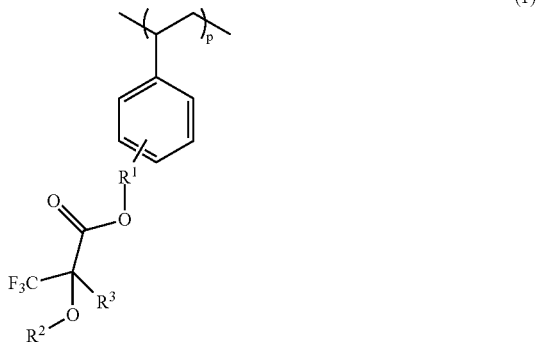

(1)

Herein $R^1$ is a straight or branched $C_1$-$C_4$ alkylene group, $R^2$ is hydrogen, $C_1$-$C_{15}$ acyl group or acid labile group, $R^3$ is hydrogen, methyl or trifluoromethyl, and p is in the range: $0<p\leq1.0$.

In a preferred embodiment, the additive polymer has the general formula (2).

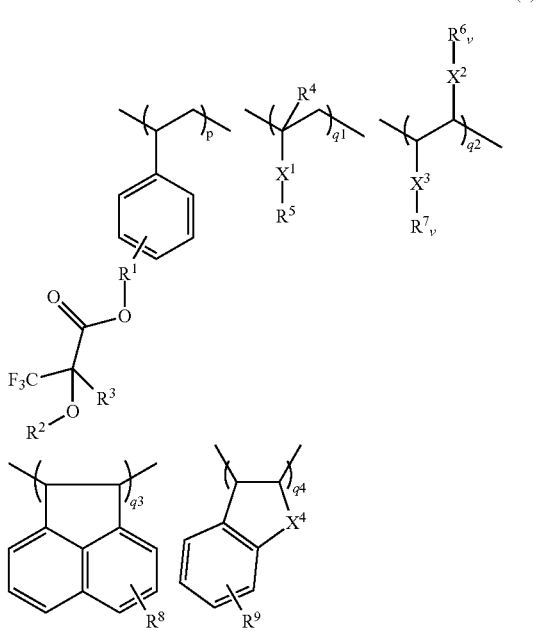

(2)

Herein $R^1$ to $R^3$ are as defined above, $R^4$ is hydrogen or methyl, $X^1$ is a single bond, —C(=O)—O— or —O—, $X^2$ and $X^3$ each are phenylene or naphthylene, $X^4$ is methylene, oxygen or sulfur, $R^5$ is a $C_6$-$C_{20}$ aryl or aralkyl group which may contain a hydroxyl, straight, branched or cyclic alkyl or alkoxy, ester (—OCOR or —COOR wherein R is $C_1$-$C_6$ alkyl), ketone (—COR wherein R is $C_1$-$C_6$ alkyl), fluorine, trifluoromethyl, nitro, amino or cyano moiety, $R^6$, $R^7$, $R^8$, and $R^9$ are each independently hydrogen, hydroxyl, straight, branched or cyclic $C_1$-$C_{10}$ alkyl, alkoxy or acyloxy group, cyano, nitro, amino, halogen, ester (—OCOR or —COOR wherein R is $C_1$-$C_6$ alkyl or fluoroalkyl), or carboxyl group, v is 1 or 2, p, q1, q2, q3 and q4 are in the range: $0<p<1.0$, $0\le q1<1.0$, $0\le q2<1.0$, $0\le q3<1.0$, $0\le q4<1.0$, and $0<q1+q2+q3+q4<1.0$.

Typically the resist composition is a chemically amplified positive resist composition.

In a preferred embodiment, the polymer as base resin comprises recurring units having an acid labile group and recurring units having a hydroxyl and/or lactone ring adhesive group.

More preferably, the polymer as base resin has a weight average molecular weight of 1,000 to 500,000, and the recurring units having an acid labile group are recurring units of at least one type selected from recurring units (a1) and (a2) having a carboxyl and/or phenolic hydroxyl group substituted with an acid labile group, as represented by the general formula (3).

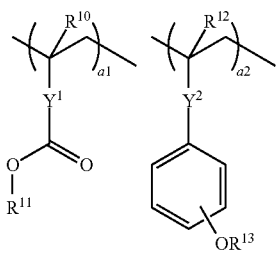

(3)

Herein $R^{10}$ and $R^{12}$ are each independently hydrogen or methyl, $R^{11}$ and $R^{13}$ each are an acid labile group, $Y^1$ is a single bond, a $C_1$-$C_{12}$ linking group having at least one of ester (—COO—), lactone ring, phenylene and naphthylene, a phenylene group or a naphthylene group, $Y^2$ is a single bond, ester (—COO—) group or amide (—CONH—) group, a1 and a2 are numbers in the range: $0\le a1\le 0.9$, $0\le a2\le 0.9$, and $0<a1+a2<1.0$.

Also preferably, the polymer comprising recurring units of at least one type selected from recurring units (a1) and (a2) having a carboxyl and/or phenolic hydroxyl group substituted with an acid labile group, represented by the general formula (3), has further copolymerized therein recurring units of at least one type selected from sulfonium salt units (b1) to (b3), as represented by the general formula (4).

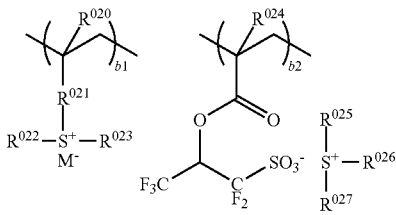

(4)

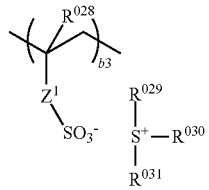

-continued

Herein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene group or phenylene group, which may contain a carbonyl, ester, ether, or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, alkenylene or phenylene group which may contain a carbonyl, ester, ether or hydroxyl moiety, $M^-$ is a non-nucleophilic counter ion, b1, b2 and b3 are in the range: $0\le b1\le 0.3$, $0\le b2\le 0.3$, $0\le b3\le 0.3$, and $0<b1+b2+b3\le 0.3$.

The resist composition may further comprise at least one of an organic solvent, basic compound, dissolution regulator, and surfactant.

Preferably, 0.1 to 50 parts by weight of the additive polymer is present per 100 parts by weight of the polymer as base resin.

In a second aspect, the invention provides a pattern forming process comprising the steps of applying the resist composition defined above onto a substrate to form a coating, baking, exposing the coating to high-energy radiation, and developing the exposed coating in a developer. The high-energy radiation is typically KrF excimer laser of wavelength 248 nm, ArF excimer laser of wavelength 193 nm, electron beam or soft x-ray of wavelength 3 to 15 nm.

In a third aspect, the invention provides a polymer represented by the general formula (2) and having a weight average molecular weight of 1,000 to 500,000.

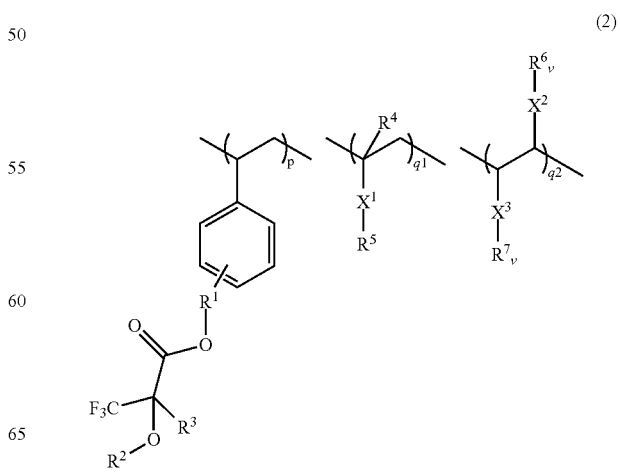

(2)

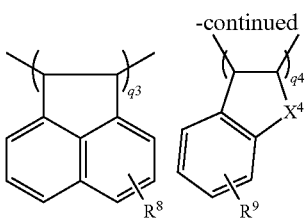

Herein $R^1$ to $R^9$, $X^1$ to $X^4$, v, p, q1, q2, q3 and q4 are as defined above.

ADVANTAGEOUS EFFECTS OF INVENTION

The photoresist film formed using the resist composition of the invention is effective for minimizing the emission of outgassing components from the resist film during the EUV lithography and for reducing edge roughness (LWR) after development. Since the resist film has a hydrophilic surface, it is effective for suppressing formation of blob defects after development.

DESCRIPTION OF EMBODIMENTS

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not.

As used herein, the terminology "(meth)acrylate" refers collectively to acrylate and methacrylate. The terminology "$C_x$-$C_y$", as applied to a particular unit, such as, for example, a chemical compound or a chemical substituent group, means having a carbon atom content of from "x" carbon atoms to "y" carbon atoms per such unit.

The abbreviations have the following meaning.
EB: electron beam
EUV: extreme ultraviolet
PAG: photoacid generator
PEB: post-exposure bake
LER: line edge roughness
LWR: line width roughness
Mw: weight average molecular weight
Mn: number average molecular weight
Mw/Mn: dispersity or average molecular weight distribution
GPC: gel permeation chromatography Making efforts to overcome the outstanding problems, the inventors have found that a resist composition obtained by blending an ordinary base polymer which turns alkali soluble under the action of acid with another polymer comprising recurring styrene units having an ester group bonded to a $CF_3$—$C(OR^2)$—$R^3$ group such as HFA is effective for suppressing the emission of outgassing components from the resist film during exposure in vacuum by the EUV lithography. The other polymer will segregate on the surface of the resist film after spin coating. Because of their robustness and high density, the recurring styrene units having an ester group bonded to a $CF_3$—$C(OR^2)$—$R^3$ group such as HFA are effective for shutting off outgassing from the photoresist film. Since the other polymer comprising recurring styrene units having an ester group bonded to a $CF_3$—$C(OR^2)$—$R^3$ group such as HFA dissolves in an alkaline developer, it is effective for suppressing formation of bridge defects between pattern features after development.

Additive Polymer

One embodiment of the invention is a resist composition characterized by comprising a polymer capable of increasing alkali solubility under the action of acid as base resin, which is often referred to as "base polymer", and a polymer comprising recurring styrene units having an ester group bonded to a $CF_3$—$C(OR^2)$—$R^3$ group such as HFA, which is often referred to as "additive polymer." Specifically, the additive polymer comprises recurring units (p) of the general formula (1).

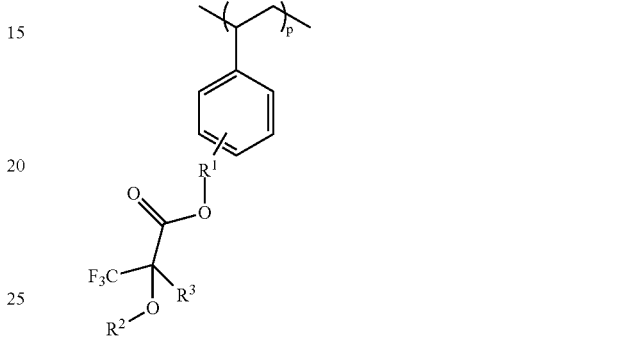

Herein $R^1$ is a straight or branched $C_1$-$C_4$ alkylene group, $R^2$ is hydrogen, a $C_1$-$C_{15}$ acyl group or an acid labile group, $R^3$ is hydrogen, methyl or trifluoromethyl, and p is a number in the range: $0 < p \leq 1.0$.

The resist composition having the polymer comprising recurring units (p) of formula (1) added thereto is coated to form a photoresist film. The photoresist film is characterized in that a polymeric surfactant having copolymerized therein recurring styrene units having an ester group bonded to a $CF_3$—$C(OR^2)$—$R^3$ group such as HFA is present on the film surface. The polymeric surfactant segregates on the photoresist film surface at the end of photoresist coating and functions to suppress the release of outgassing components from the resist film and to minimize defects in the resist pattern after development.

A monomer Mp from which the recurring unit (p) of formula (1) is derived may be represented by the following formula.

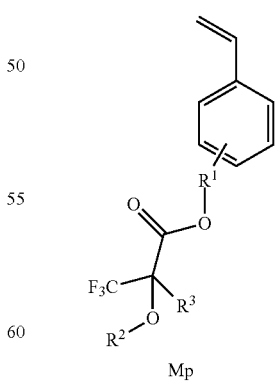

Mp

Herein $R^1$, $R^2$ and $R^3$ are as defined above.

This monomer may be synthesized according to the following Scheme 1 or 2 although the synthesis route is not limited thereto.

Scheme 1

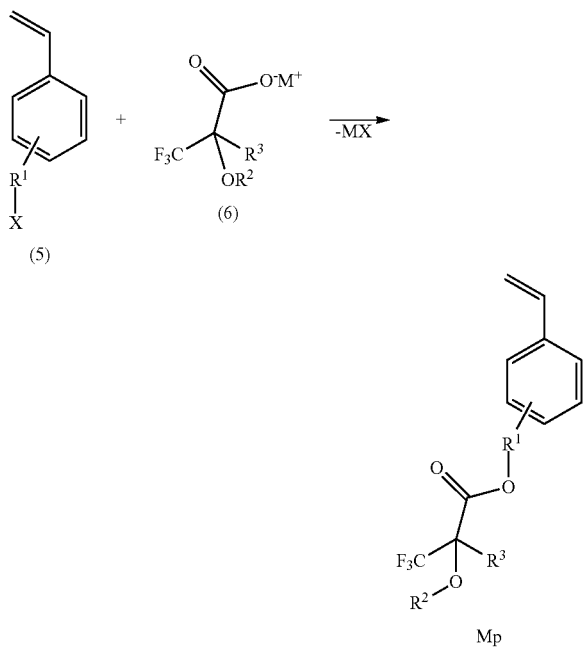

Scheme 2

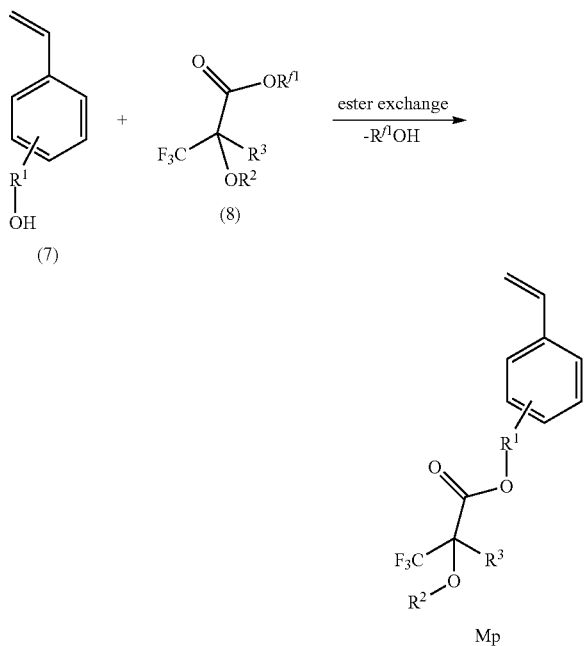

Herein $R^1$, $R^2$ and $R^3$ are as defined above, $R^{f1}$ is hydrogen or a straight, branched or cyclic, monovalent $C_1$-$C_6$ hydrocarbon group, X is halogen, and M is Li, Na, K or substituted or unsubstituted ammonium.

The synthesis route of Scheme 1 is a substitution reaction between styrene derivative (5) and carboxylic acid salt (6) to form the desired monomer Mp. The reaction may be conducted in a standard way. An appropriate amount of carboxylic acid salt (6) used is 0.5 to 10 moles, more preferably 1.0 to 3 moles per mole of styrene derivative (5). If the amount of carboxylic acid salt (6) is less than 0.5 mole, a large fraction of the other reactant may be left unreacted, leading to a substantial drop of percent yield. If the amount of carboxylic acid salt (6) exceeds 10 moles, the process may be uneconomical because of increased material costs and reduced pot yields.

The reaction of Scheme 1 may be conducted in a solvent. Suitable solvents include hydrocarbons such as toluene, xylene, hexane and heptane; chlorinated solvents such as methylene chloride, chloroform, and dichloroethane; ethers such as diethyl ether, tetrahydrofuran and dibutyl ether; ketones such as acetone and 2-butanone; esters such as ethyl acetate and butyl acetate; nitriles such as acetonitrile; alcohols such as methanol and ethanol; aprotic polar solvents such as N,N-dimethylformamide, N,N-dimethylacetamide and dimethyl sulfoxide; and water, which may be used alone or in admixture of two or more. A phase transfer catalyst such as tetrabutylammonium hydrogensulfate may be added to the reaction system. An appropriate amount of the phase transfer catalyst added is 0.0001 to 1.0 mole, more preferably 0.001 to 0.5 mole per mole of styrene derivative (5). Less than 0.0001 mole of the catalyst may fail to achieve the catalytic effect whereas more than 1.0 mole may be uneconomical because of increased material costs.

An appropriate reaction temperature may be selected for the substitution reaction, depending on other reaction conditions, although it is preferably from −70° C. to near the boiling point of the solvent, more preferably from 0° C. to near the boiling point of the solvent. Since noticeable side reactions may occur at higher temperatures, it is important for gaining higher yields that the reaction run at a temperature which is low, but enough to ensure a practically acceptable reaction rate. It is desirable from the yield standpoint to continue the reaction to completion while monitoring the reaction by gas chromatography (GC) or thin layer chromatography (TLC), although the reaction time is usually about 30 minutes to about 40 hours. The monomer Mp may be recovered from the reaction mixture by ordinary aqueous work-up. If necessary, the monomer may be purified by standard techniques like distillation, recrystallization and chromatography.

The synthesis route of Scheme 2 is an ester exchange reaction between styrene derivative (7) and ester (8) to form the desired monomer Mp. The reaction may be effected in a solventless system or in a solvent. Suitable solvents include ethers such as tetrahydrofuran, diethyl ether, di-n-butyl ether, and 1,4-dioxane, and hydrocarbons such as n-hexane, n-heptane, benzene, toluene, xylene and cumene, which may be used alone or in admixture. Suitable catalysts include metal alkoxides such as sodium methoxide, sodium ethoxide, potassium tert-butoxide, magnesium ethoxide, titanium(IV) methoxide, titanium(IV) ethoxide, and titanium(IV) isopropoxide; organic amines such as triethylamine, N,N-dimethylaminopyridine and 1,8-diazabicyclo[5.4.0]-7-undecene; and inorganic bases such as sodium hydroxide, potassium carbonate and sodium carbonate, which may be used alone or in admixture. An appropriate amount of the catalyst added is 0.001 to 5.0 moles, more preferably 0.001 to 0.1 mole per mole of ester (8). The reaction temperature varies with other reaction conditions. Preferably reaction is conducted at a temperature of 50 to 200° C. while distilling off $R^{f1}OH$ formed during reaction. It is desirable from the yield standpoint to continue the reaction to completion while monitoring the reaction by gas chromatography (GC) or silica gel thin layer chromatography (TLC), although the reaction time is usually about 30 minutes to about 20 hours. The monomer Mp may be recovered from the reaction mixture by ordinary aqueous work-up. If necessary, the monomer may be purified by standard techniques like distillation, recrystallization and chromatography.

In formula (1), $R^2$ is hydrogen, a $C_1$-$C_{15}$ acyl group or an acid labile group. Suitable $C_1$-$C_{15}$ acyl groups include formyl, acetyl, ethylcarbonyl, pivaloyl, methoxycarbonyl, ethoxycarbonyl, tert-butoxycarbonyl, trifluoroacetyl and trichloroacetyl. The acid labile group is described later.

Examples of the monomer Mp from which recurring unit (p) is derived are given below.

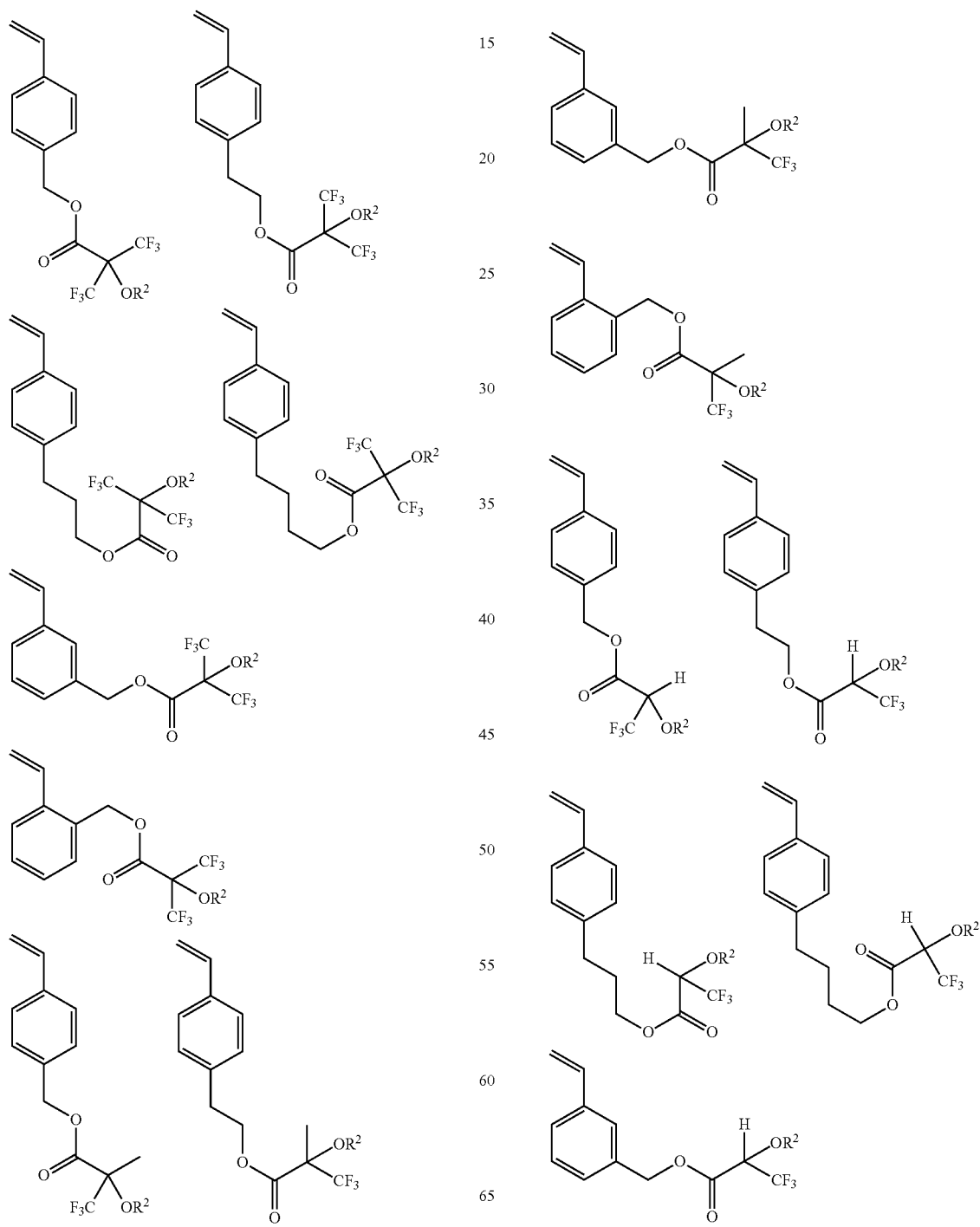

-continued

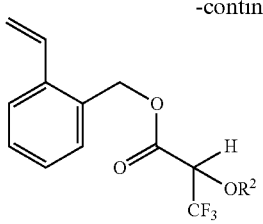

Herein R² is as defined above.

The preferred additive polymer is a polymer comprising the recurring units (p) and recurring units of at least one type selected from recurring units (q1) to (q4), as represented by the general formula (2).

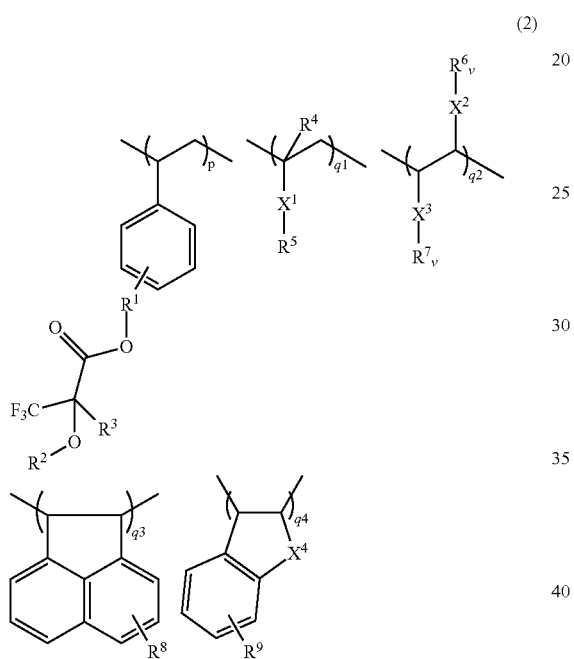

(2)

Herein $R^1$ to $R^3$ are as defined above. $R^4$ is hydrogen or methyl. $X^1$ is a single bond, —C(=O)—O— or —O—, $X^2$ and $X^3$ each are phenylene or naphthylene, $X^4$ is methylene, oxygen or sulfur. $R^5$ is a $C_6$-$C_{20}$ aryl or aralkyl group which may contain a hydroxyl, straight, branched or cyclic alkyl or alkoxy, ester (—OCOR or —COOR wherein R is $C_1$-$C_6$ alkyl), ketone (—COR wherein R is $C_1$-$C_6$ alkyl), fluorine, trifluoromethyl, nitro, amino or cyano moiety. $R^6$, $R^7$, $R^8$, and $R^9$ are each independently hydrogen, hydroxyl, straight, branched or cyclic $C_1$-$C_{10}$ alkyl, alkoxy or acyloxy group, cyano, nitro, amino, halogen, ester (—OCOR or —COOR wherein R is $C_1$-$C_6$ alkyl or fluoroalkyl), or carboxyl group, v is 1 or 2, p, q1, q2, q3 and q4 are in the range: $0<p<1.0$, $0\leq q1<1.0$, $0\leq q2<1.0$, $0\leq q3<1.0$, $0\leq q4<1.0$, and $0<q1+q2+q3+q4<1.0$.

In the additive polymer, recurring units (p), that is, recurring styrene units having an ester group bonded to a $CF_3$—C(OR²)—R³ group such as 1,1,1,3,3,3-hexafluoro-2-propanol (HFA) group are essential, while recurring units of at least one type selected from recurring units (q1) having a $C_6$-$C_{20}$ aryl or aralkyl group, recurring units (q2) derived from stilbene, styrylnaphthalene and dinaphthylethylene derivatives, recurring units (q3) derived from acenaphthylene derivatives, and recurring units (q4) derived from indene, benzofuran, and benzothiophene derivatives are also preferably incorporated to enhance the effect of shutting off outgassing components from the photoresist film during EUV exposure. Of the recurring units (q1), (q2), (q3), and (q4), copolymerization of acenaphthylene units (q3) is most effective for suppressing generation of outgassing components.

Examples of the monomer from which units (q1) to be copolymerized with recurring units (p) in formula (2) are derived are shown below, but not limited thereto.

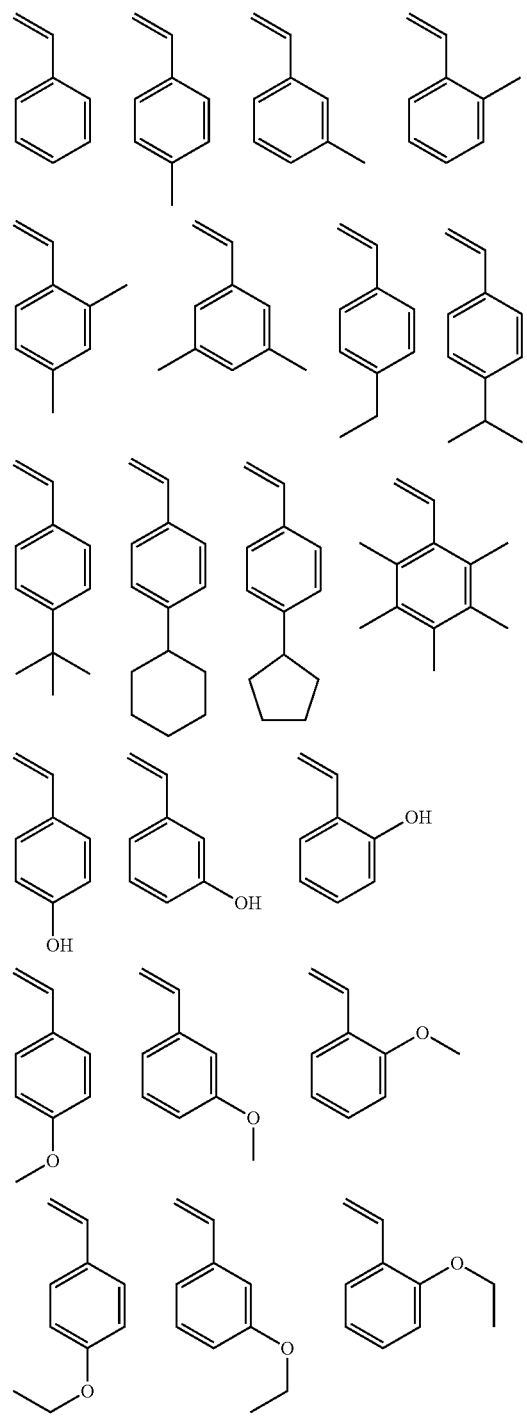

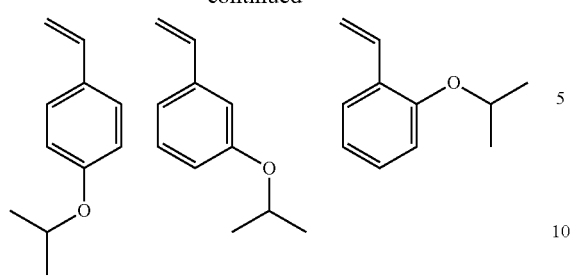
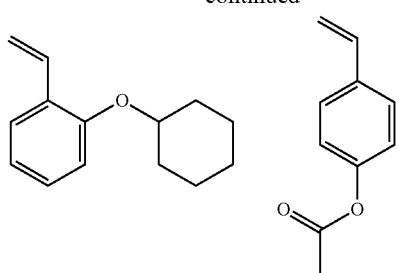
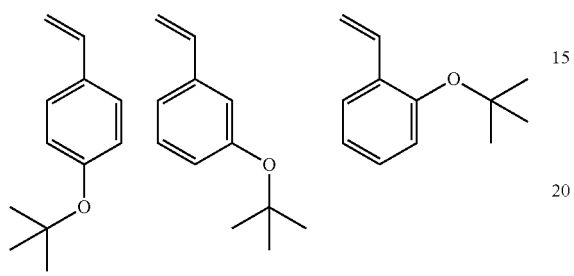
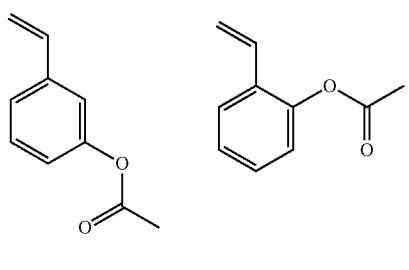
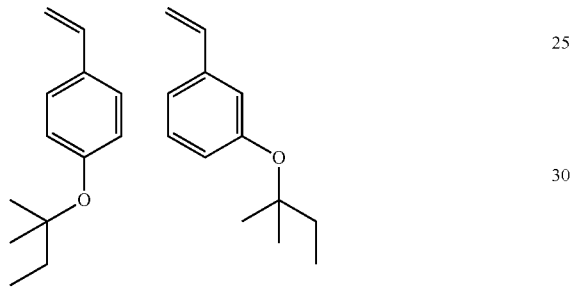
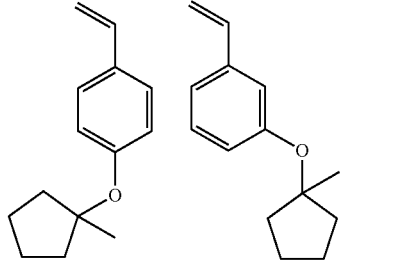
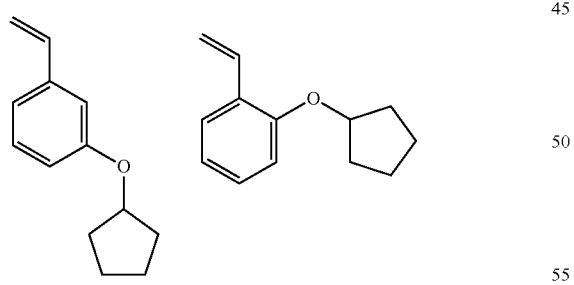
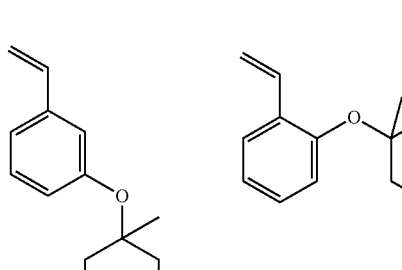
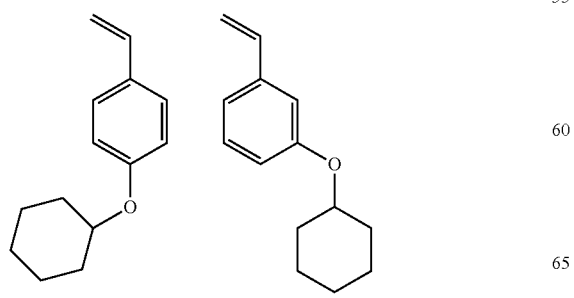
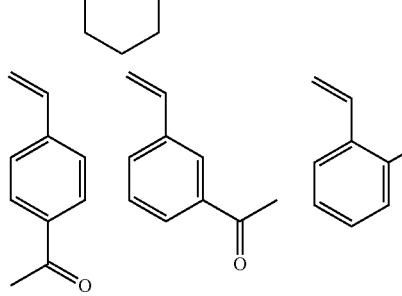

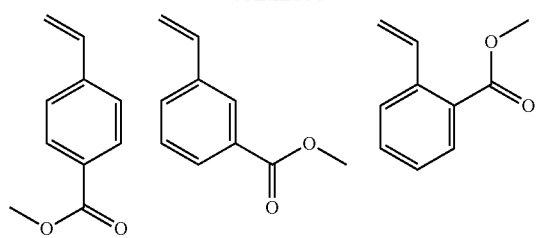
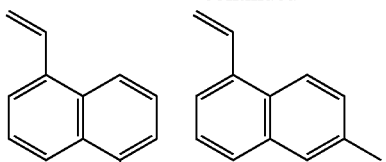
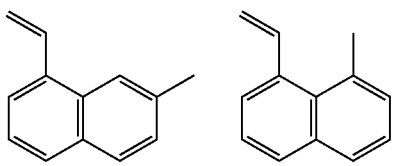
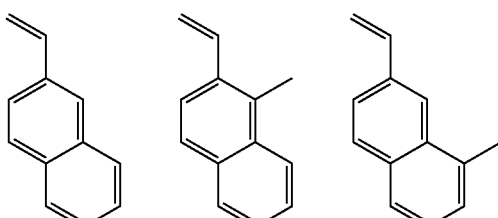
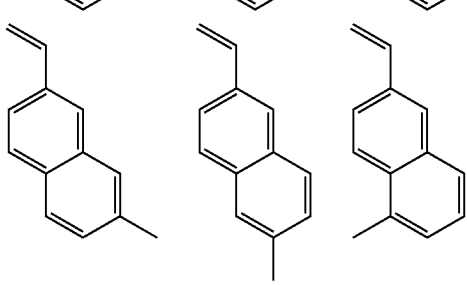
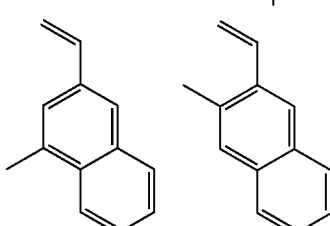
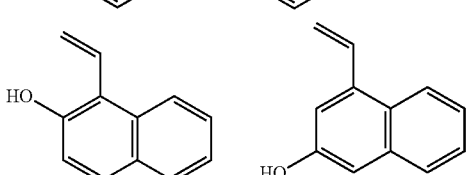
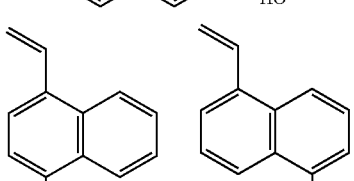
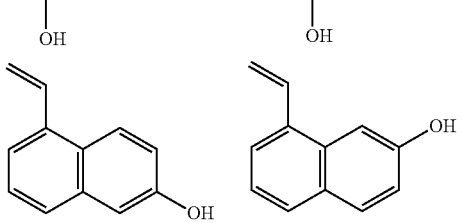

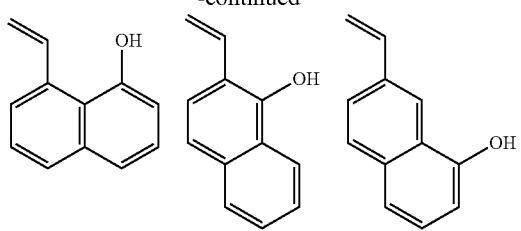
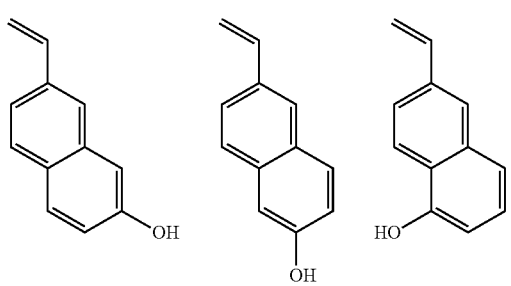
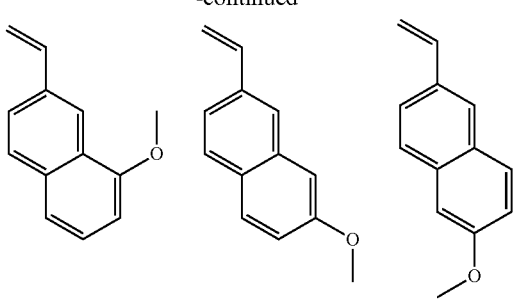

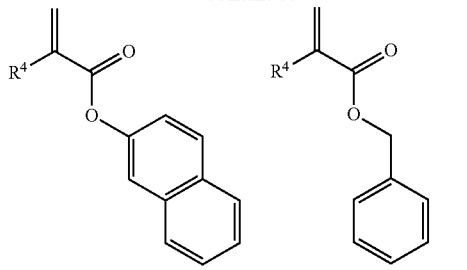
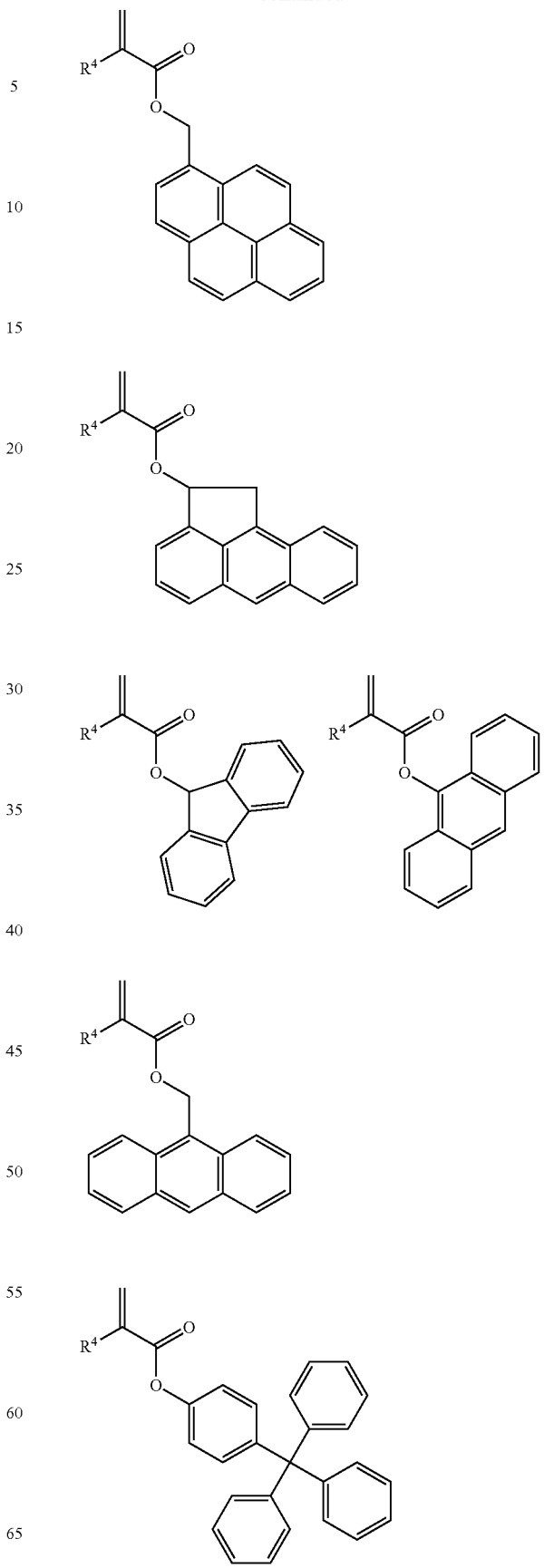

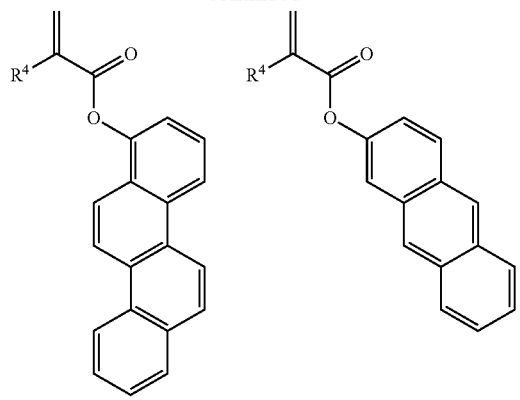
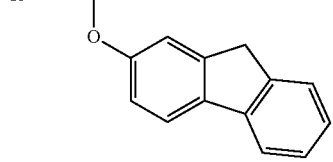
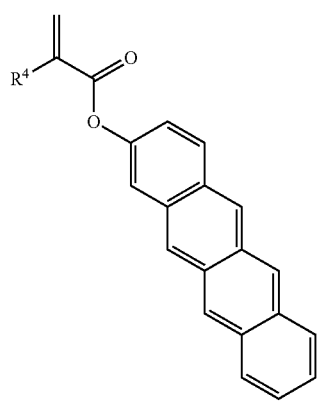
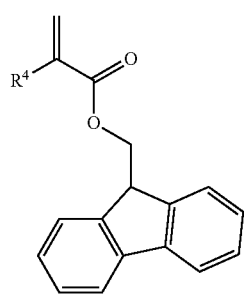
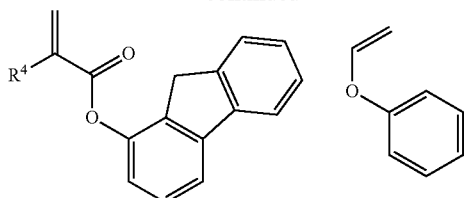
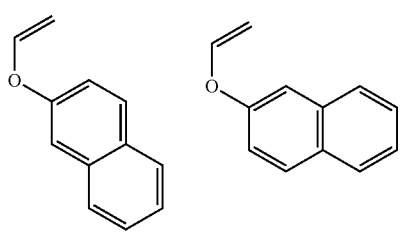
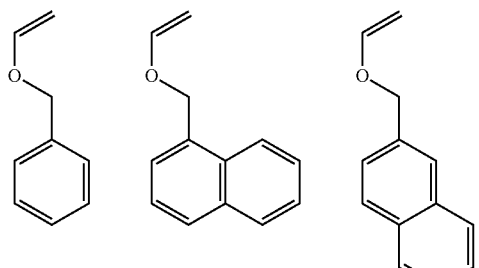
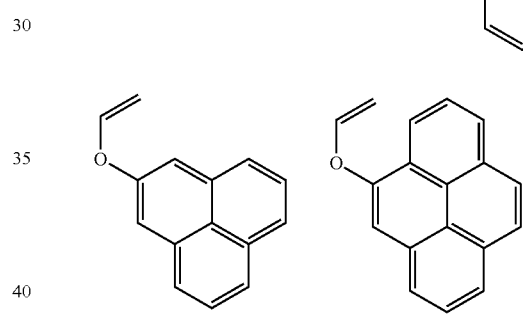
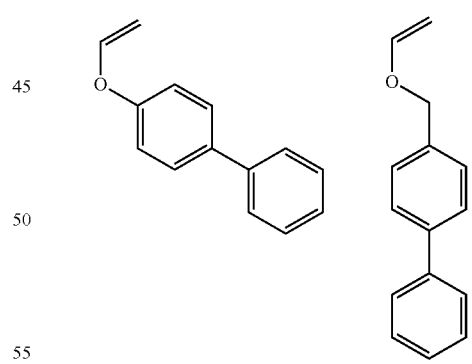
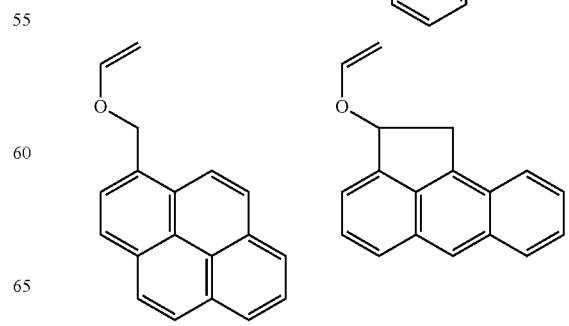

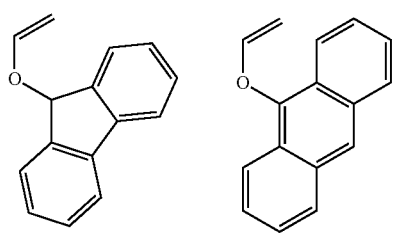
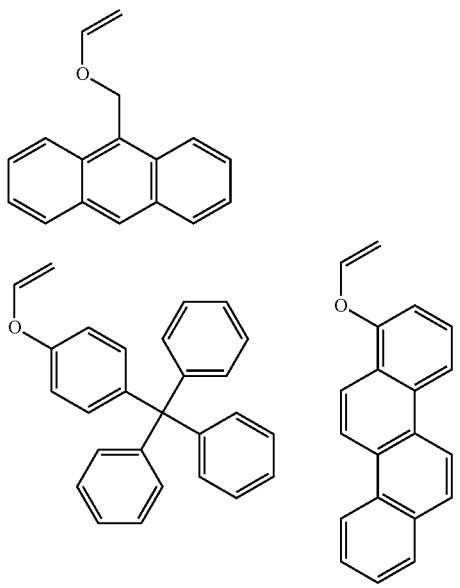
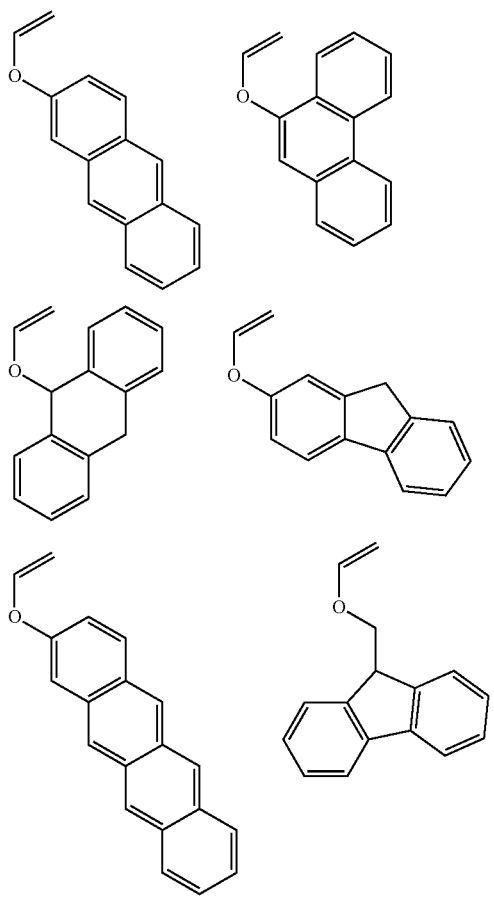
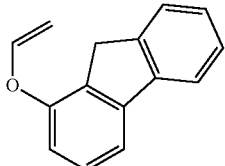
Examples of the monomer from which units (q2) are derived are shown below, but not limited thereto.
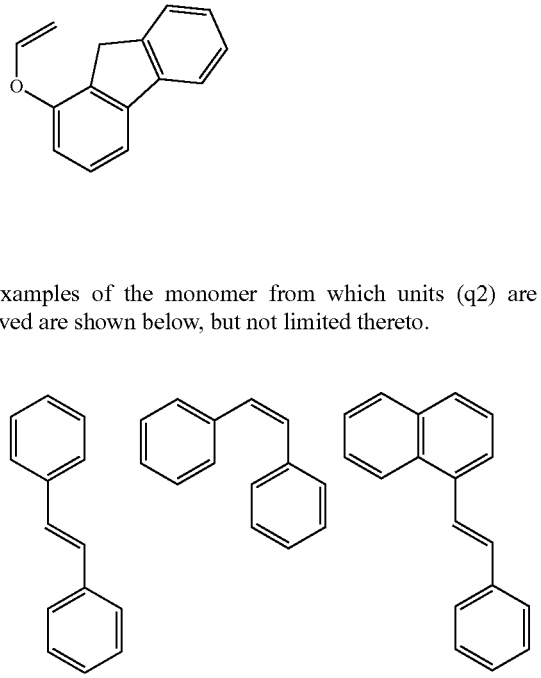
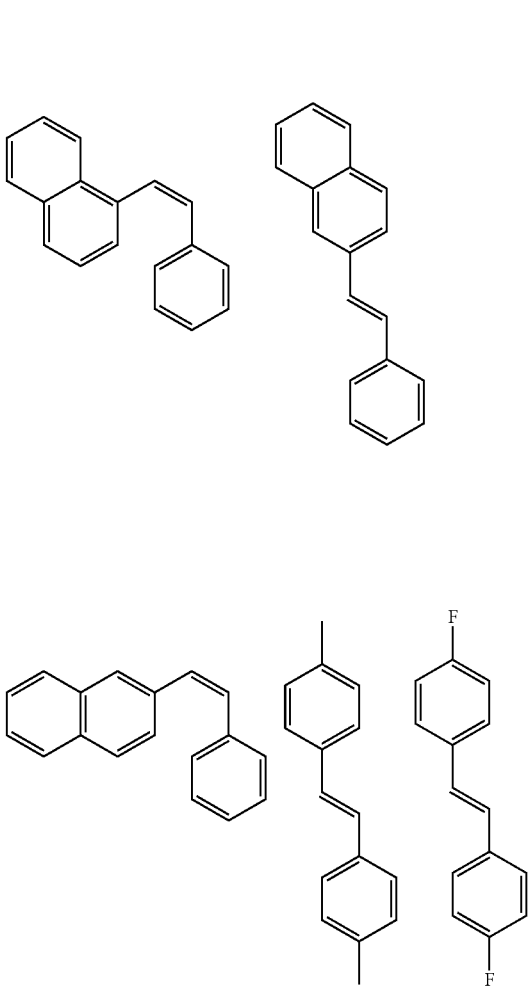

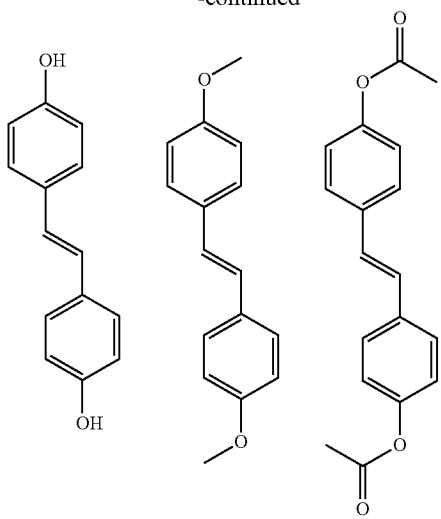
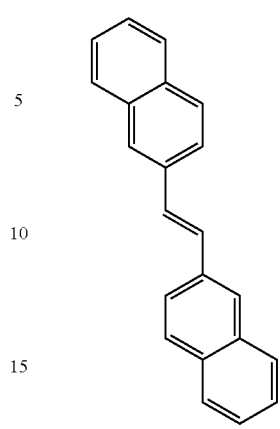
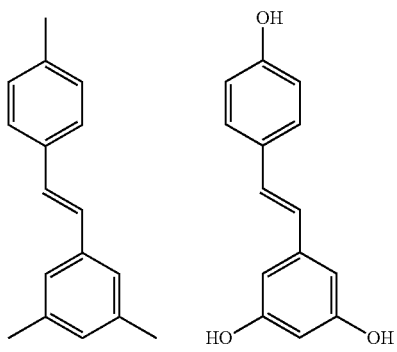
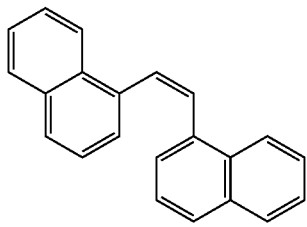
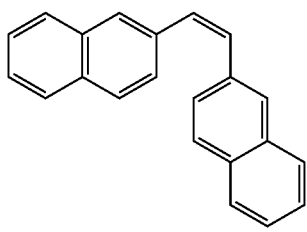
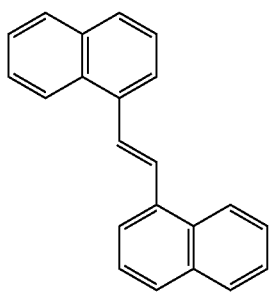
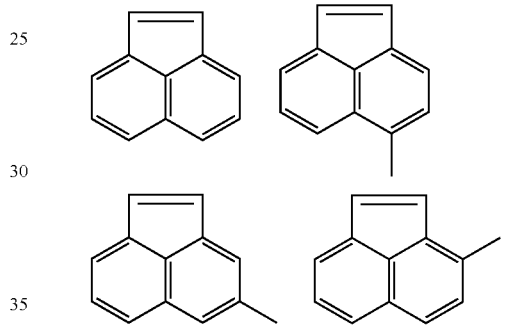
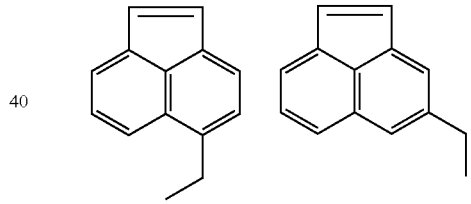
Examples of the monomer from which units (q3) are derived are shown below, but not limited thereto.
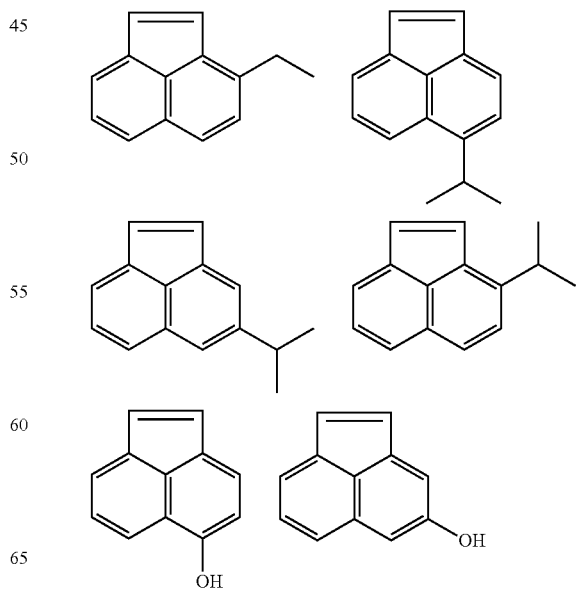

-continued
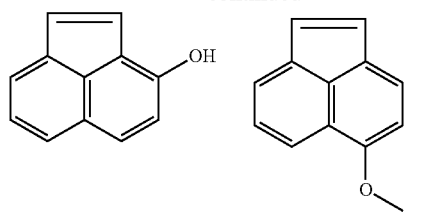
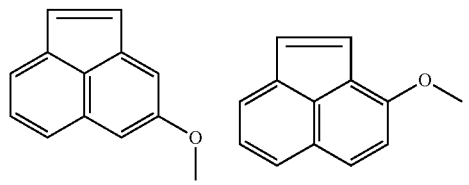
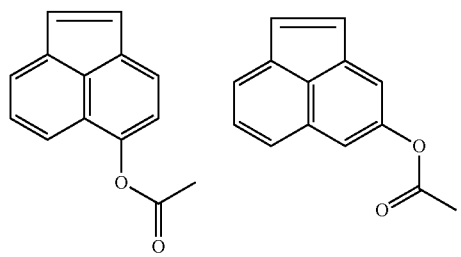
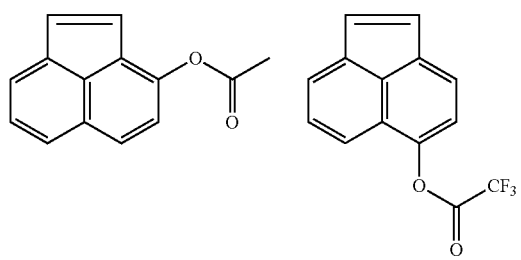
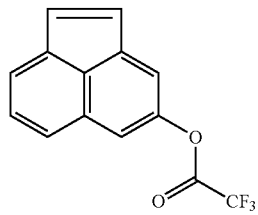
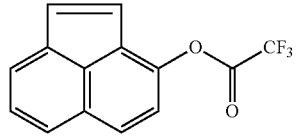
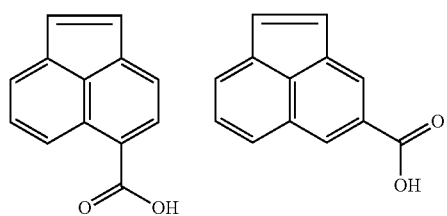
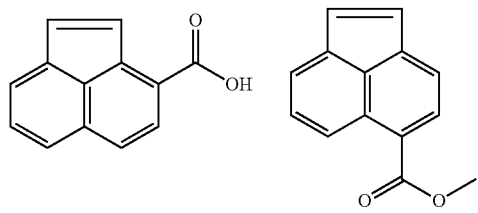
-continued
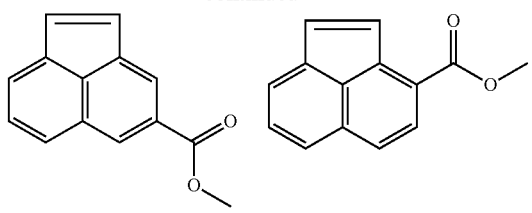
Examples of the monomer from which units (q4) are derived are shown below, but not limited thereto.
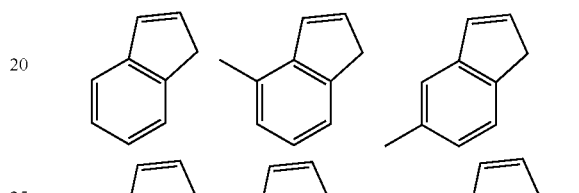
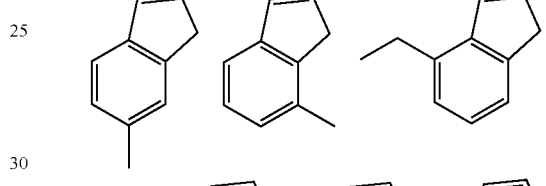
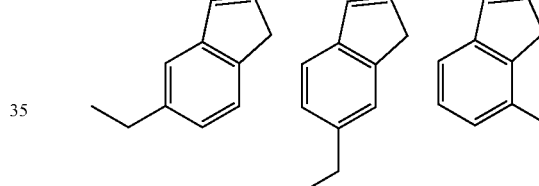
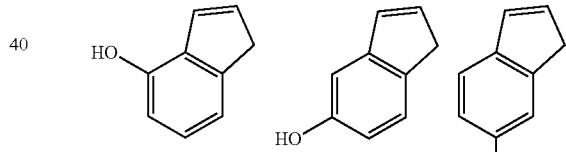
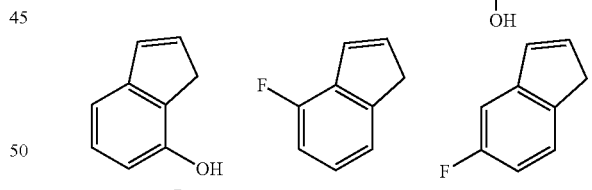
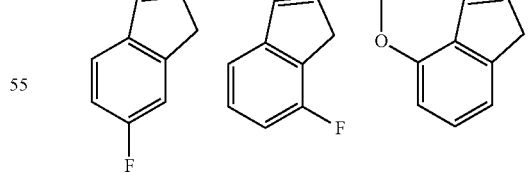
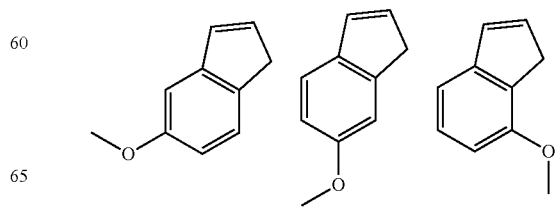

31
-continued
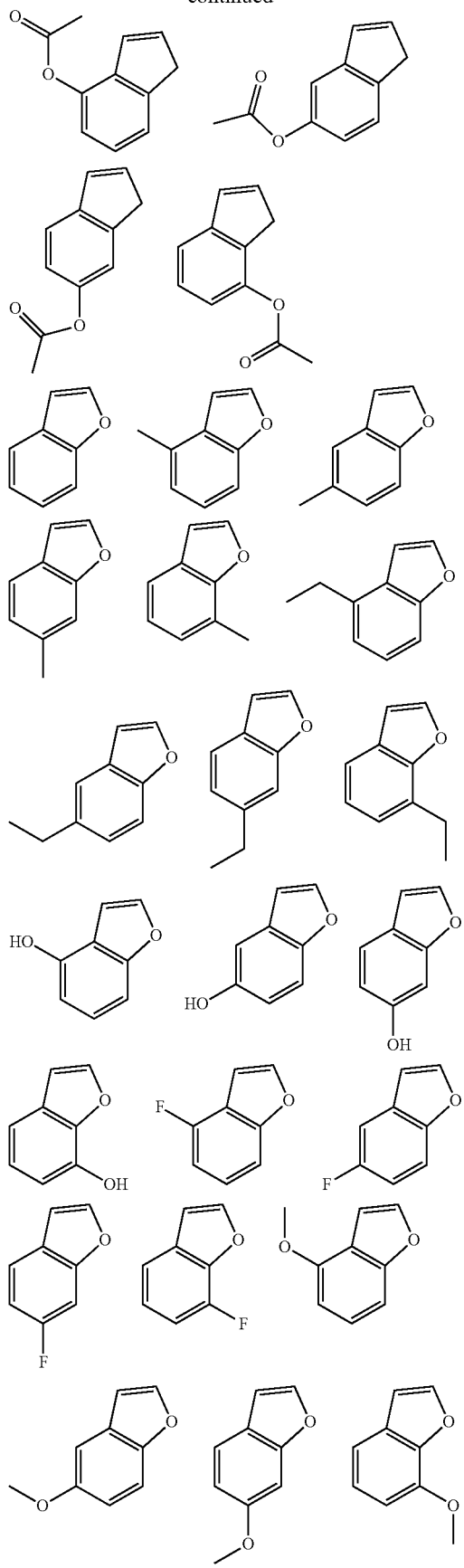
32
-continued
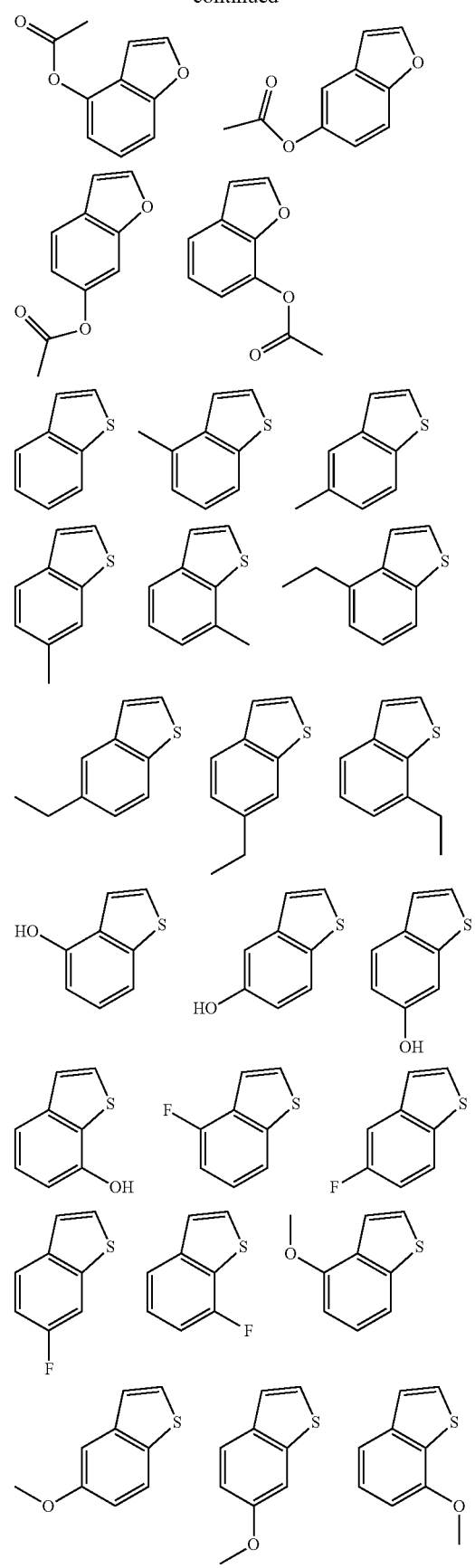

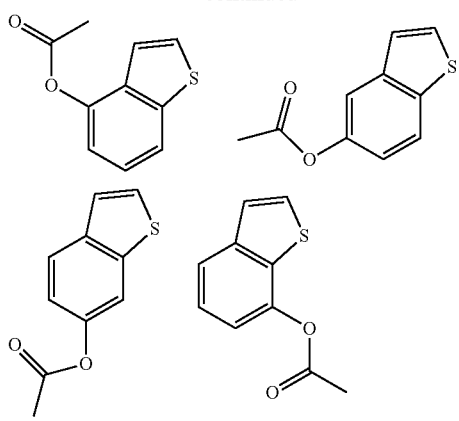

Besides the recurring units (p) and (q1) to (q4) in formula (1) or (2), recurring units (r) having a carboxyl group and/or recurring units (s) having an α-trifluoromethylhydroxy or sulfonamide group may be copolymerized in the additive polymer for the purposes of improving alkaline solubility and rendering more hydrophilic the resist film after development.

Examples of the monomer from which recurring units (r) having a carboxyl group are derived are shown below. Notably, R is hydrogen or methyl.

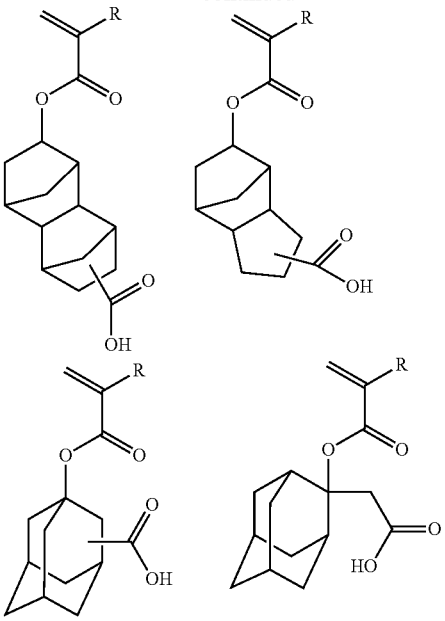

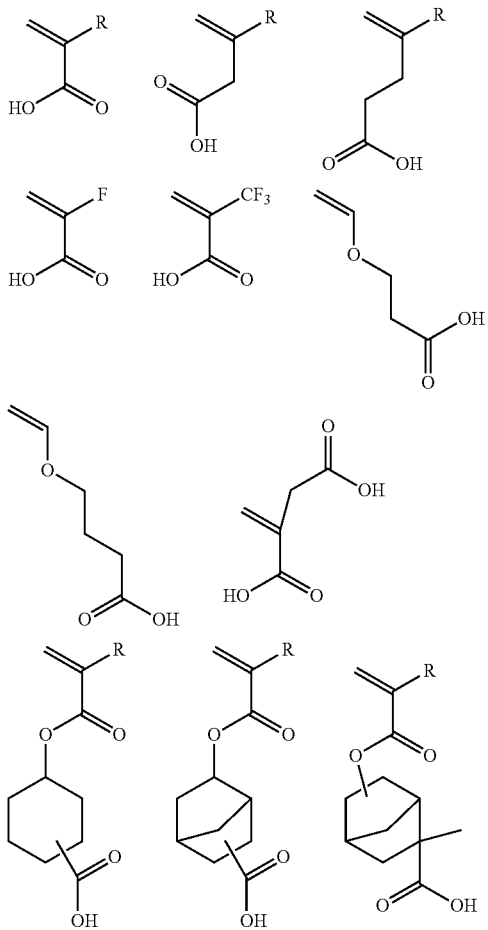

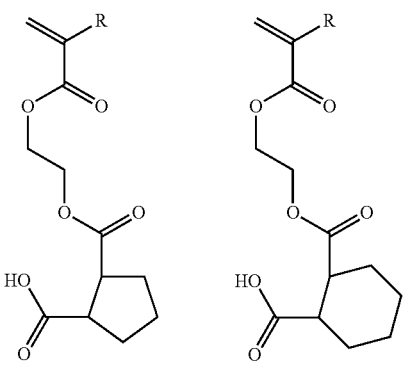

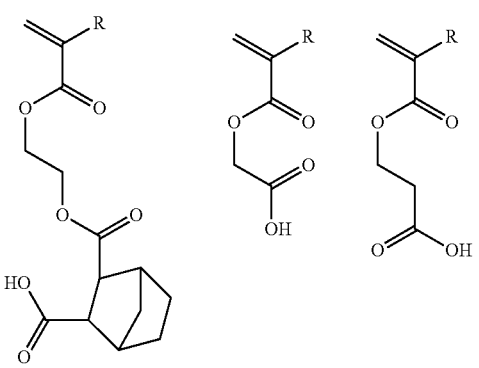

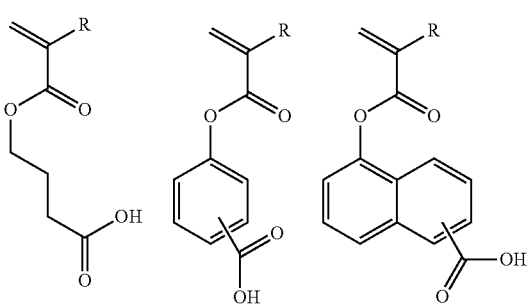

35
-continued
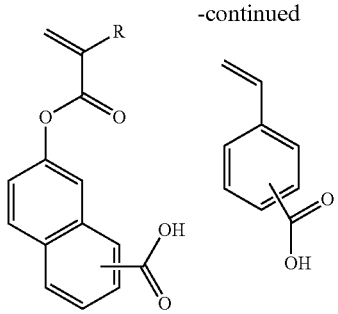
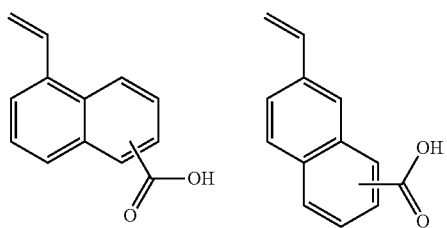
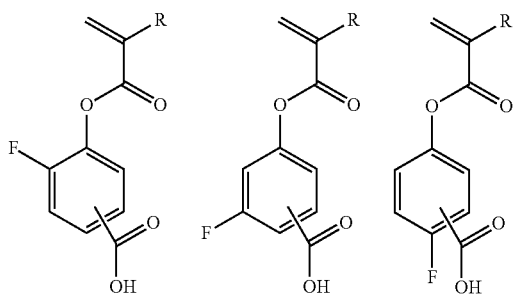
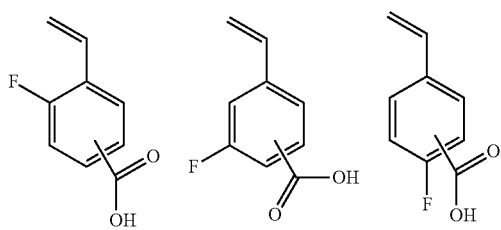
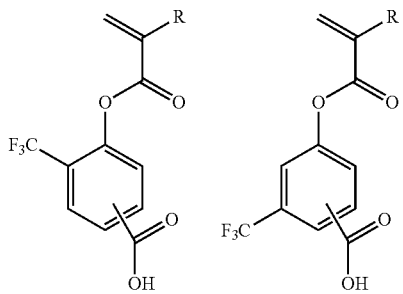
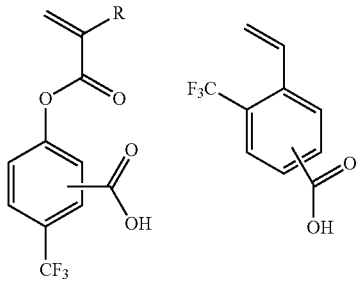
36
-continued
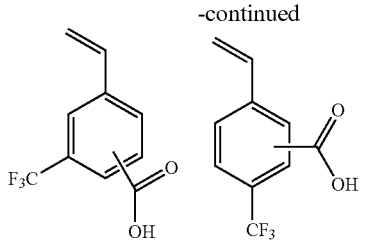
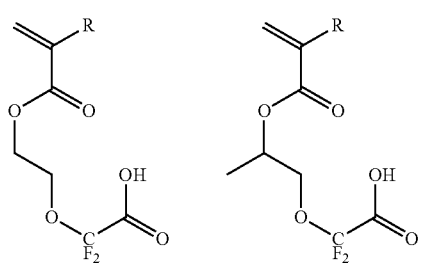
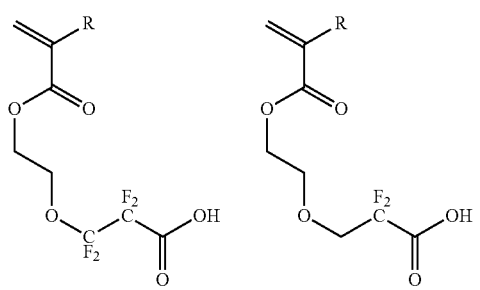
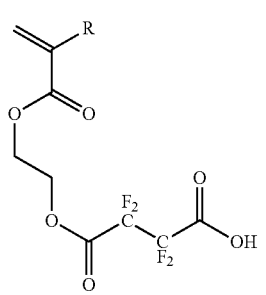
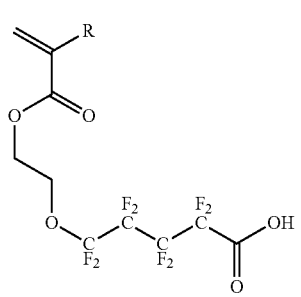
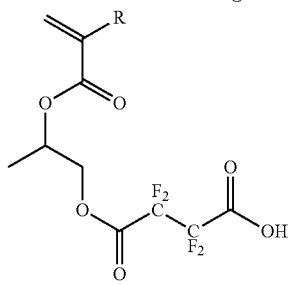

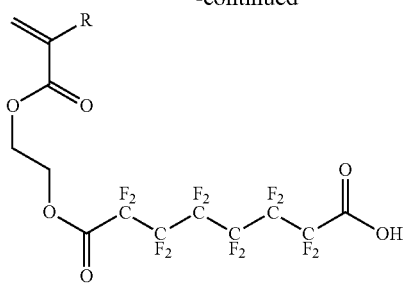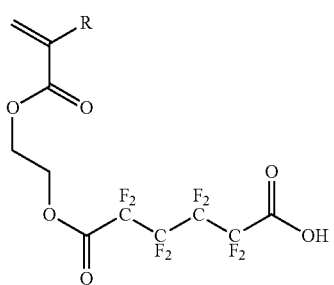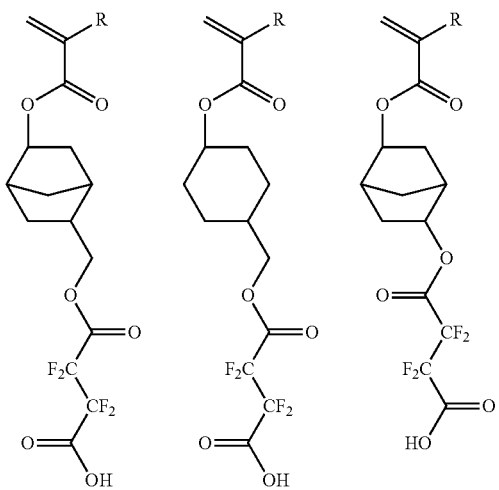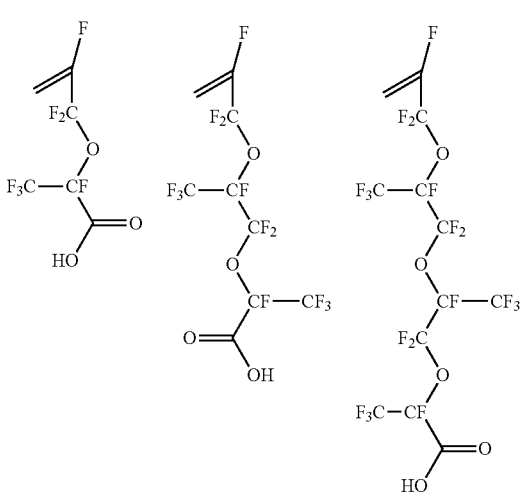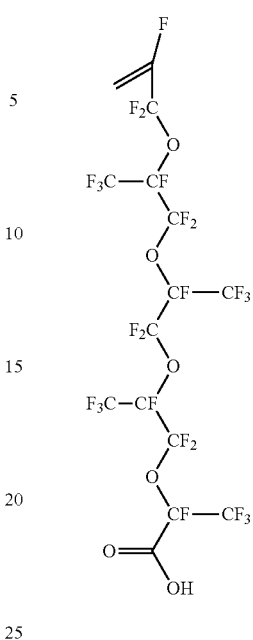
Examples of the monomer from which recurring units (s) having an α-trifluoromethylhydroxy or sulfonamide group are derived are shown below. Notably, R is hydrogen or methyl.
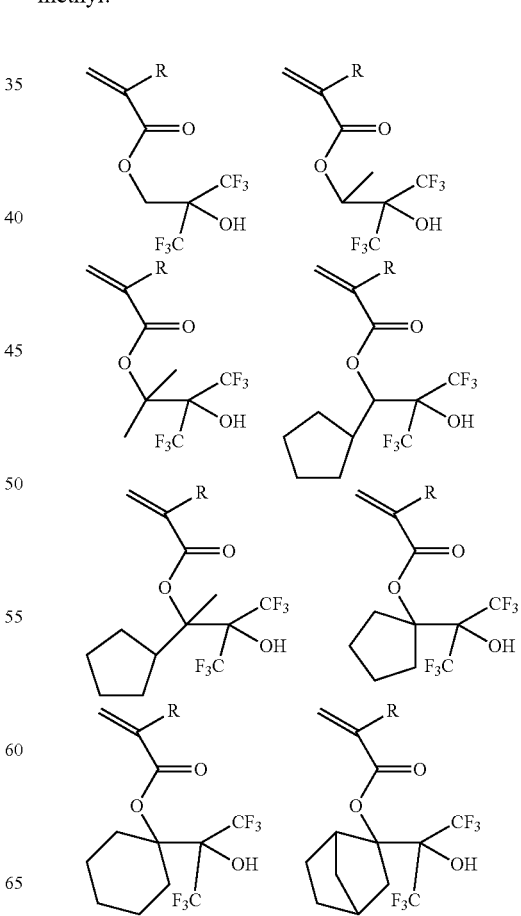

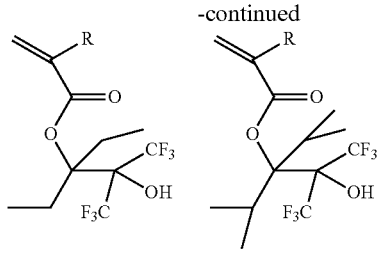
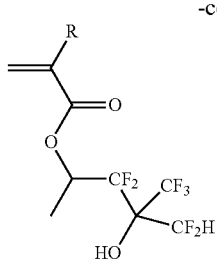
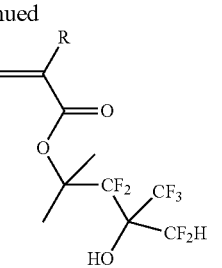
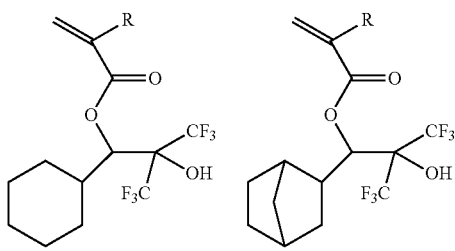
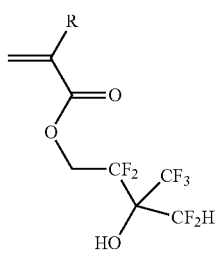
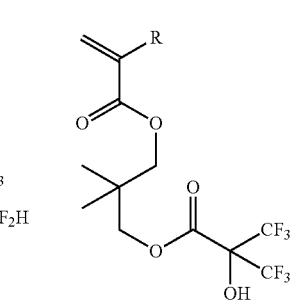
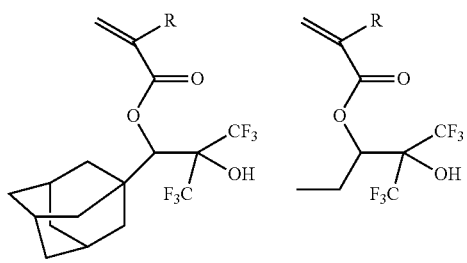
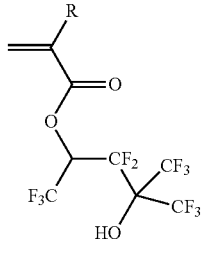
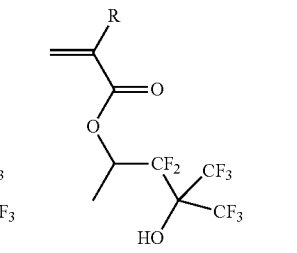
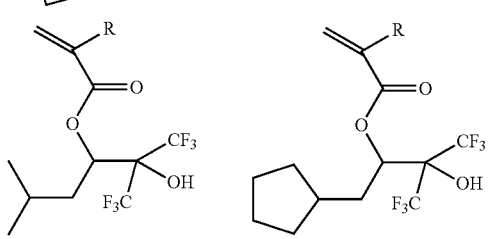
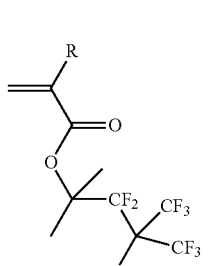
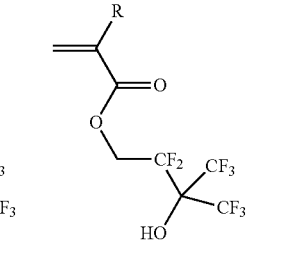
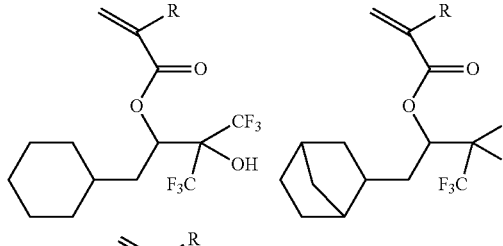
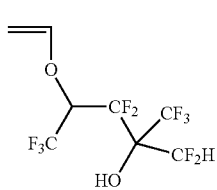
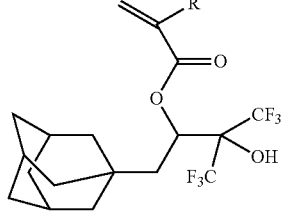
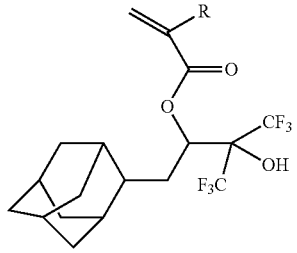
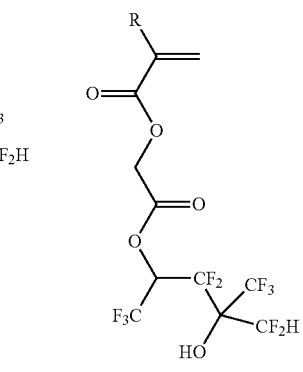

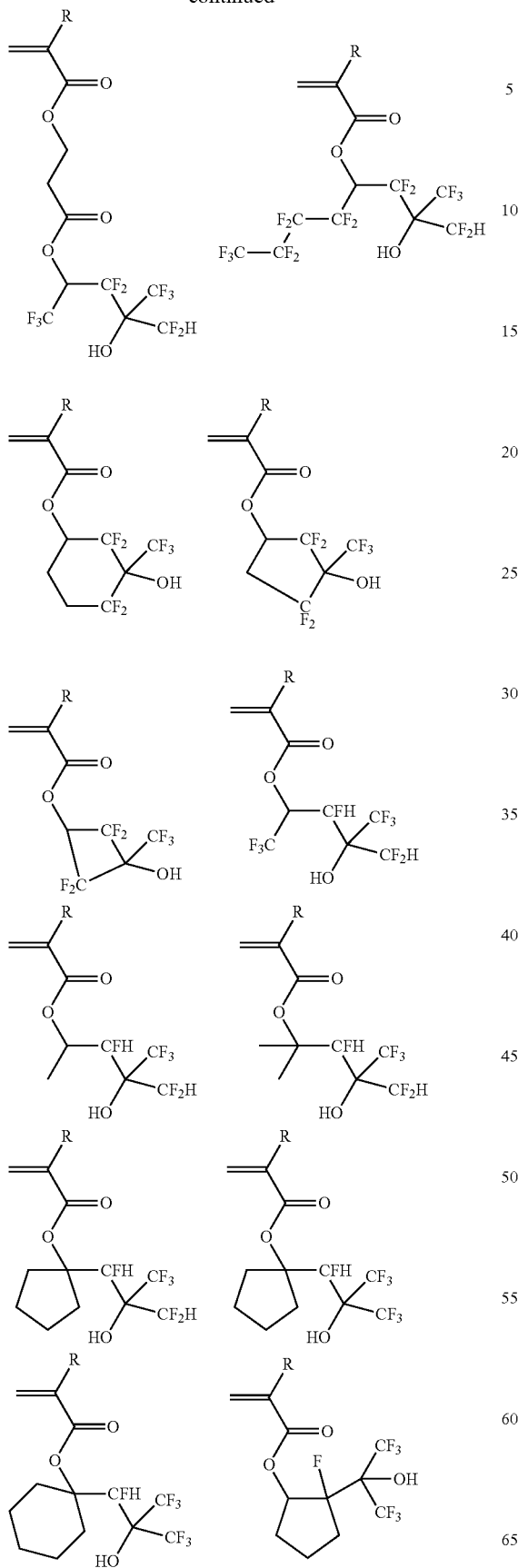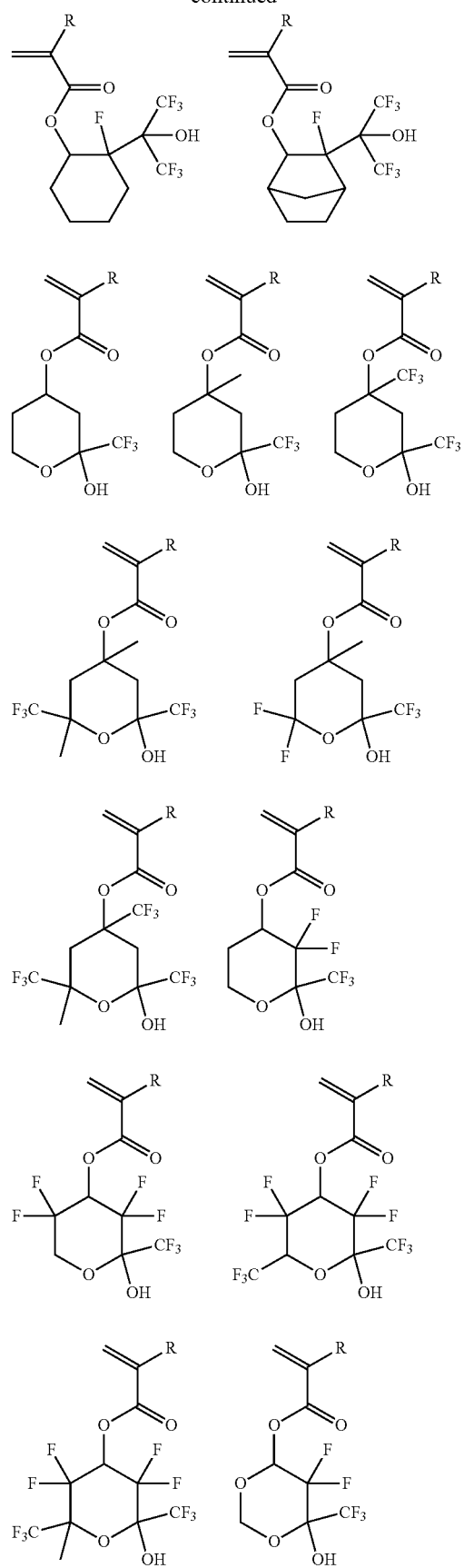

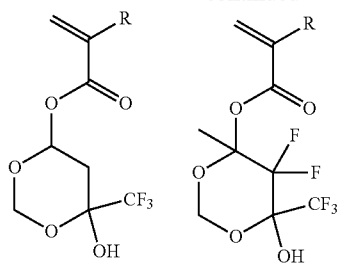
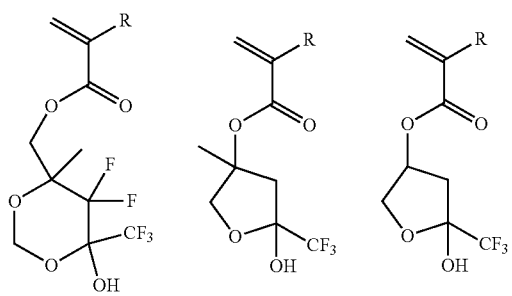
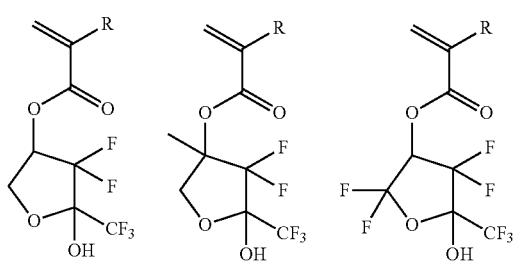
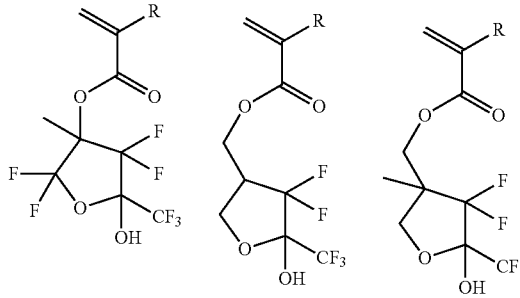
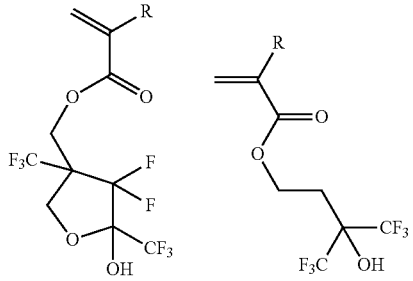
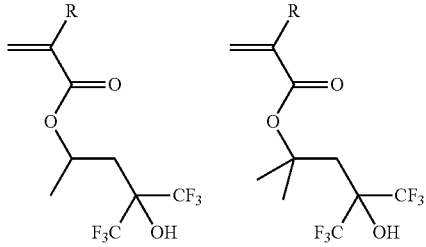
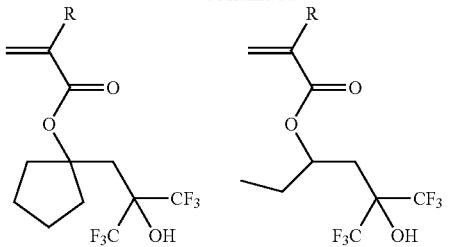
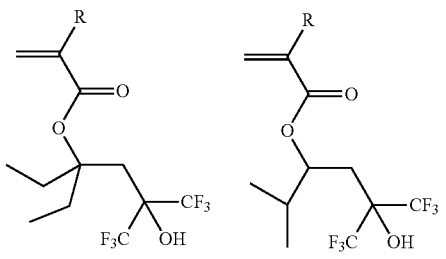
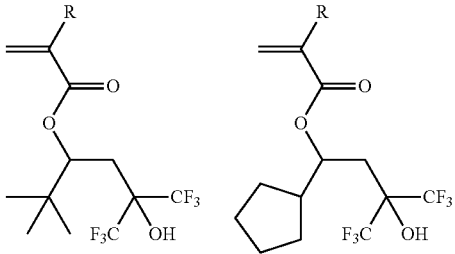
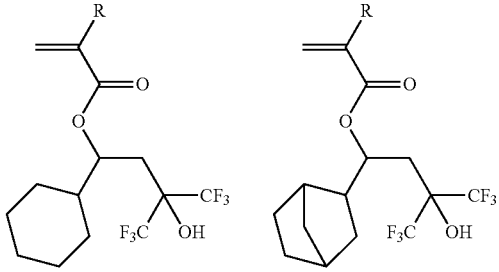
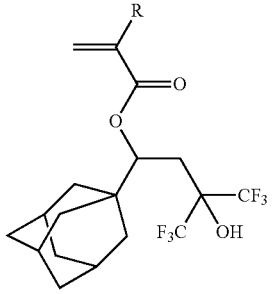
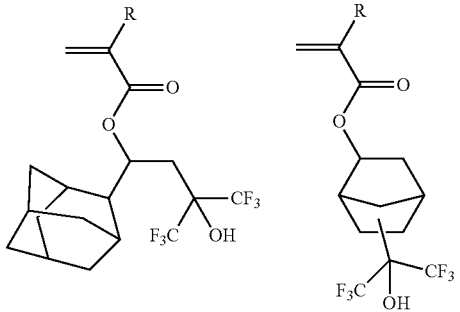

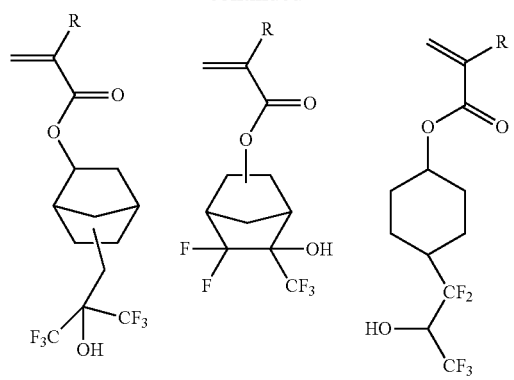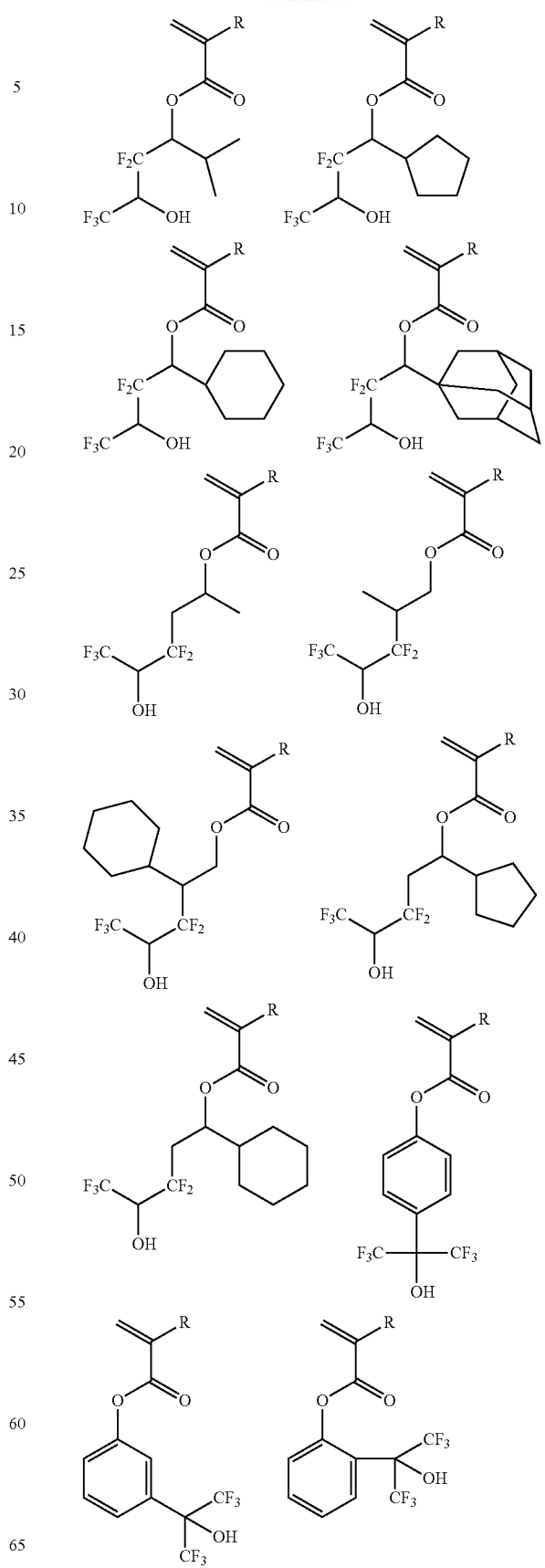

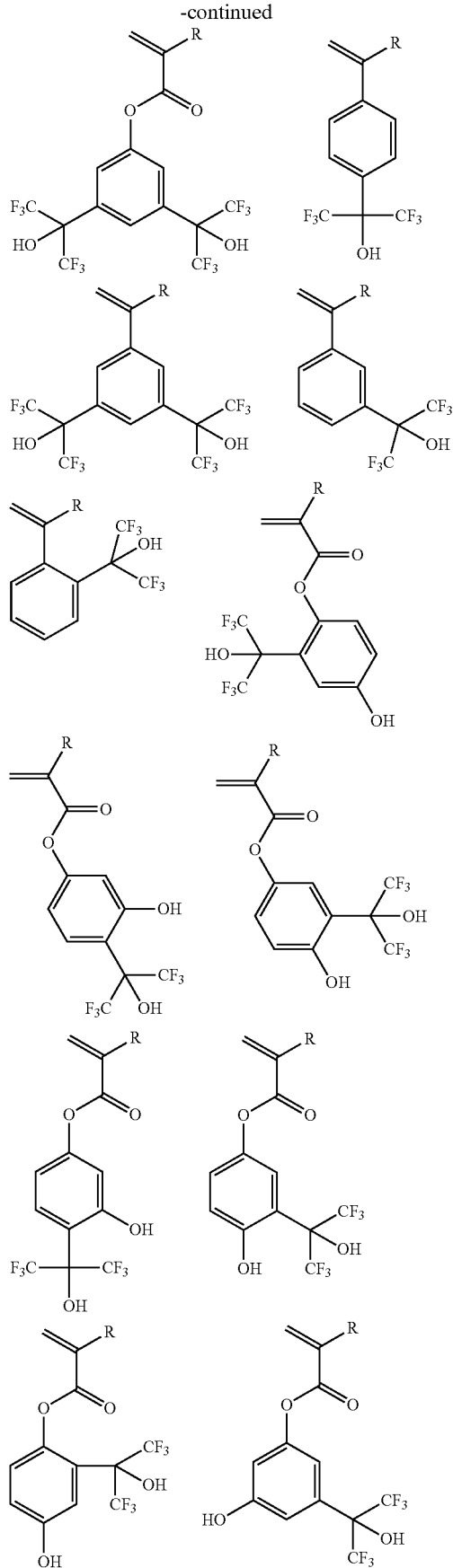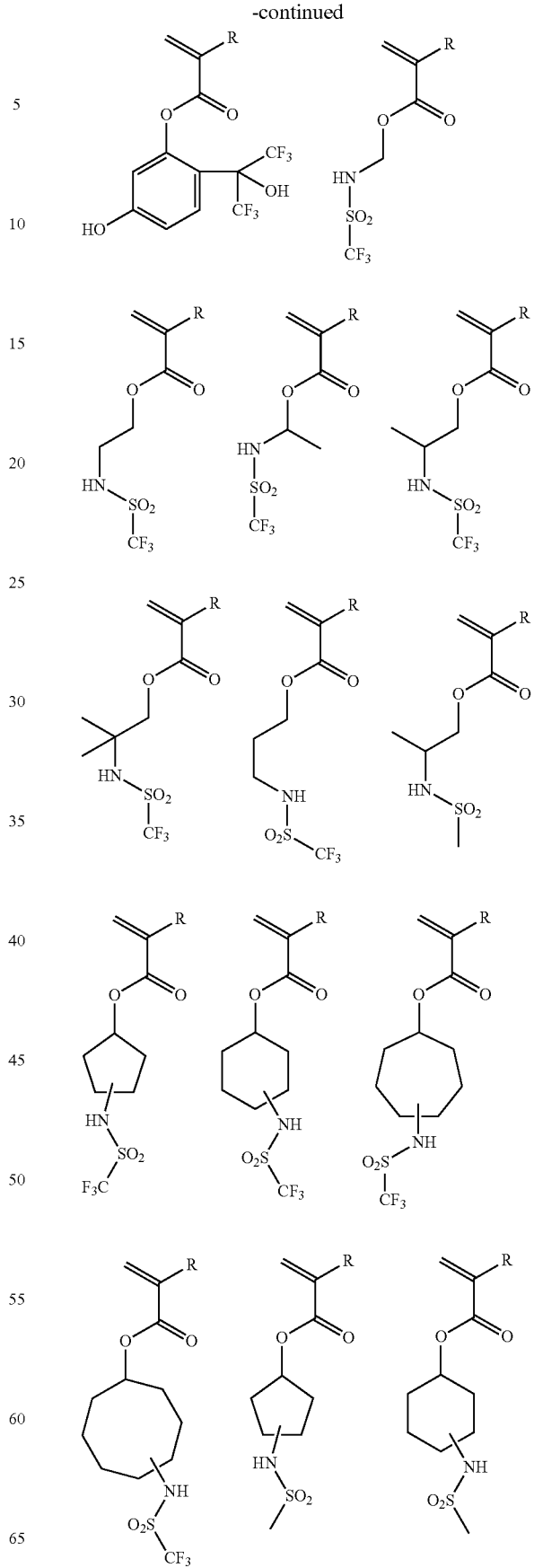

-continued late having an acid labile group $R^{11}$ substituted thereon and recurring units (a2) of hydroxystyrene having an acid labile group $R^{13}$ substituted thereon, as represented by the general formula (3).

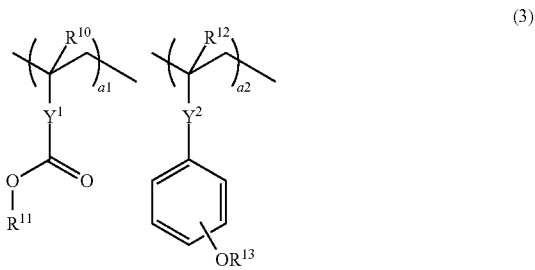

(3)

Herein $R^{10}$ and $R^{12}$ are each independently hydrogen or methyl, $R^{11}$ and $R^{13}$ each are an acid labile group, $Y^1$ is a single bond, a $C_1$-$C_{12}$ linking group having at least one of an ester (—COO—) moiety, lactone ring, phenylene moiety and naphthylene moiety, a phenylene group or a naphthylene group, $Y^2$ is a single bond, ester (—COO—) group or amide (—CONH—) group, subscripts a1 and a2 are numbers in the range: $0 \le a1 \le 0.9$, $0 \le a2 \le 0.9$, and $0 < a1+a2 < 1.0$.

Notably, the recurring units (a1) and (a2) having an acid labile group may also be copolymerized in the additive polymer of formula (1) or (2).

Examples of the monomer from which recurring units (a1) are derived are given below.

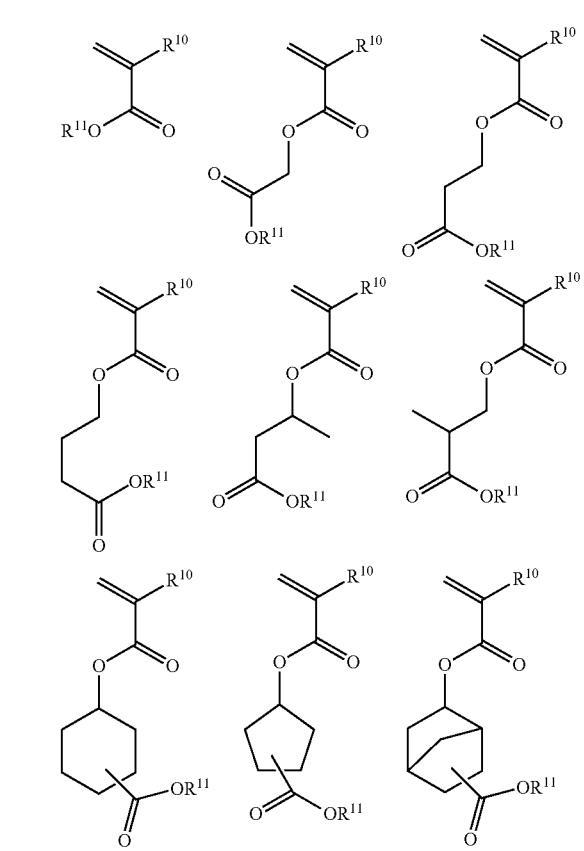

While the additive polymer comprises the recurring units (p) and (q1) to (q4) and optionally, the recurring units (r) and (s), their molar fraction is in the following range: $0 < p < 1.0$, $0 \le q1 < 1.0$, $0 \le q2 < 1.0$, $0 \le q3 < 1.0$, $0 \le q4 < 1.0$, $0 < q1+q2+q3+q4$ (=q)$<1.0$, and $0 < p+q \le 1.0$; preferably $0.1 \le p \le 1.0$, $0 \le q1 \le 0.8$, $0 \le q2 \le 0.8$, $0 \le q3 \le 0.8$, $0 \le q4 \le 0.8$, $0 \le q \le 0.8$, and $0.2 \le p+q \le 1.0$; more preferably $0.2 \le p \le 1.0$, $0 \le q1 \le 0.7$, $0 \le q2 \le 0.7$, $0 \le q3 \le 0.7$, $0 \le q4 \le 0.7$, $0 \le q \le 0.7$, and $0.3 \le p+q \le 1.0$; $0 \le r < 1.0$, preferably $0 \le r \le 0.8$, and more preferably $0 \le r \le 0.7$; $0 \le s < 1.0$, preferably $0 \le s \le 0.8$, and more preferably $0 \le s \le 0.7$, provided that $p+q+r+s=1.0$.

The additive polymer should preferably have a weight average molecular weight (Mw) in the range of 1,000 to 500,000, and more preferably 2,000 to 30,000, as measured by GPC versus polystyrene standards. With too low a Mw, the resist composition may become less heat resistant. A polymer with too high a Mw may lose alkaline solubility and give rise to a footing phenomenon after pattern formation.

Base Resin

The polymer serving as base resin in the resist composition of the invention essentially comprises recurring units having an acid labile group. Preferably, the recurring units having an acid labile group include recurring units (a1) of (meth)acry-

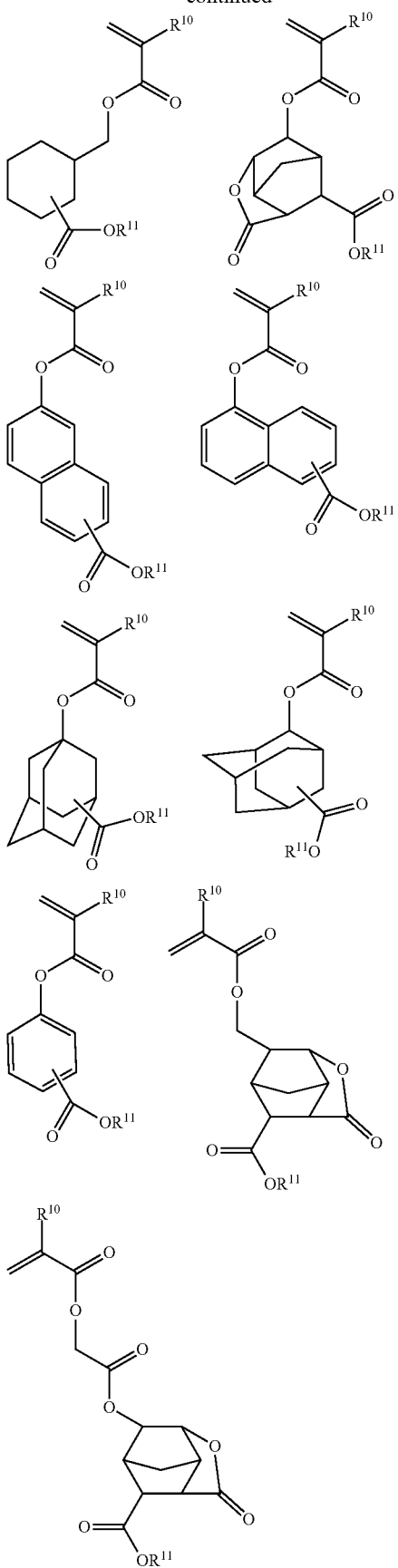
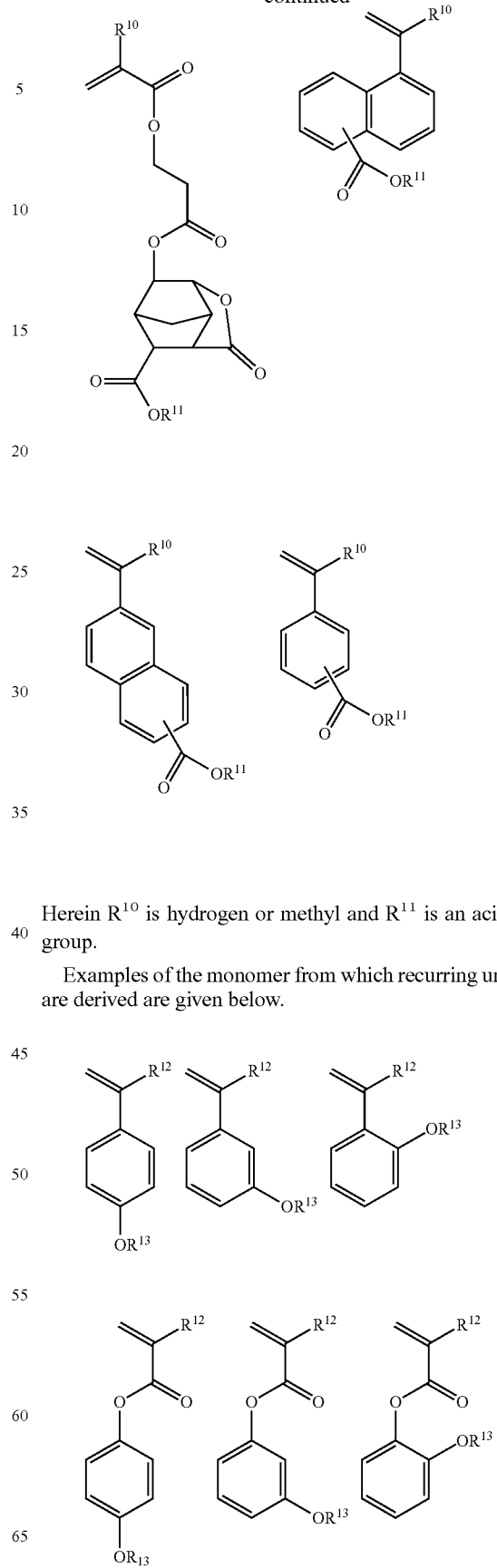
Herein $R^{10}$ is hydrogen or methyl and $R^{11}$ is an acid labile group.
Examples of the monomer from which recurring units (a2) are derived are given below.
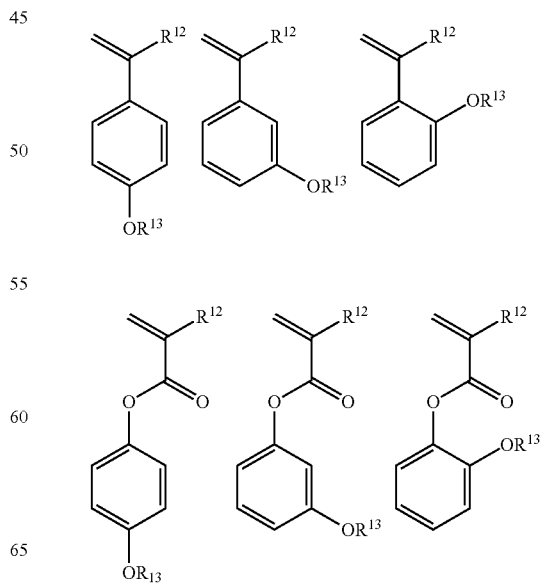

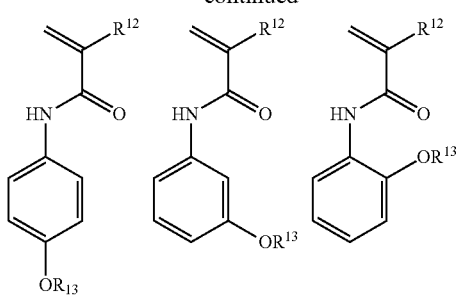

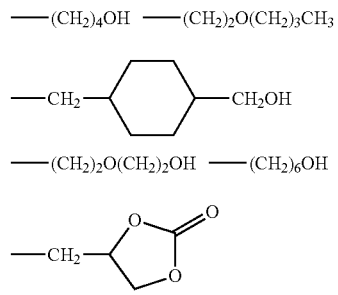

Herein $R^{12}$ is hydrogen or methyl and $R^{13}$ is an acid labile group.

The acid labile groups represented by $R^2$ in formula (1) or (2), $R^{11}$ and $R^{13}$ in formula (3) may be selected from a variety of such groups. The acid labile groups may be the same or different and preferably include groups of the following formulae (A-1) to (A-3).

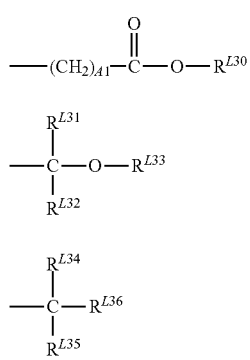

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter A1 is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

A pair of $R^{L31}$ and $R^{L32}$, $R^{L31}$ and $R^{L33}$, or $R^{L32}$ and $R^{L33}$ may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl groups.

Also included are substituent groups having the formulae (A-1)-1 to (A-1)-10.

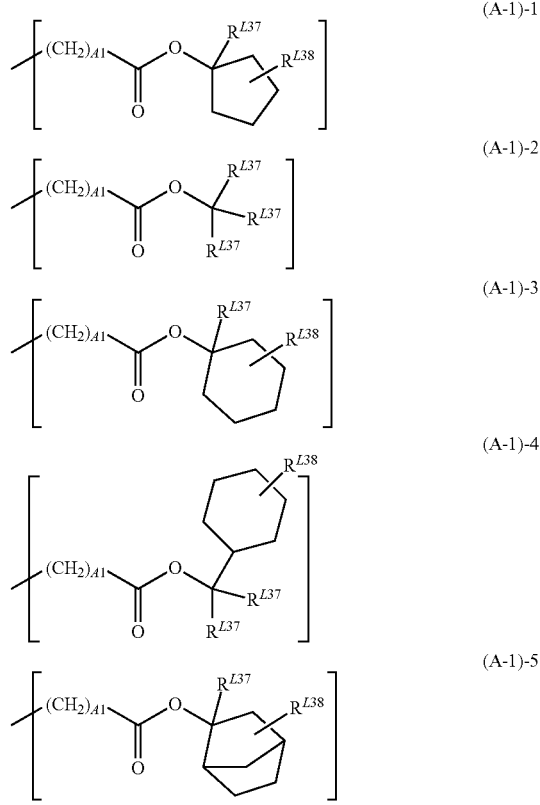

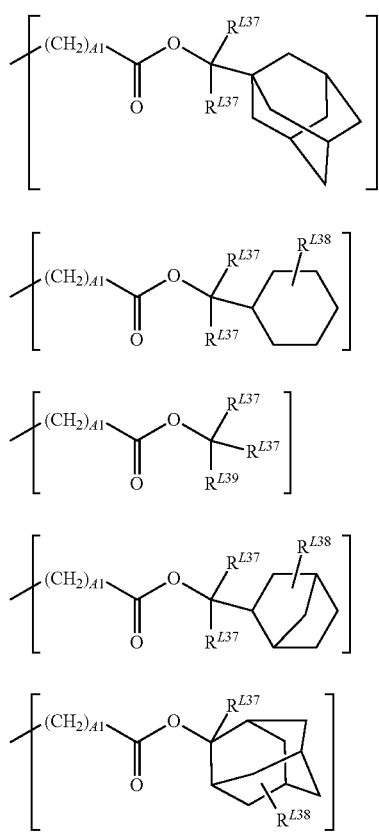

(A-1)-6

(A-1)-7

(A-1)-8

(A-1)-9

(A-1)-10

Herein $R^{L37}$ is each independently a straight, branched or cyclic $C_1$-$C_{10}$ alkyl group or $C_6$-$C_{20}$ aryl group. $R^{L38}$ is hydrogen or a straight, branched or cyclic $C_1$-$C_{10}$ alkyl group. $R^{L39}$ is each independently a straight, branched or cyclic $C_2$-$C_{10}$ alkyl group or $C_6$-$C_{20}$ aryl group. A1 is an integer of 0 to 6.

Of the acid labile groups of formula (A-2), the straight and branched ones are exemplified by the following groups having formulae (A-2)-1 to (A-2)-35.

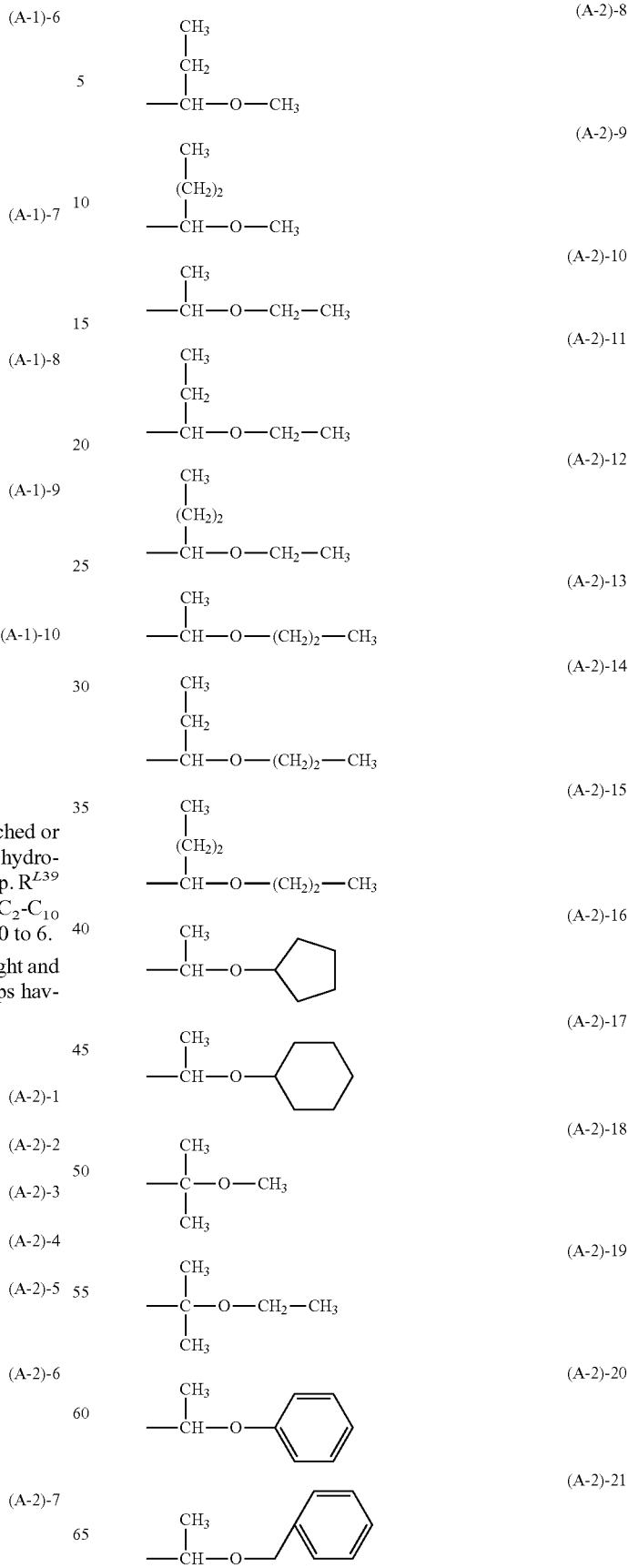

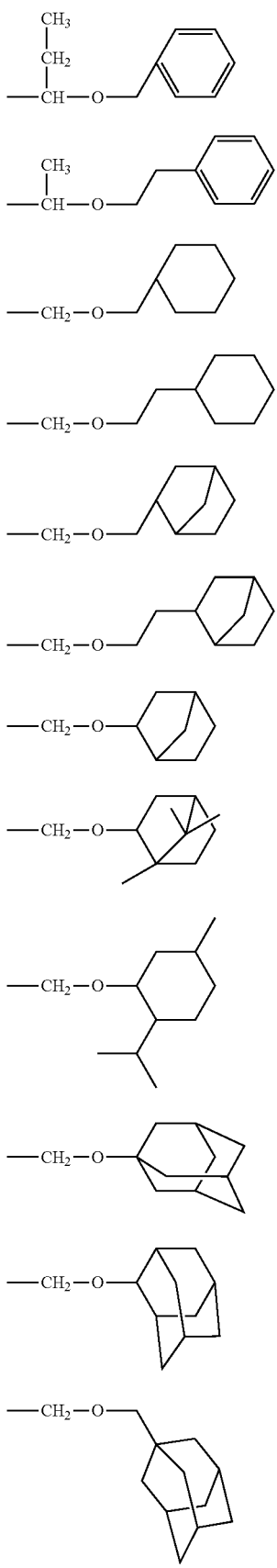

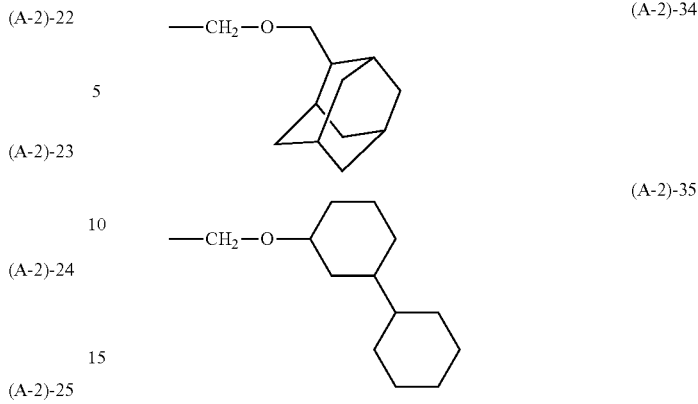

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the following formula (A-2a) or (A-2b) while the polymer may be crosslinked within the molecule or between molecules with these acid labile groups.

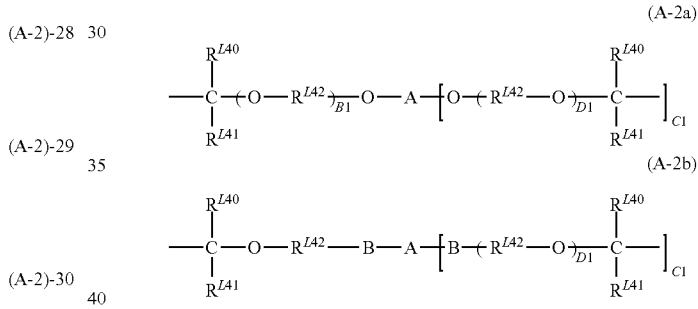

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of B1 and D1 is 0 or an integer of 1 to 10, preferably 0 or an integer of 1 to 5, and C1 is an integer of 1 to 7. "A" is a (C1+1)-valent aliphatic or alicyclic saturated hydrocarbon group, aromatic hydrocarbon group or heterocyclic group having 1 to 50 carbon atoms, which may be separated by a heteroatom or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may be separated by a heteroatom or in which some hydrogen atoms attached to carbon atoms may be substituted by hydroxyl, carboxyl, acyl groups or halogen atoms. The subscript C1 is preferably an integer of 1 to 3.

The crosslinking acetal groups of formulae (A-2a) and (A-2b) are exemplified by the following formulae (A-2)-36 through (A-2)-43.

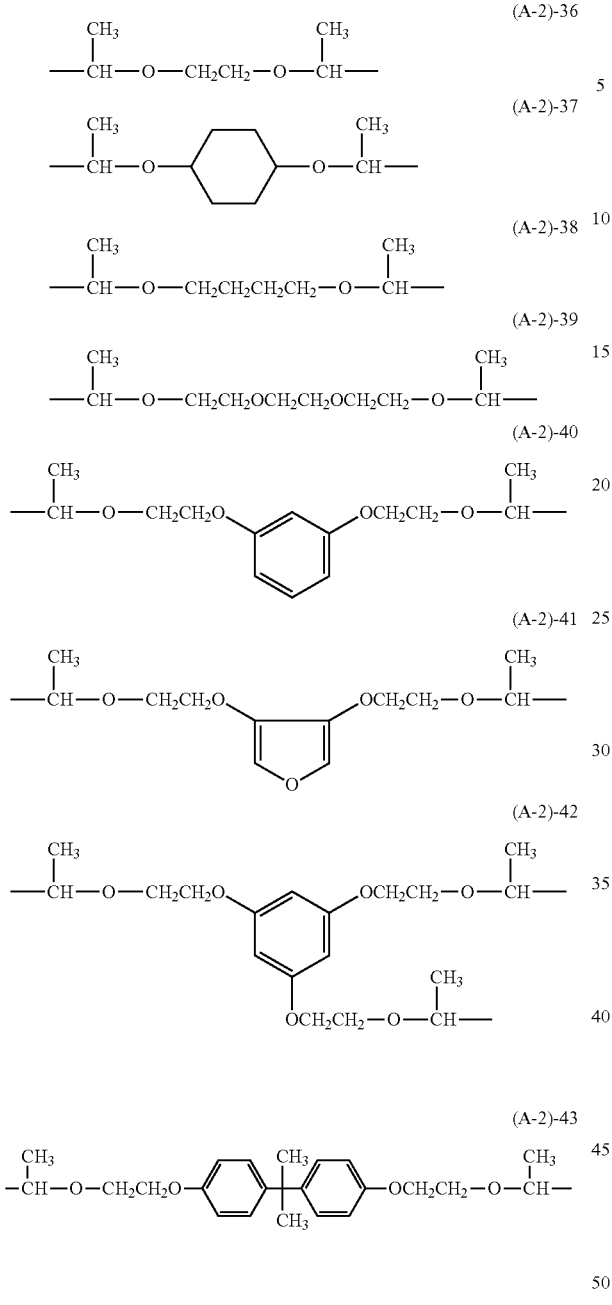

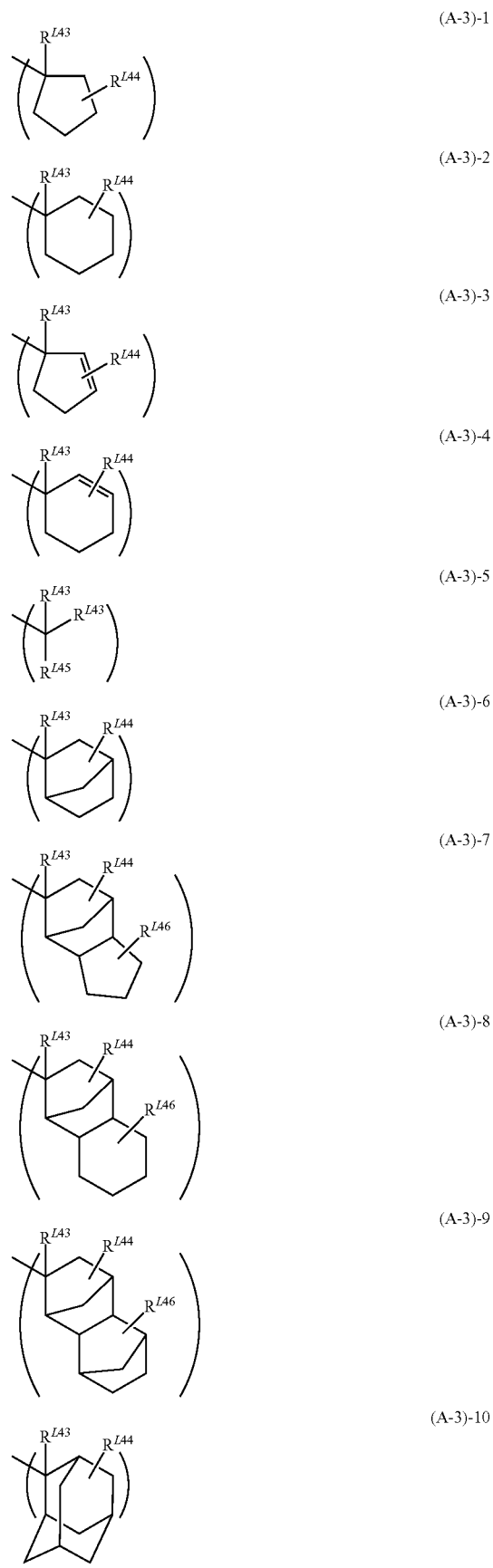

In formula (A-3), $R^{L34}$, $R^{L35}$ and $R^{L36}$ each are a monovalent hydrocarbon group, typically a straight, branched or cyclic $C_1$-$C_{20}$ alkyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

(A-3)-11

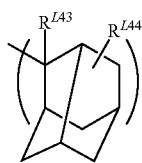

(A-3)-12

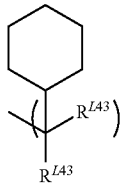

(A-3)-13

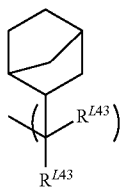

(A-3)-14

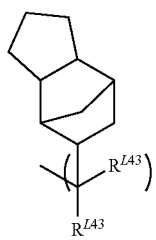

(A-3)-15

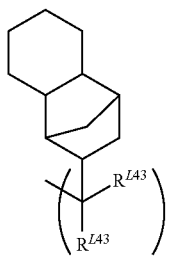

(A-3)-16

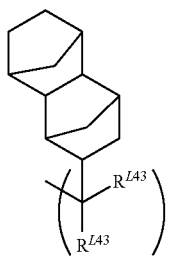

(A-3)-17

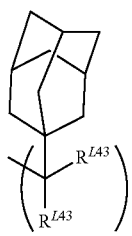

(A-3)-18

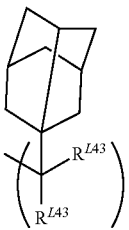

Herein $R^{L43}$ is each independently a straight, branched or cyclic $C_1$-$C_8$ alkyl group or $C_6$-$C_{20}$ aryl group, typically phenyl or naphthyl, $R^{L44}$ and $R^{L46}$ each are hydrogen or a straight, branched or cyclic $C_1$-$C_{20}$ alkyl group. $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

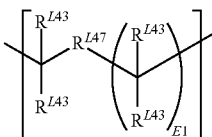
(A-3)-19

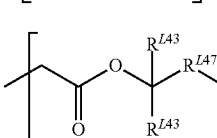
(A-3)-20

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and E1 is an integer of 1 to 3.

Of recurring units having acid labile groups of formula (A-3), recurring units of (meth)acrylate having an exo-form structure represented by the formula (A-3)-21 are preferred.

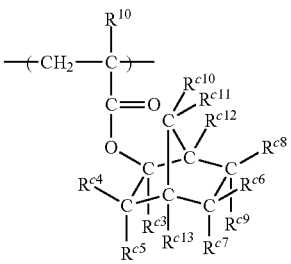
(A-3)-21

Herein, $R^{10}$ is as defined above. $R^{c3}$ is a straight, branched or cyclic $C_1$-$C_8$ alkyl group or an optionally substituted $C_6$-$C_{20}$ aryl group. $R^{c4}$ to $R^{c9}$, $R^{c12}$ and $R^{c13}$ are each independently hydrogen or a monovalent $C_1$-$C_{15}$ hydrocarbon group which may contain a heteroatom. $R^{c10}$ and $R^{c11}$ each are hydrogen or a monovalent $C_1$-$C_{15}$ hydrocarbon group which may contain a heteroatom. Alternatively, a pair of $R^{c4}$ and $R^{c5}$, $R^{c6}$ and $R^{c8}$, $R^{c6}$ and $R^{c9}$, $R^{c7}$ and $R^{c9}$, $R^{c7}$ and $R^{c13}$, $R^{c8}$ and $R^{c12}$, $R^{c10}$ and $R^{c11}$, or $R^{c11}$ and $R^{c12}$, taken together, may form a ring, and in that event, each ring-forming R is a divalent $C_1$-$C_{15}$ hydrocarbon group which may contain a heteroatom. Also, a pair of $R^{c4}$ and $R^{c13}$, $R^{c10}$ and $R^{c13}$, or $R^{c6}$ and $R^{c8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

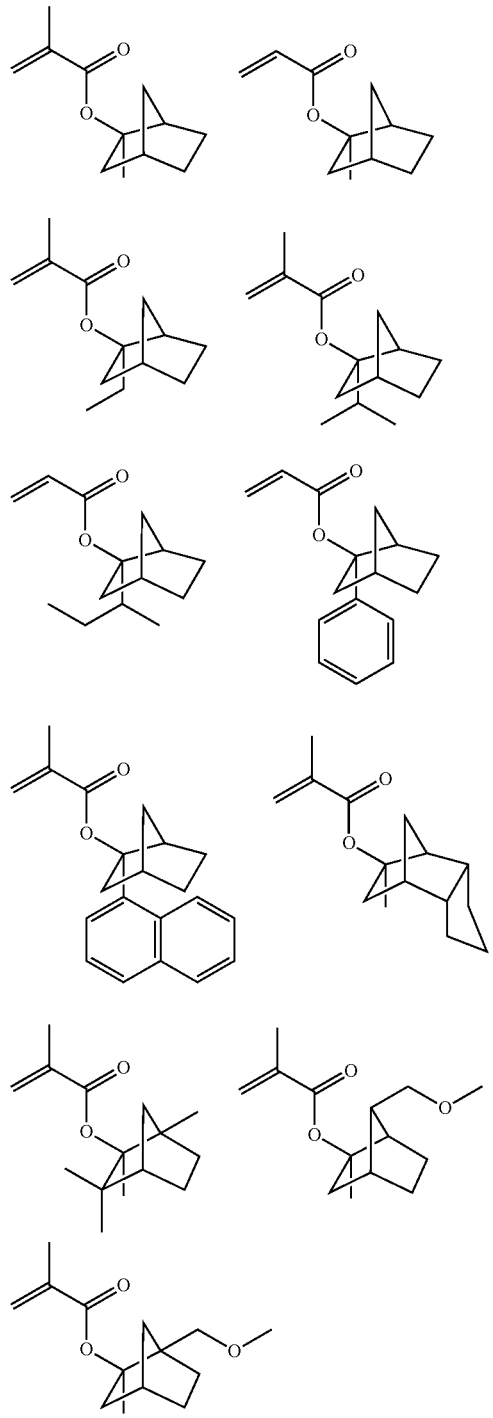

-continued

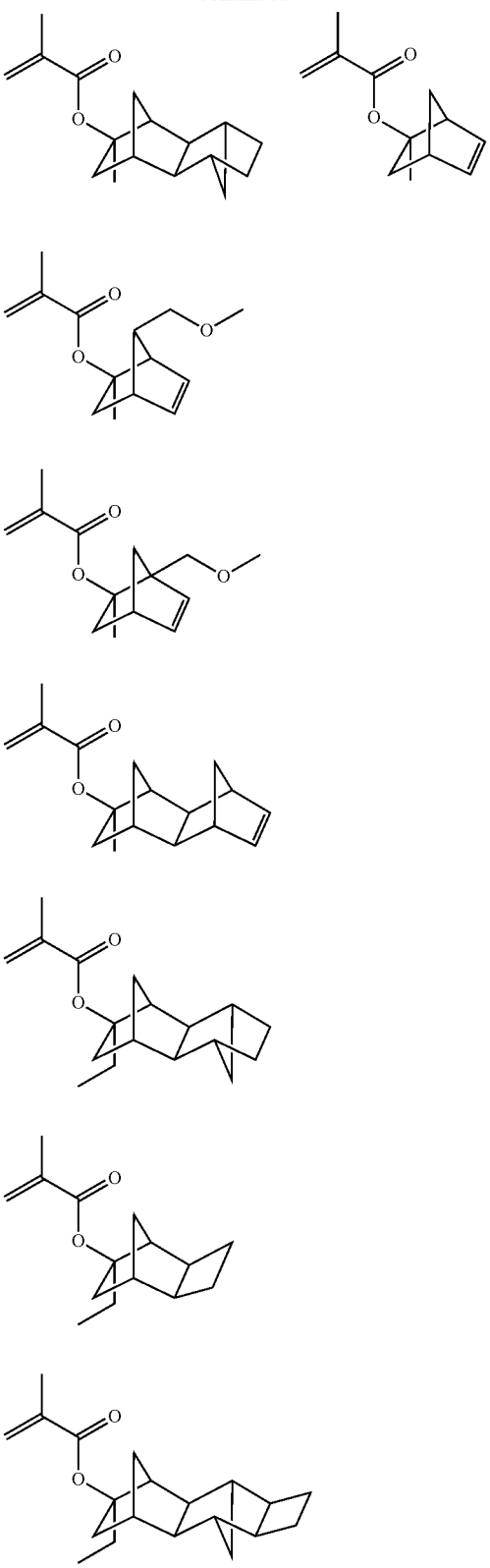

Also included in the recurring units having acid labile groups of formula (A-3) are recurring units of (meth)acrylate having furandiyl, tetrahydrofurandiyl or oxanorbornanediyl as represented by the following formula (A-3)-22.

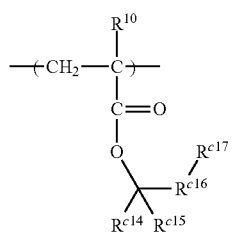

(A-3)-22

Herein, $R^{10}$ is as defined above. $R^{c14}$ and $R^{c15}$ are each independently a monovalent, straight, branched or cyclic $C_1$-$C_{10}$ hydrocarbon group, or $R^{c14}$ and $R^{c15}$, taken together, may form an aliphatic hydrocarbon ring with the carbon atom to which they are attached. $R^{c16}$ is a divalent group selected from furandiyl, tetrahydrofurandiyl and oxanorbornanediyl. $R^{c17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

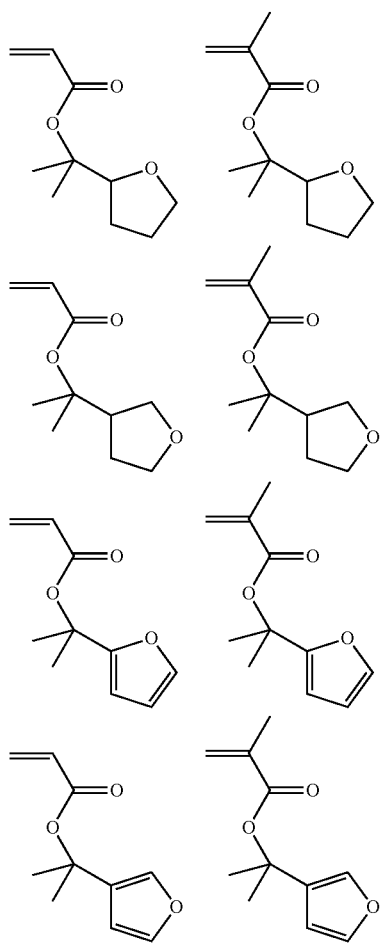

-continued

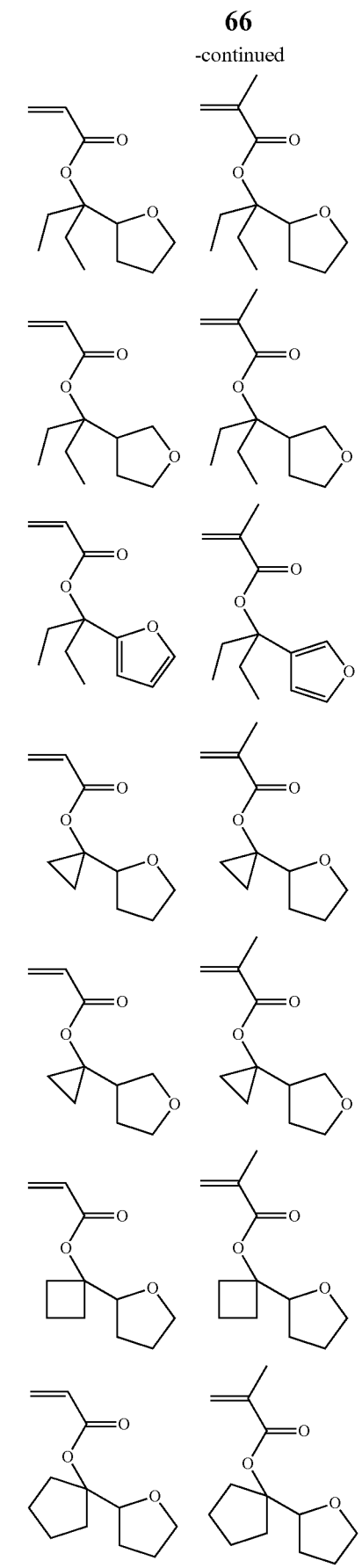

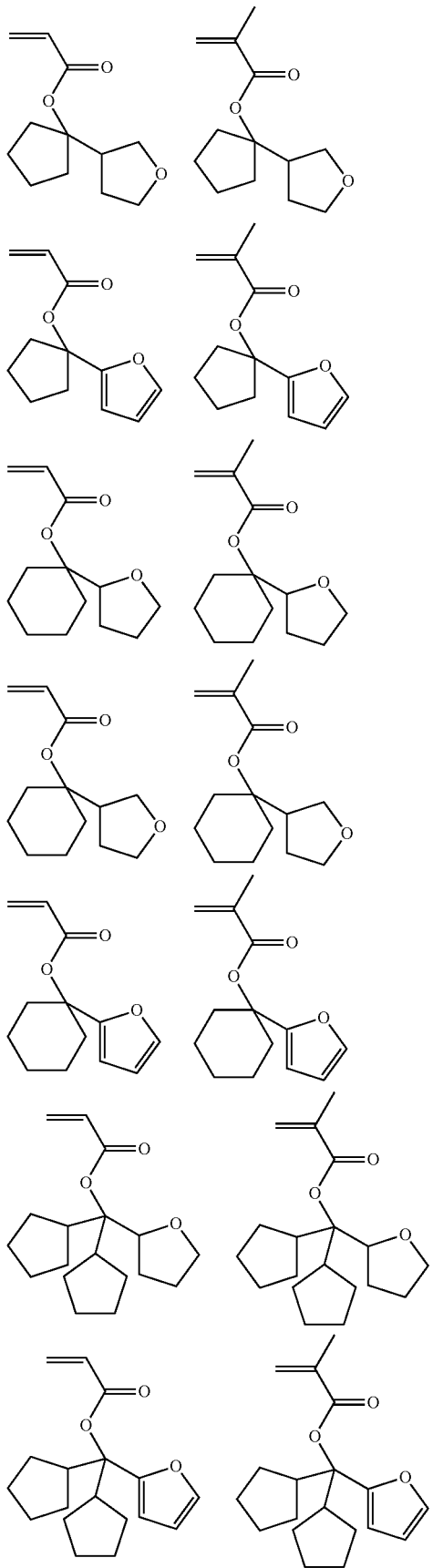
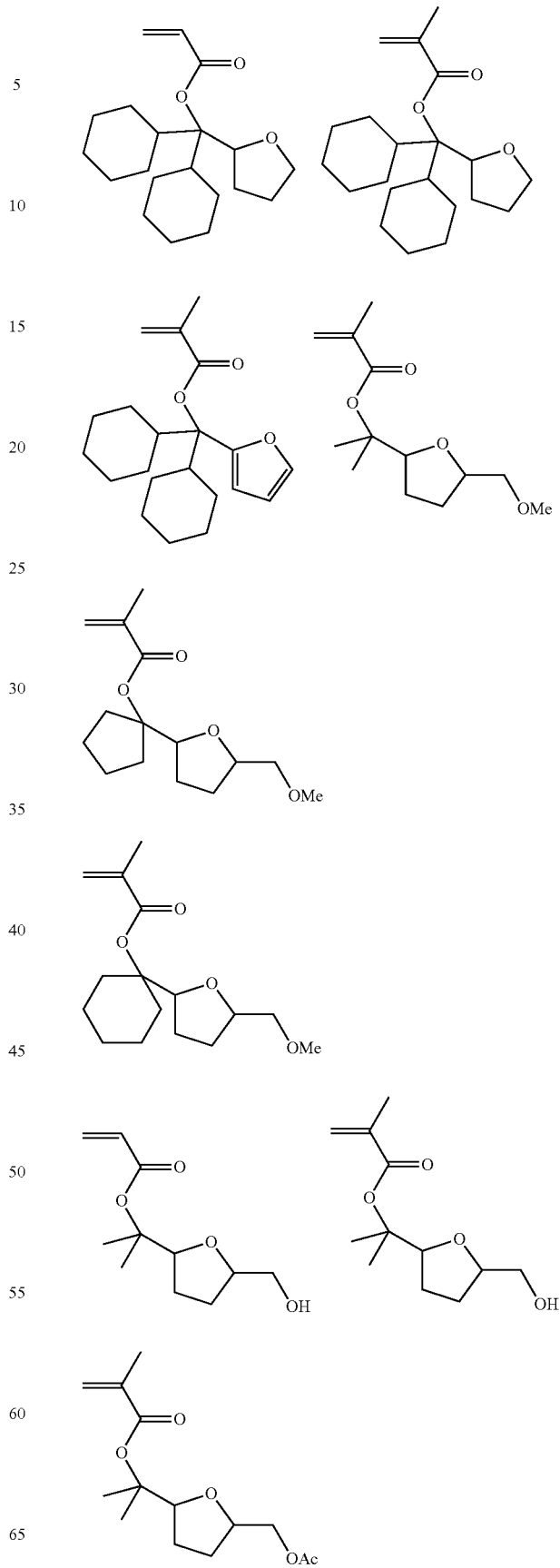

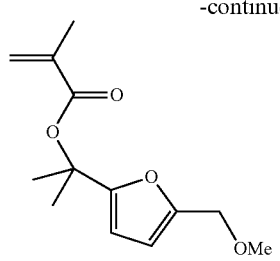
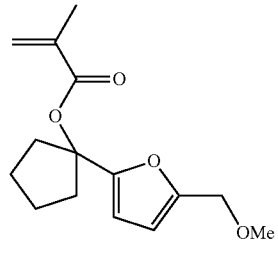
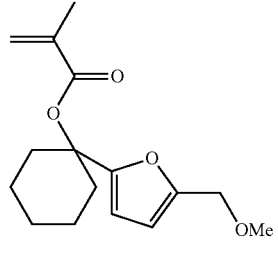
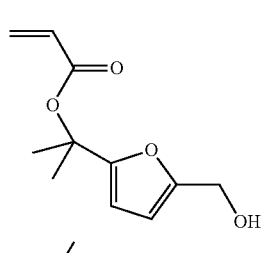
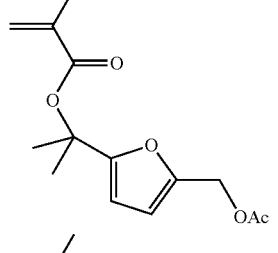
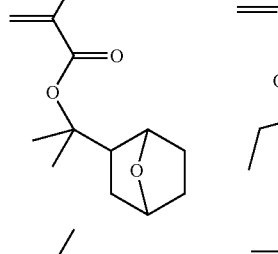
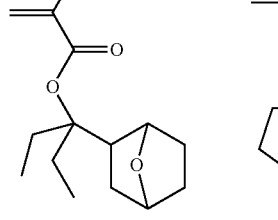
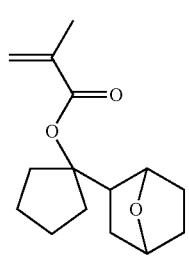
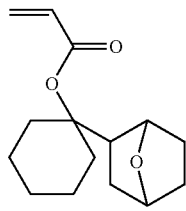
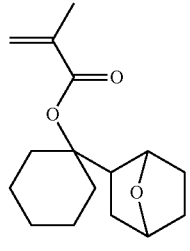
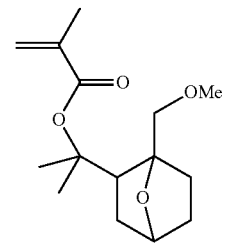
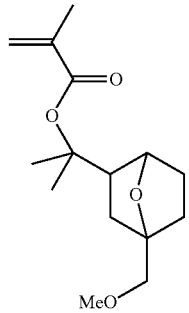
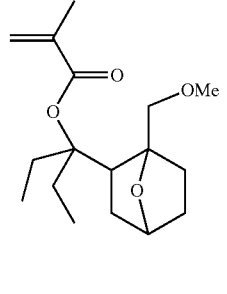
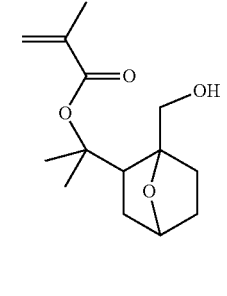
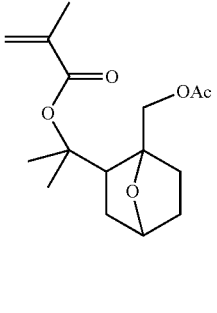

-continued

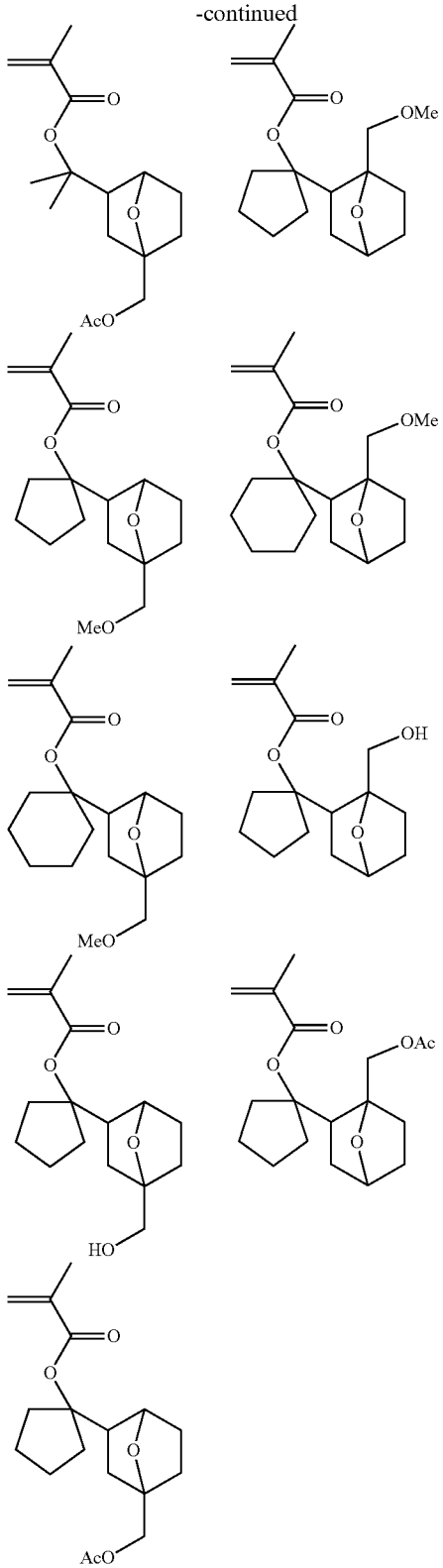

In the recurring unit (a1), the hydrogen atom of the carboxyl group may be substituted by an acid labile group having the general formula (A-3)-23.

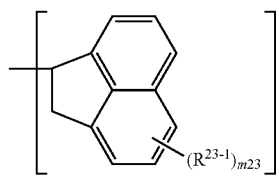

Herein $R^{23-1}$ is hydrogen, $C_1$-$C_4$ alkyl, alkoxy, alkanoyl, alkoxycarbonyl, $C_6$-$C_{10}$ aryl, halogen, or cyano group, and m23 is an integer of 1 to 4.

Examples of the monomer having a carboxyl group substituted with an acid labile group of formula (A-3)-23 are given below.

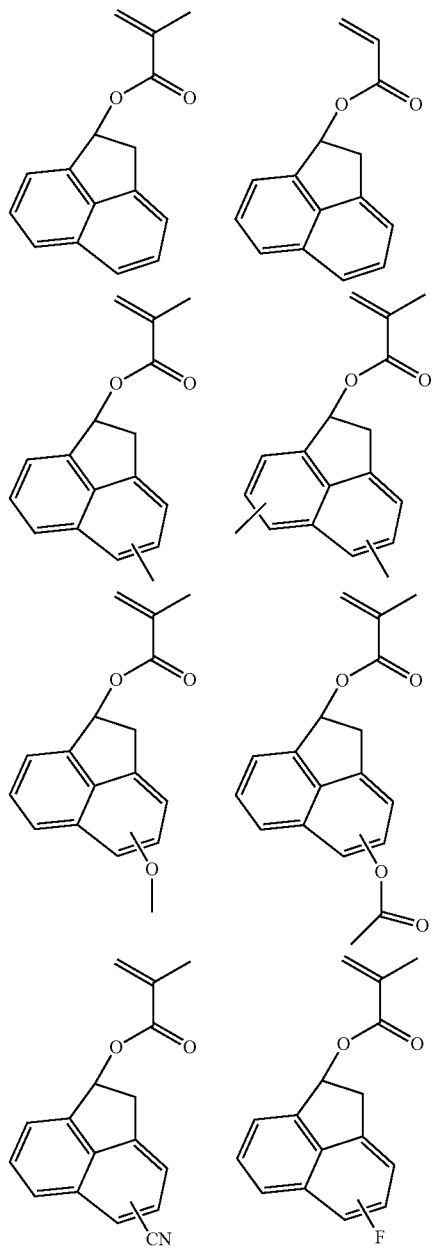

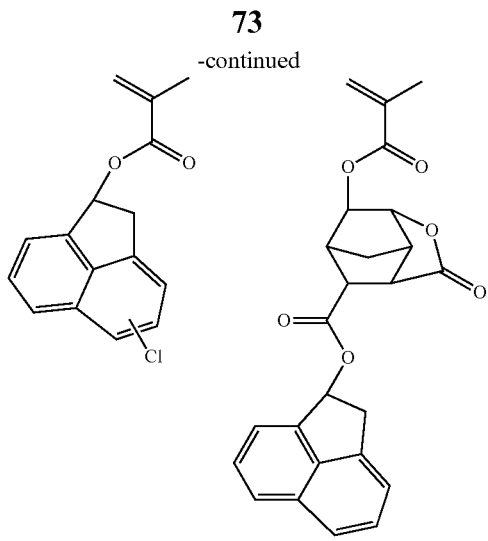
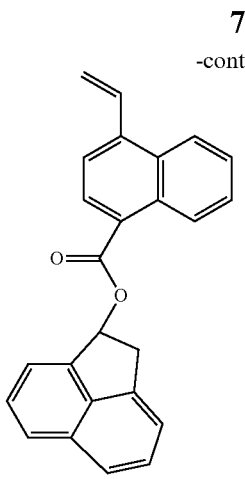
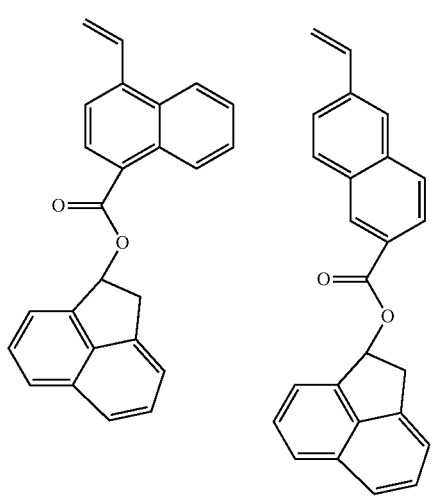

In the recurring unit (a1), the hydrogen atom of the carboxyl group may be substituted by an acid labile group having the general formula (A-3)-24.

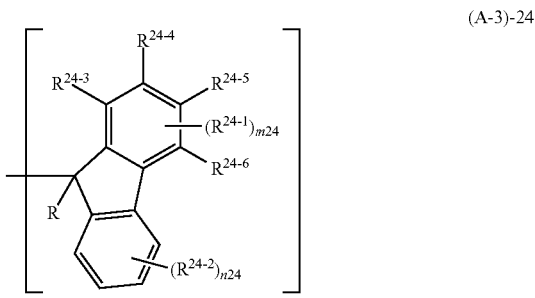

Herein $R^{24-1}$ and $R^{24-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is hydrogen, a straight, branched or cyclic $C_1$-$C_{12}$ alkyl, $C_2$-$C_{12}$ alkenyl, $C_2$-$C_{12}$ alkynyl, or $C_6$-$C_{10}$ aryl group, which may contain an oxygen or sulfur atom; $R^{24-3}$, $R^{24-4}$, $R^{24-5}$, and $R^{24-6}$ each are hydrogen, or a pair of $R^{24-3}$ and $R^{24-4}$, $R^{24-4}$ and $R^{24-5}$, or $R^{24-5}$ and $R^{24-6}$ may bond together to form a benzene ring; m24 and n24 each are an integer of 1 to 4.

Examples of the monomer having a carboxyl group substituted with an acid labile group of formula (A-3)-24 are given below.

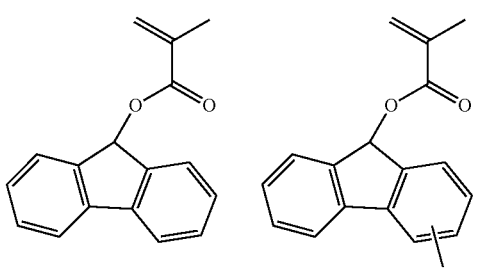

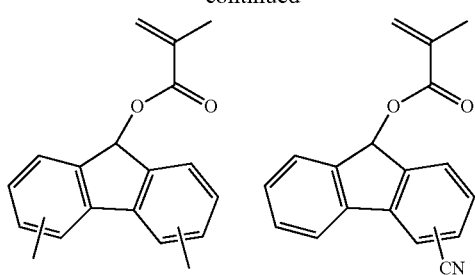
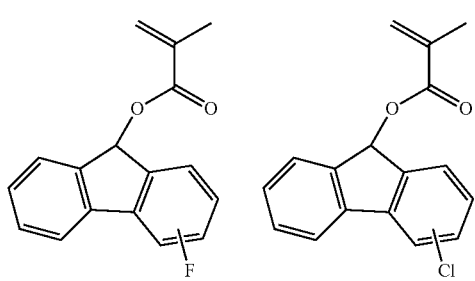
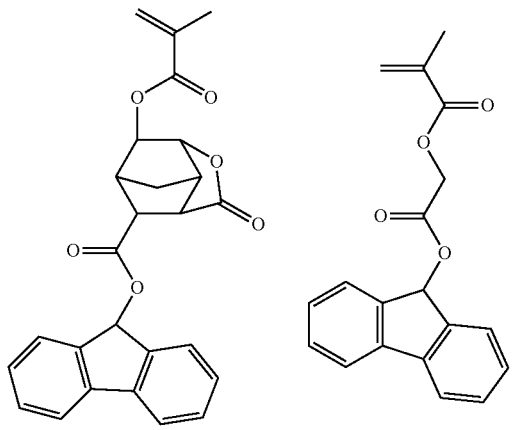
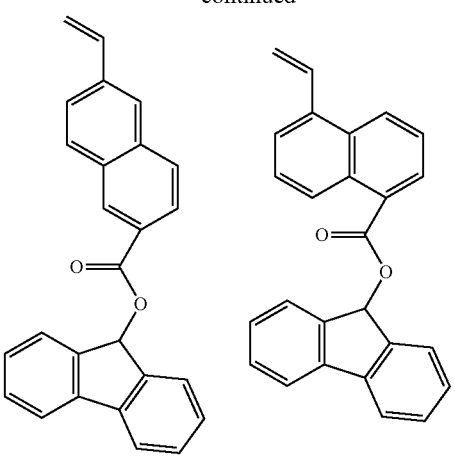
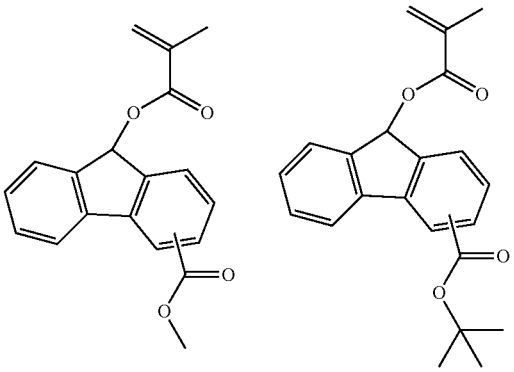
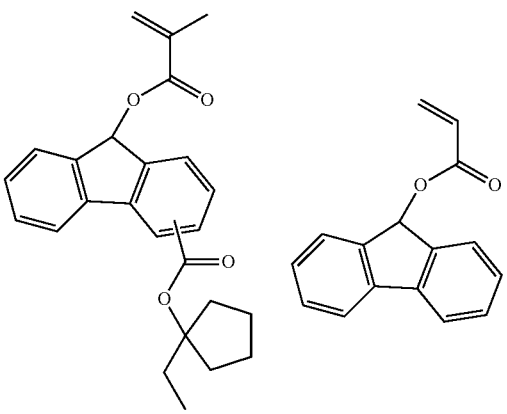
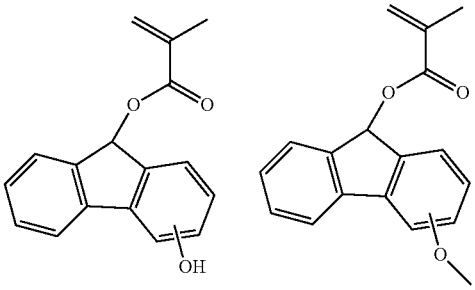

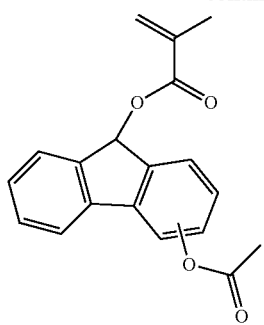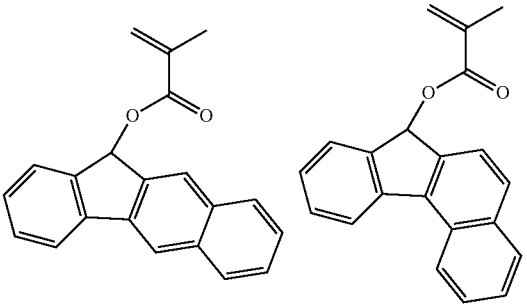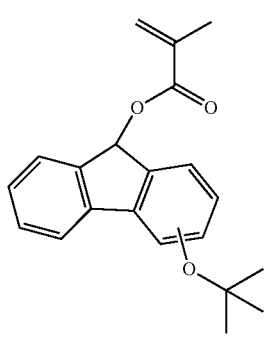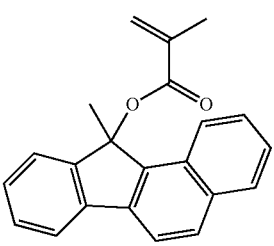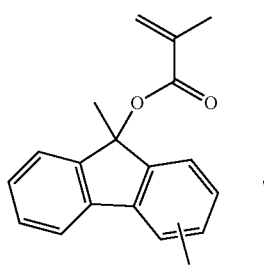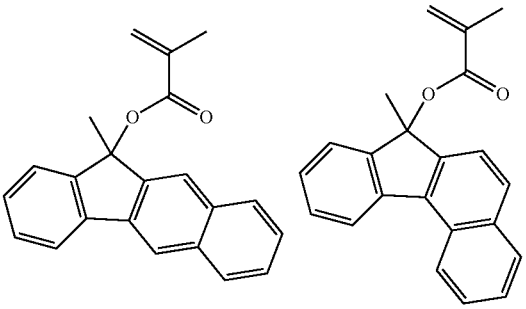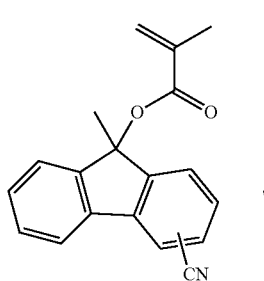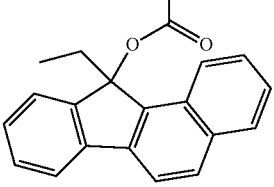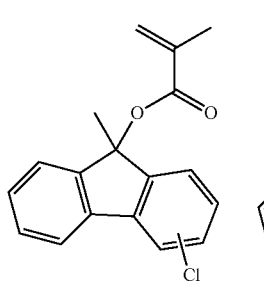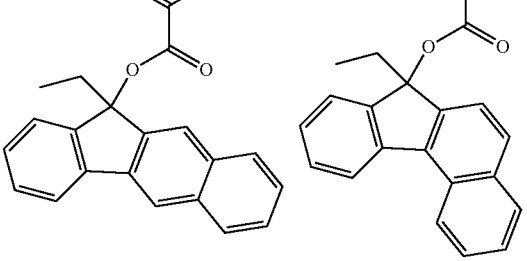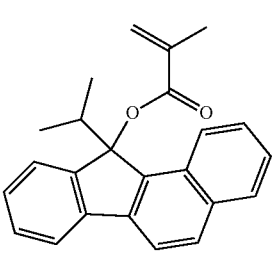

-continued
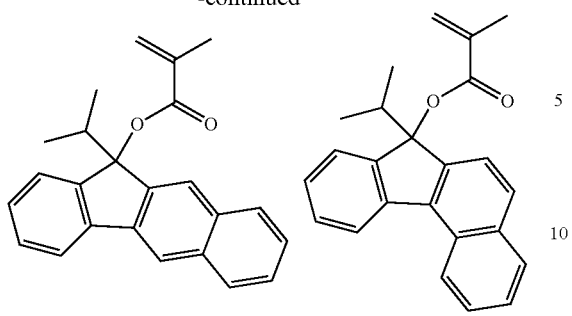
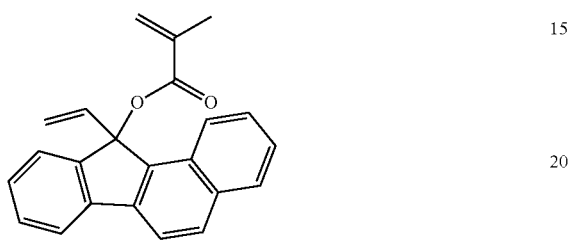
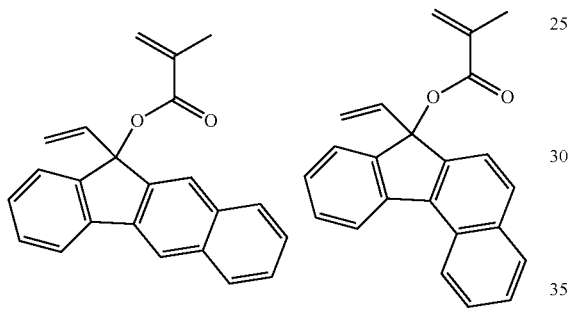
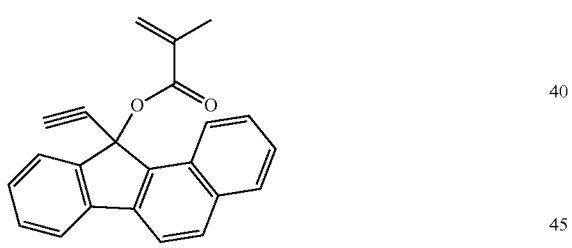
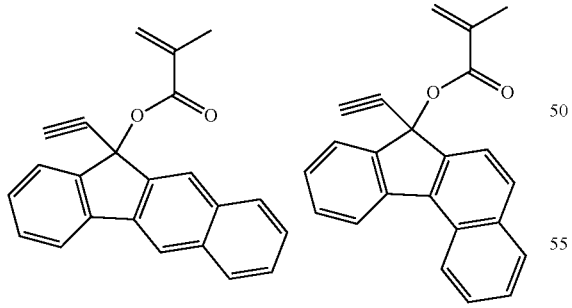
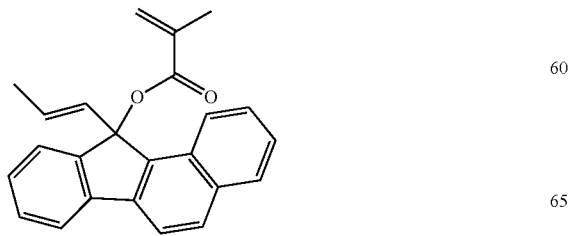
-continued
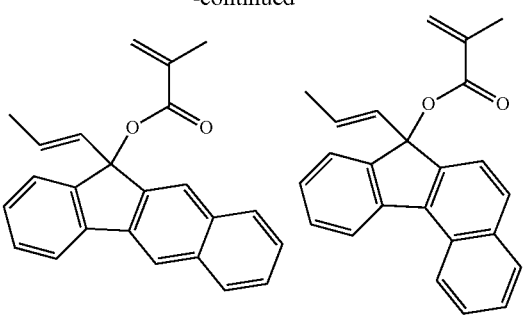
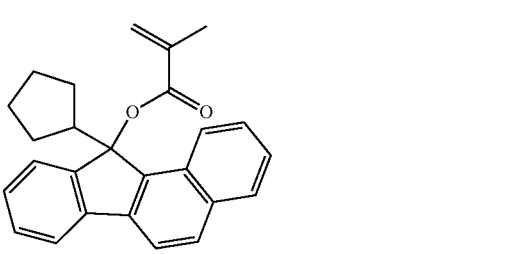
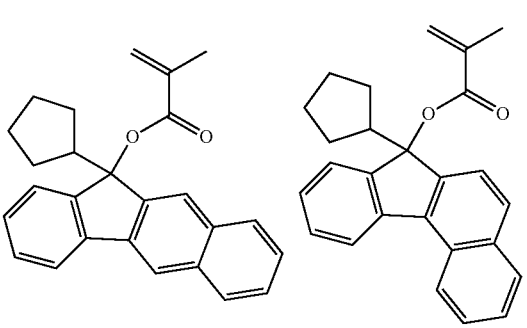
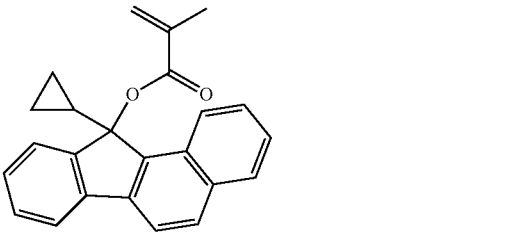
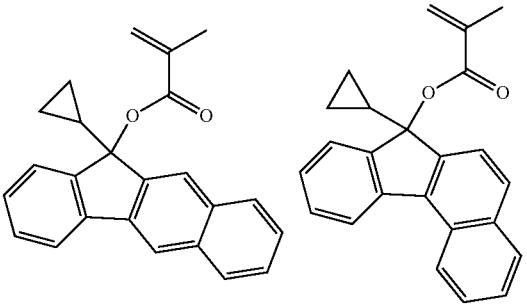
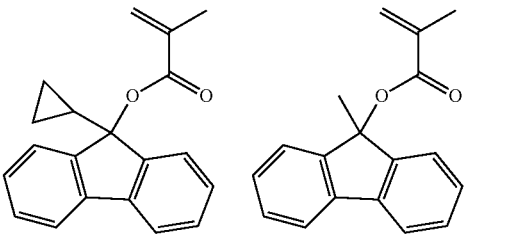

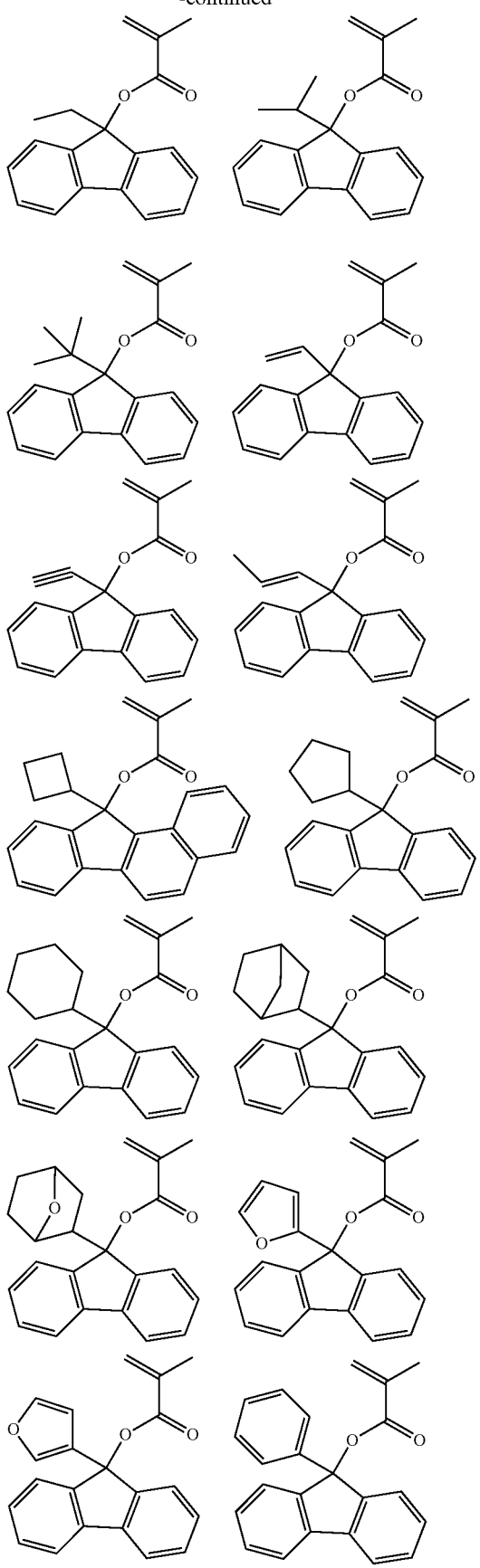
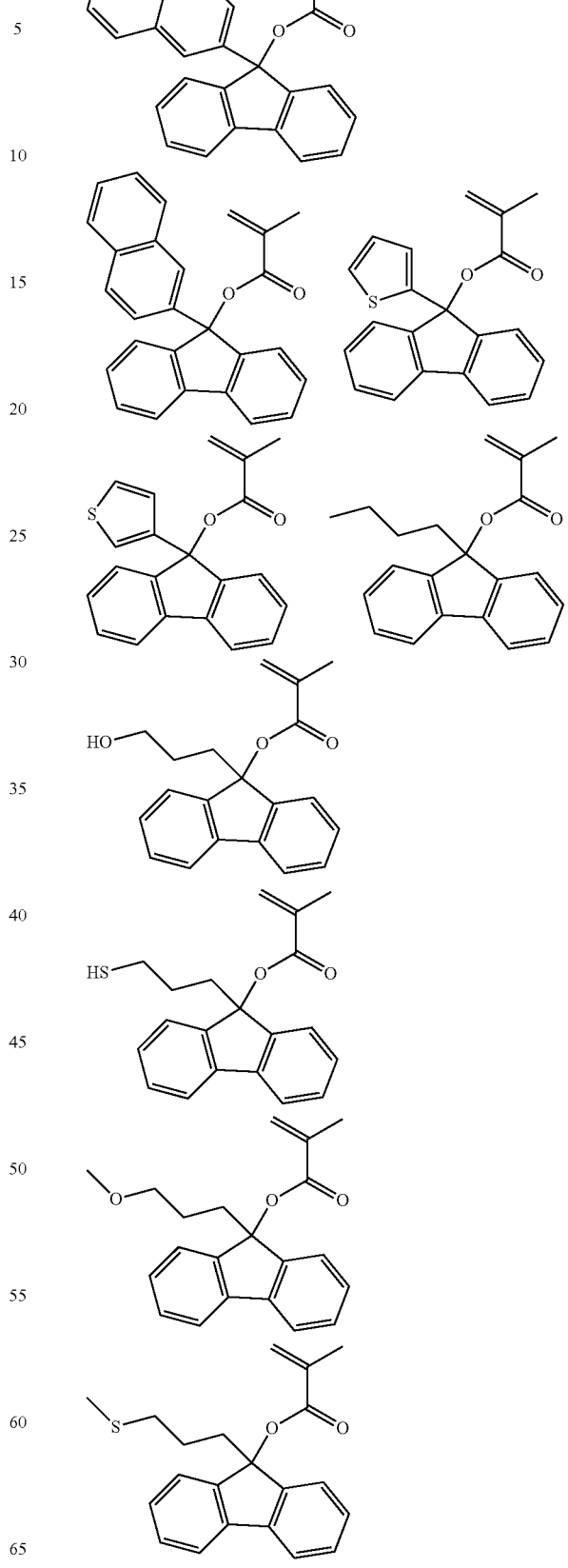

In the recurring unit (a1), the hydrogen atom of the carboxyl group may be substituted by an acid labile group having the general formula (A-3)-25.

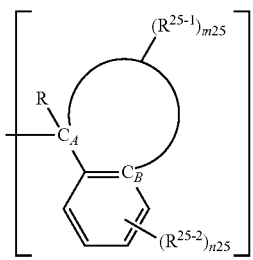

(A-3)-25

Herein $R^{25-1}$ is each independently hydrogen or a straight, branched or cyclic $C_1$-$C_6$ alkyl group, and in case m25 is 2 or more, $R^{25-1}$ may bond together to form a non-aromatic ring of 2 to 8 carbon atoms; the circle denotes a link between carbons $C_A$ and $C_B$, selected from among ethylene, propylene, butylene and pentylene; $R^{25-1}$ is not hydrogen when the circle denotes ethylene or propylene; $R^{25-2}$ is $C_1$-$C_4$ alkyl, alkoxy, alkanoyl, alkoxycarbonyl, hydroxyl, nitro, $C_6$-$C_{10}$ aryl, halogen, or cyano group; R is as defined above; m25 and n25 each are an integer of 1 to 4.

Examples of the monomer having a carboxyl group substituted with an acid labile group of formula (A-3)-25 are given below.

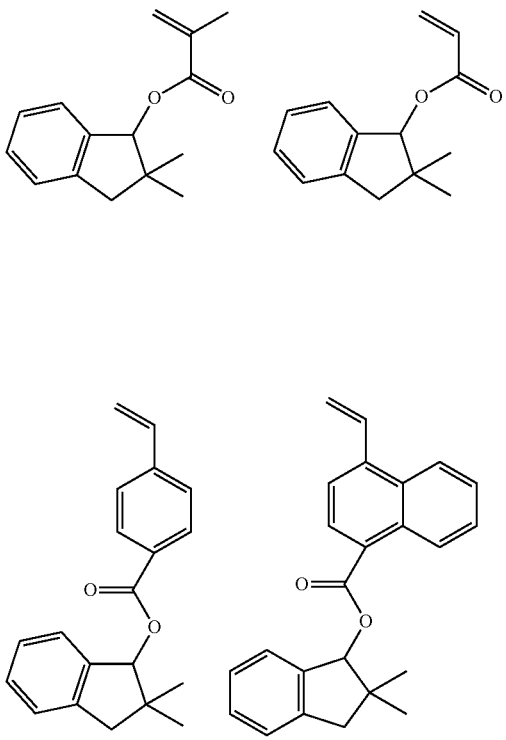

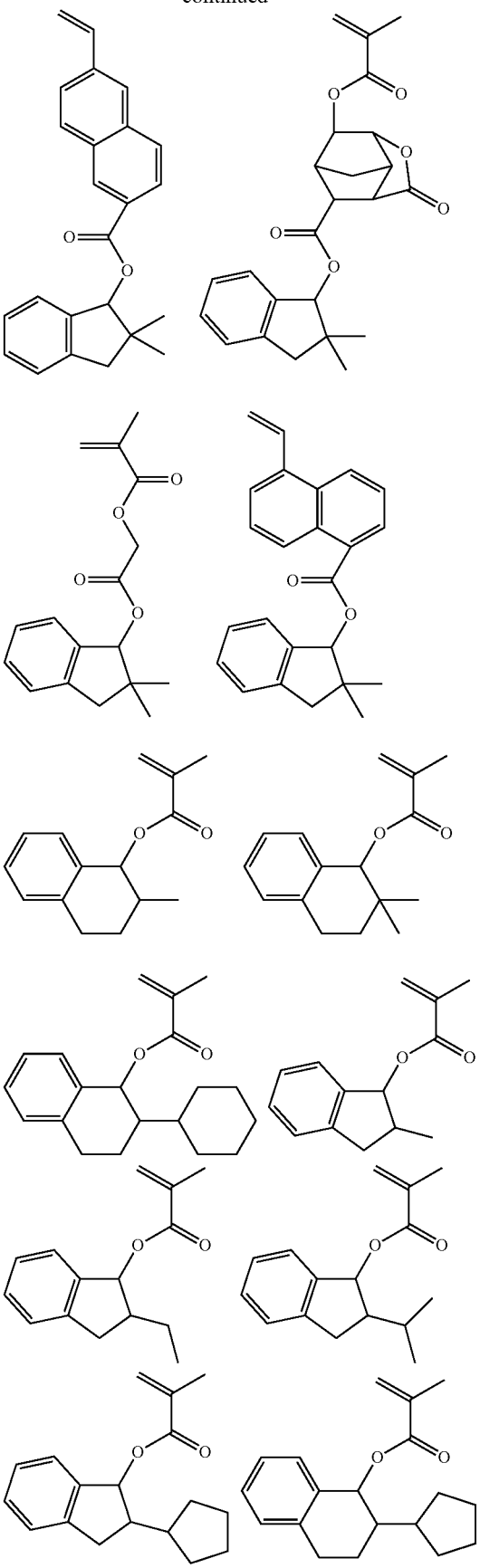

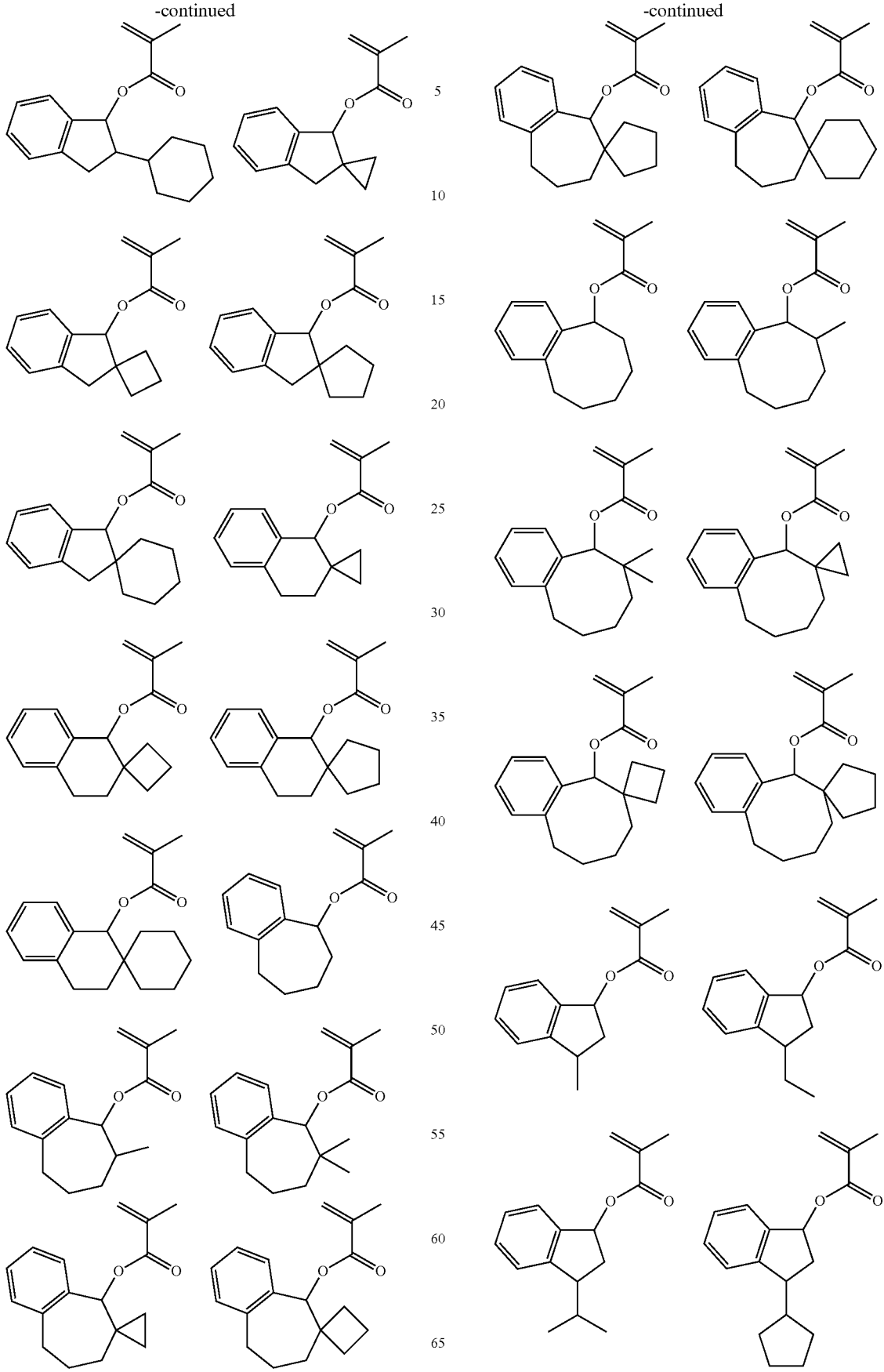

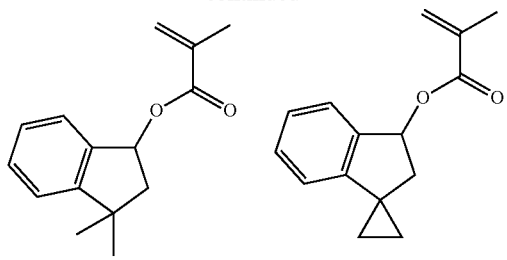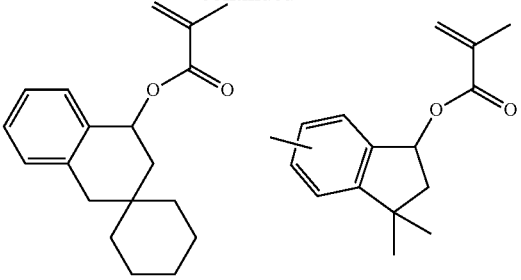

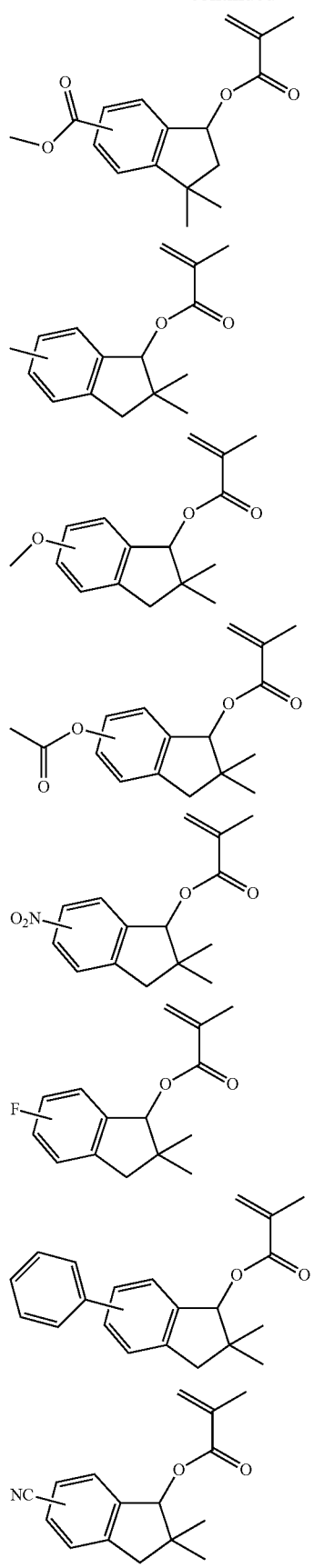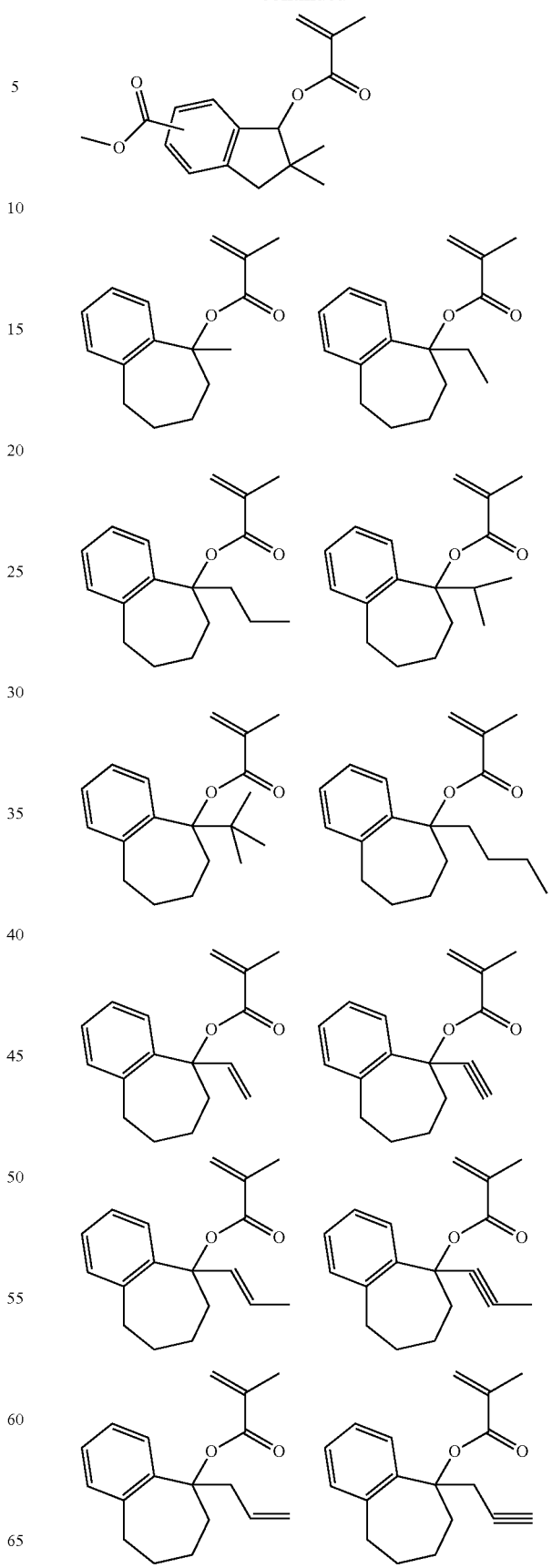

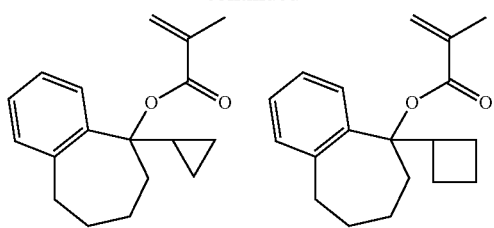
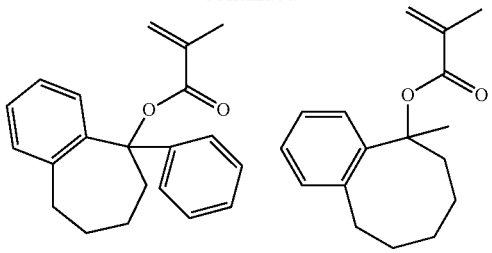

-continued
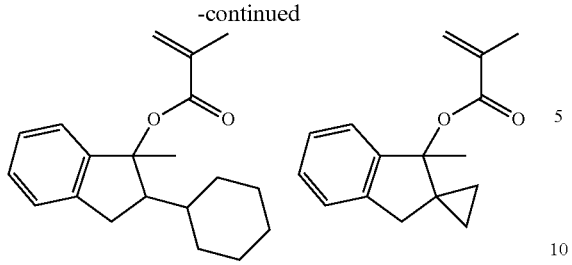
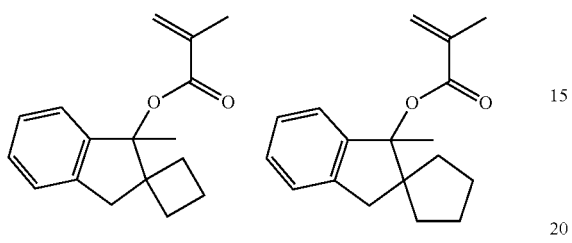
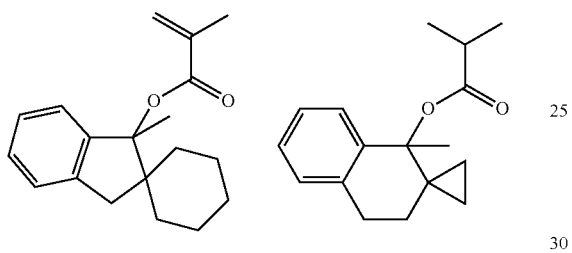
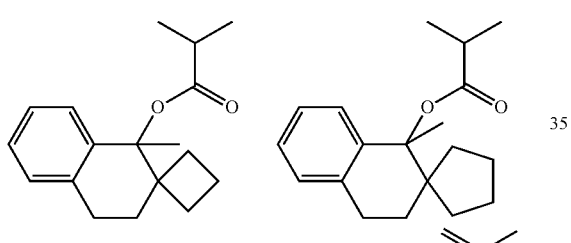
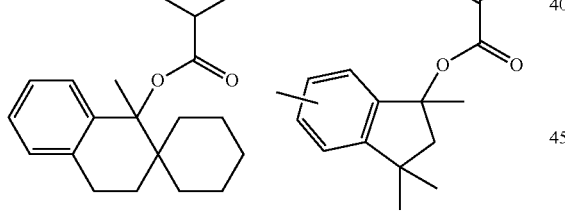
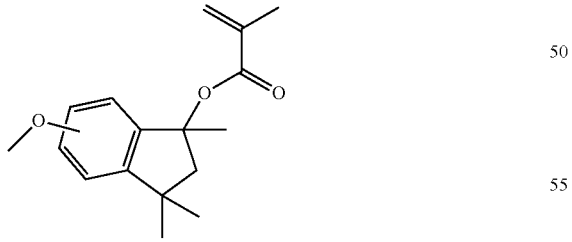
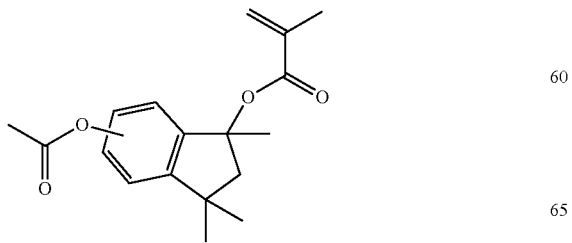
-continued
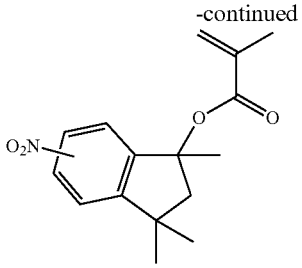
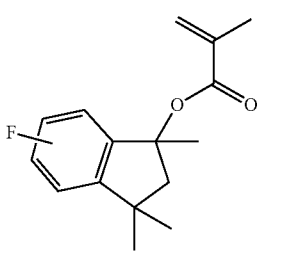
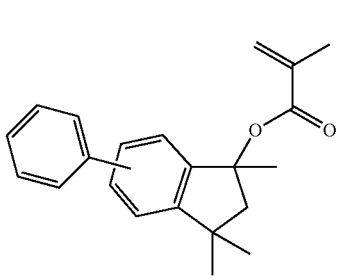
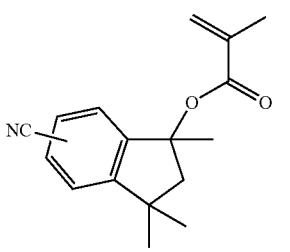
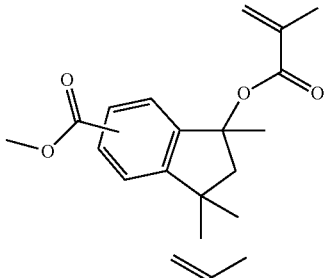
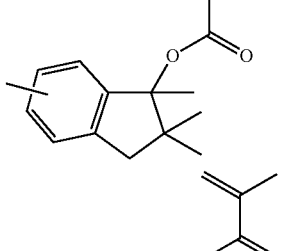
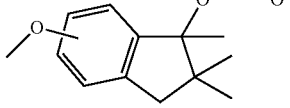

-continued

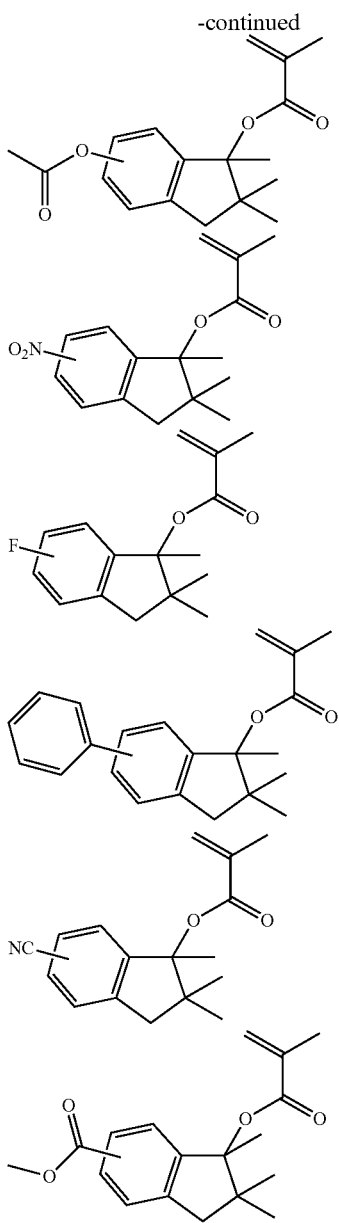

In the recurring unit (a1), the hydrogen atom of the carboxyl group may be substituted by an acid labile group having the general formula (A-3)-26.

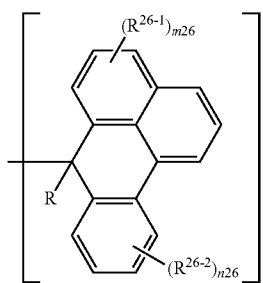
(A-3)-26

Herein $R^{26-1}$ and $R^{26-2}$ each are hydrogen, $C_1$-$C_4$ alkyl, alkoxy, alkanoyl, alkoxycarbonyl, hydroxyl, nitro, $C_6$-$C_{10}$ aryl, halogen, or cyano group; R is as defined above; and m26 and n26 each are an integer of 1 to 4.

Examples of the monomer having a carboxyl group substituted with an acid labile group of formula (A-3)-26 are given below.

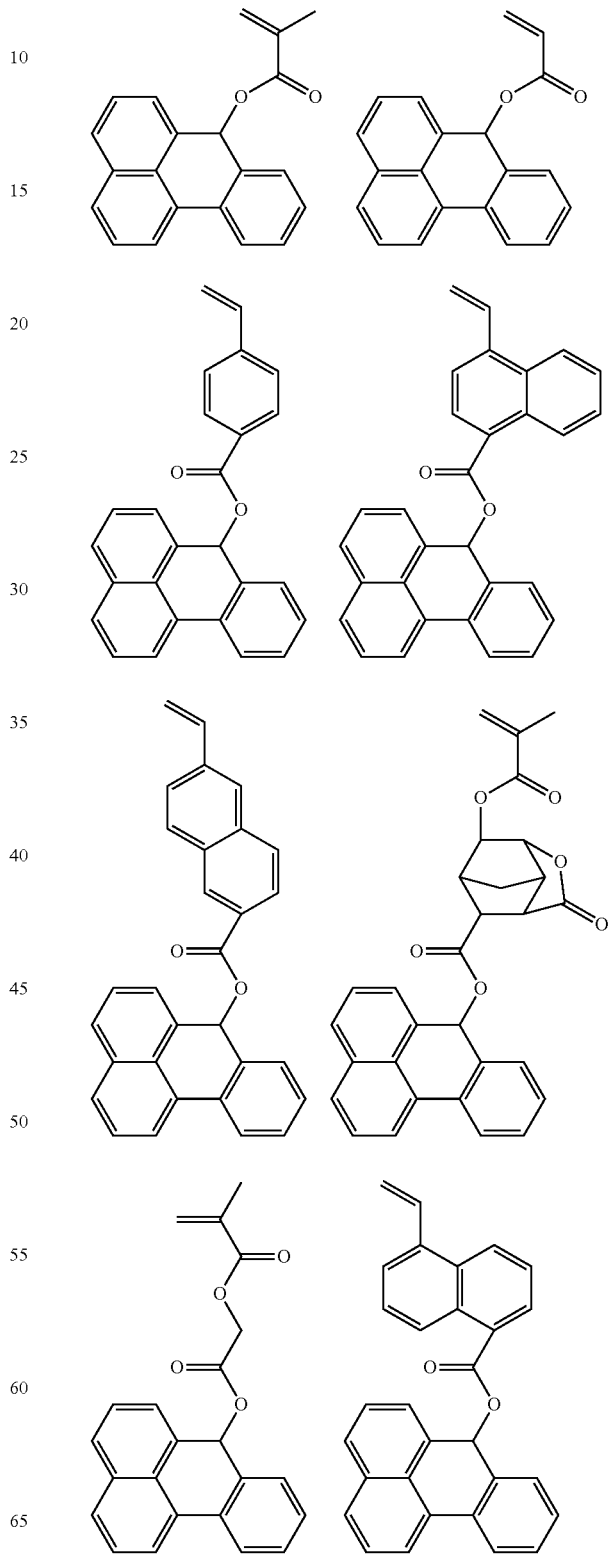

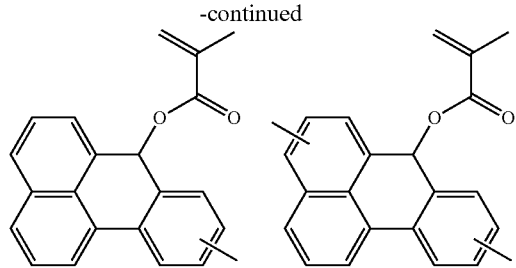
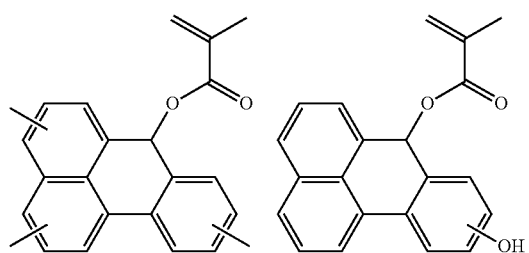
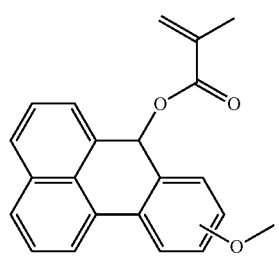
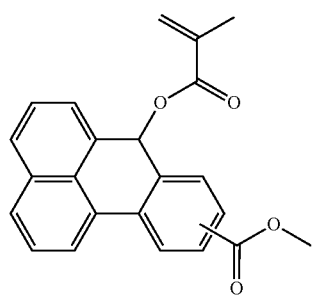
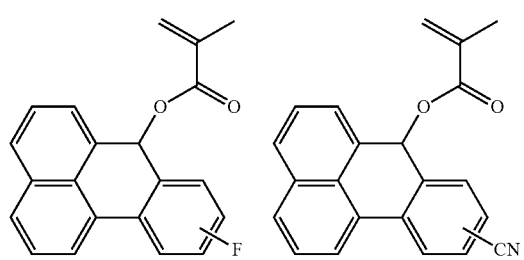
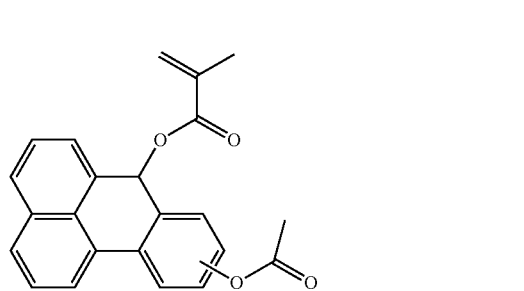
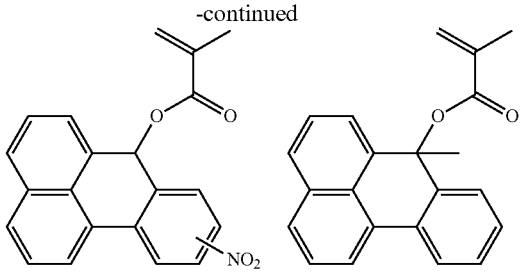
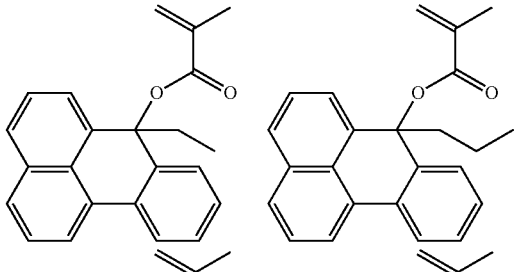
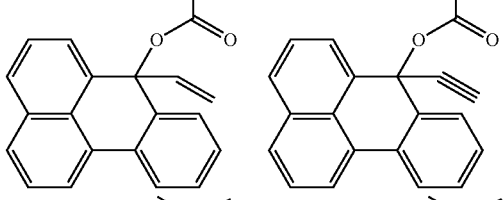
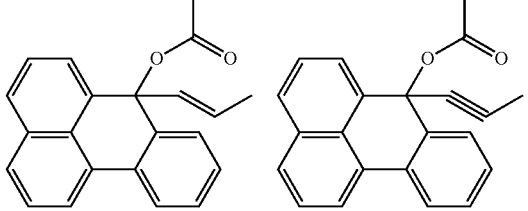
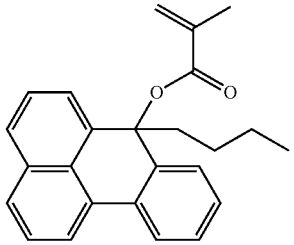
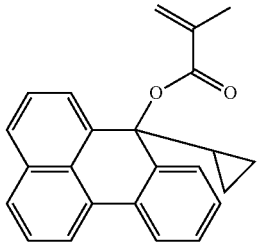
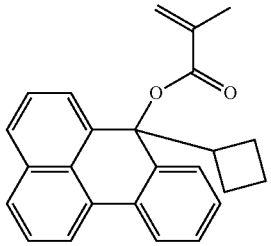

99
-continued
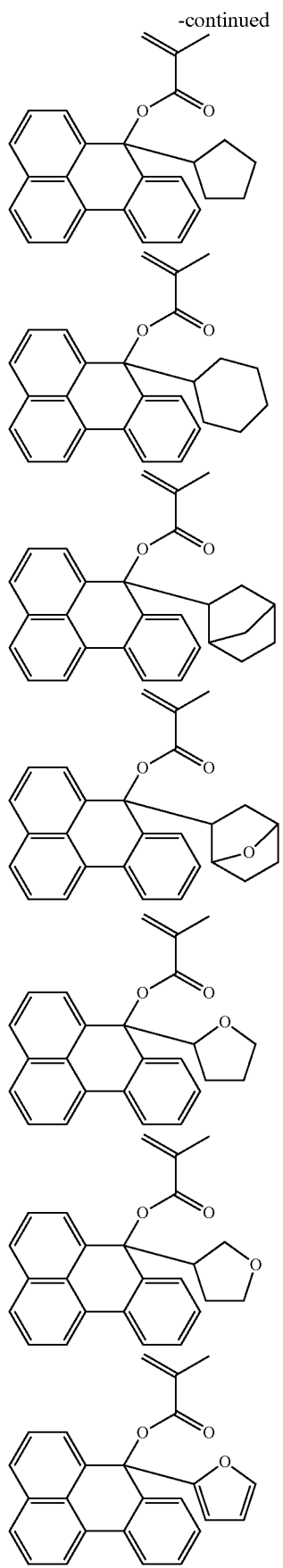
100
-continued
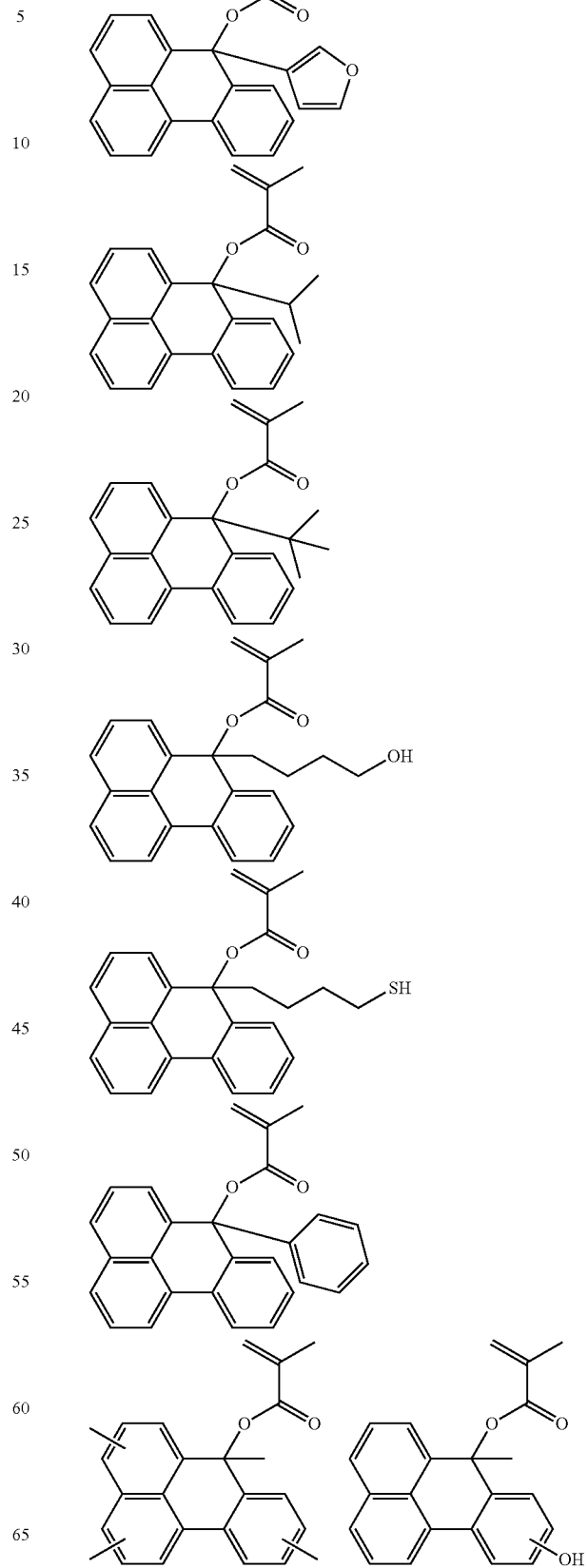

-continued

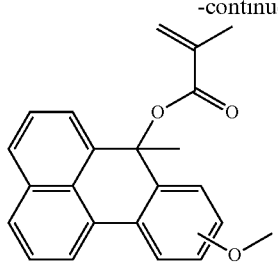

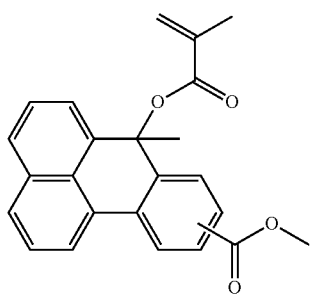

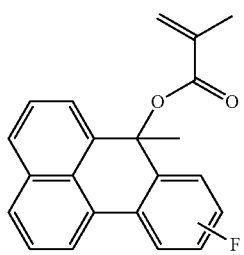

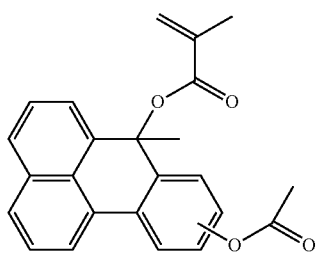

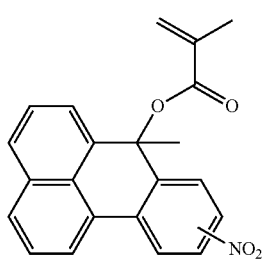

In the recurring unit (a1), the hydrogen atom of the carboxyl group may be substituted by an acid labile group having the general formula (A-3)-27.

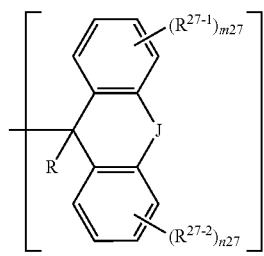
(A-3)-27

Herein $R^{27-1}$ and $R^{27-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above; J is methylene, ethylene, vinylene or —CH$_2$—S—; and m27 and n27 each are an integer of 1 to 4.

Examples of the monomer having a carboxyl group substituted with an acid labile group of formula (A-3)-27 are given below.

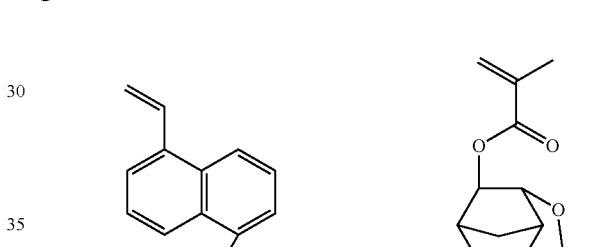

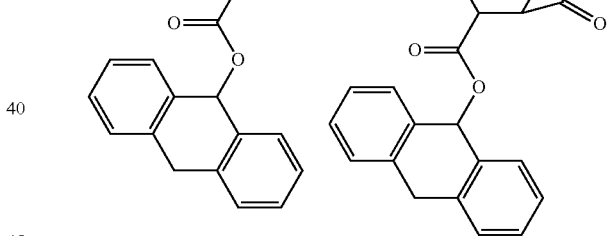

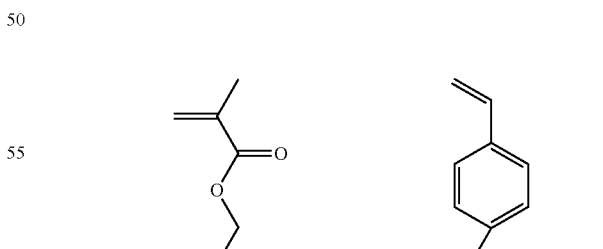

103
-continued
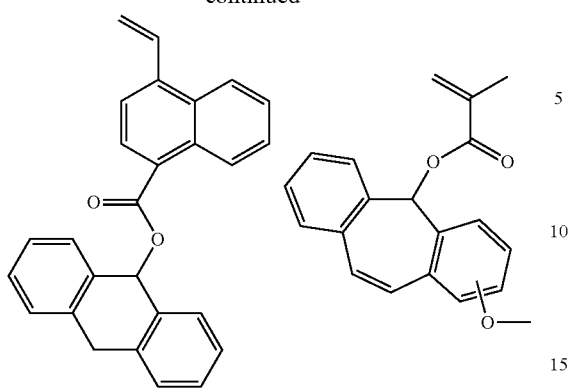
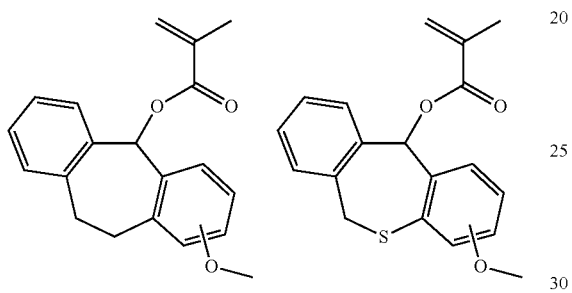
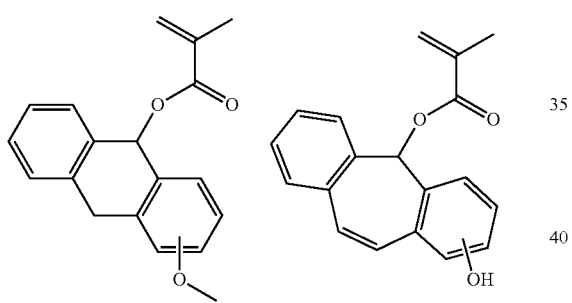
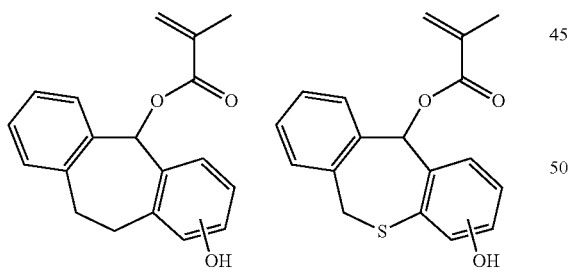
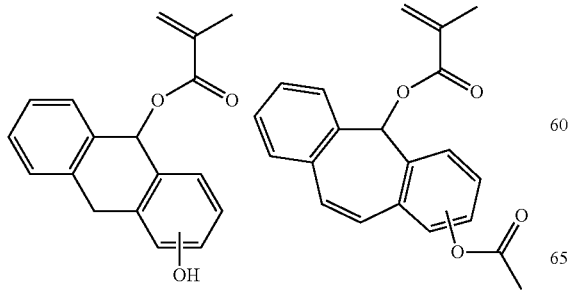
104
-continued
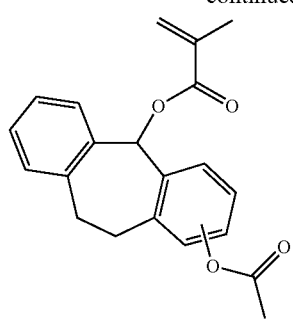
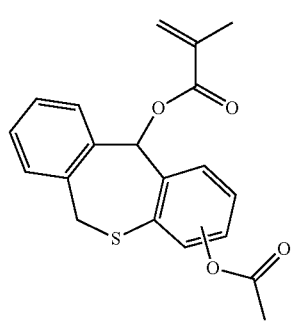
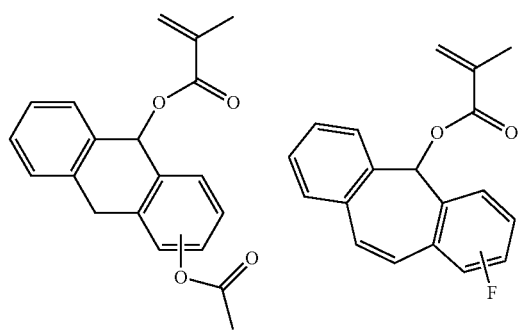
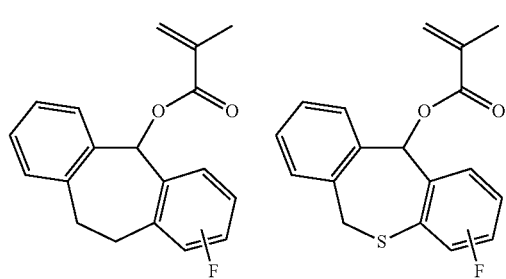
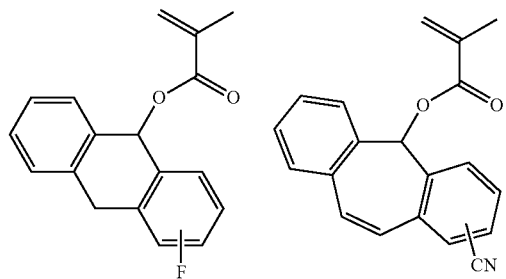

-continued
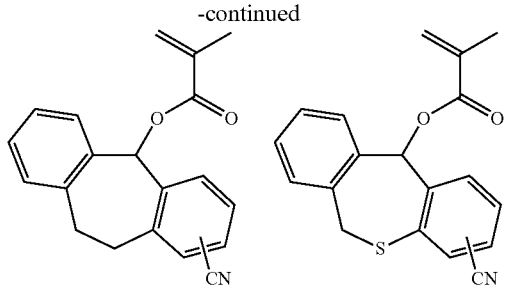
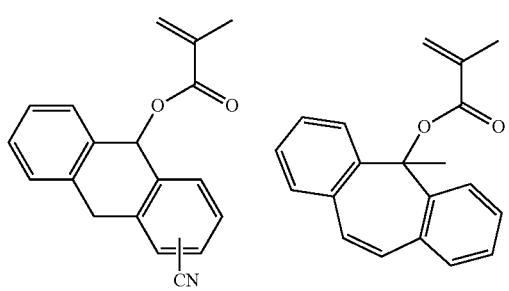
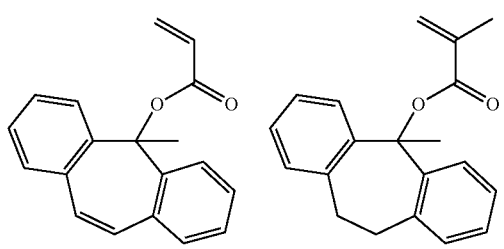
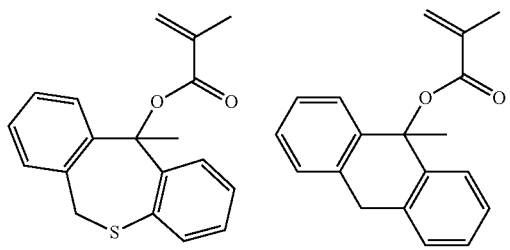
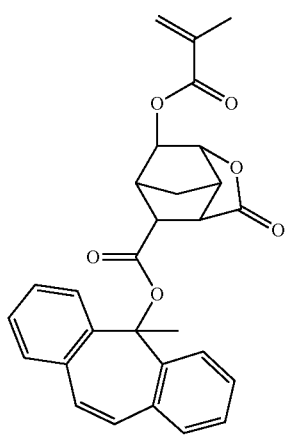
-continued
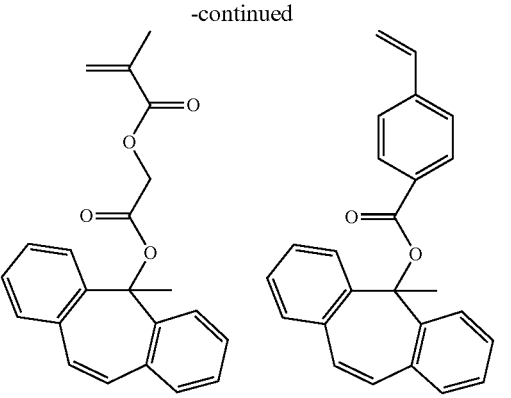
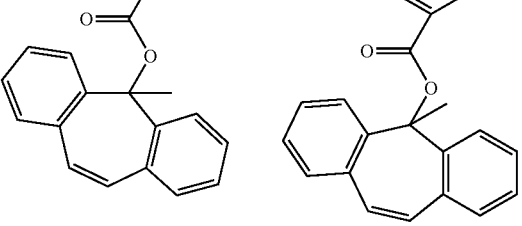
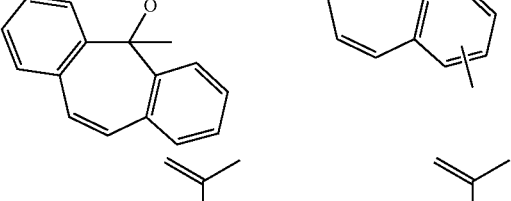
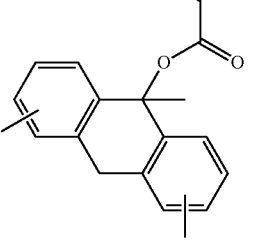

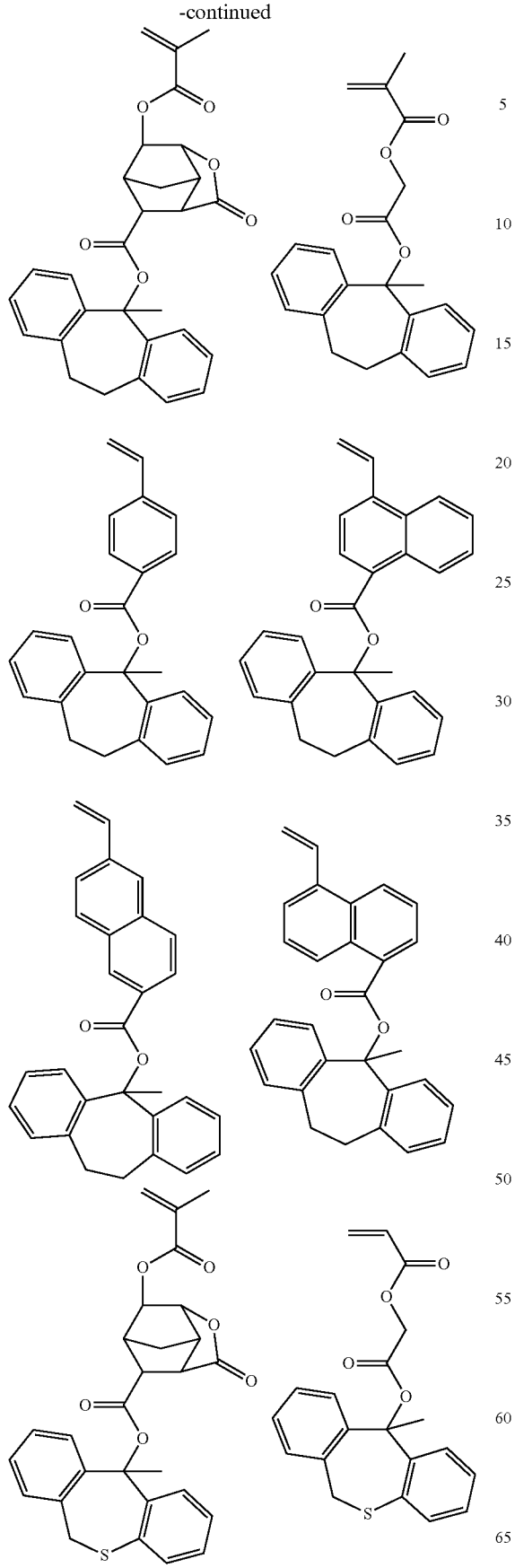
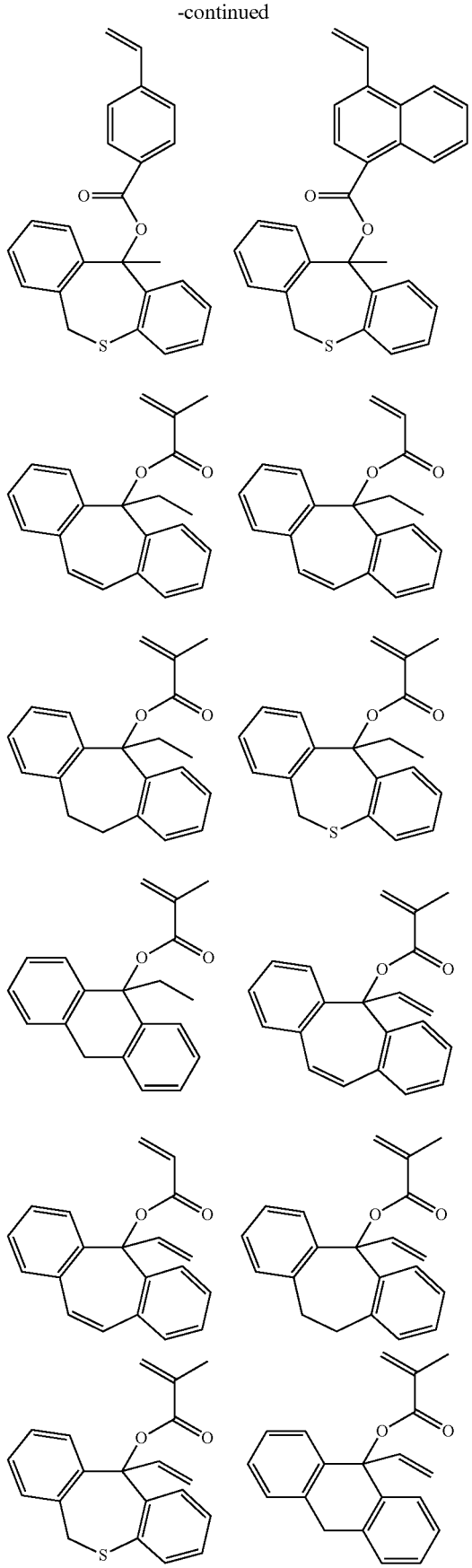

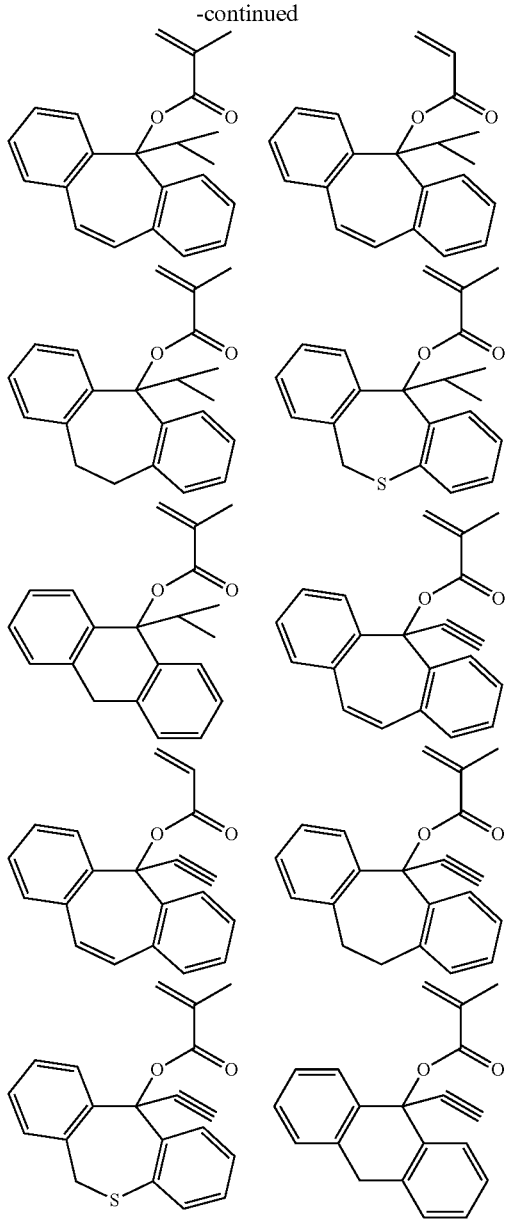

In the recurring unit (a1), the hydrogen atom of the carboxyl group may be substituted by an acid labile group having the general formula (A-3)-28.

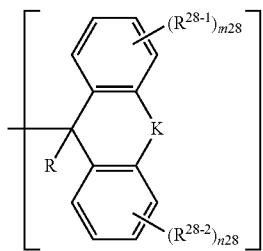

Herein $R^{28-1}$ and $R^{28-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above; K is carbonyl, ether, sulfide, —S(=O)— or —S(=O)$_2$—; and m28 and n28 each are an integer of 1 to 4.

Examples of the monomer having a carboxyl group substituted with an acid labile group of formula (A-3)-28 are given below.

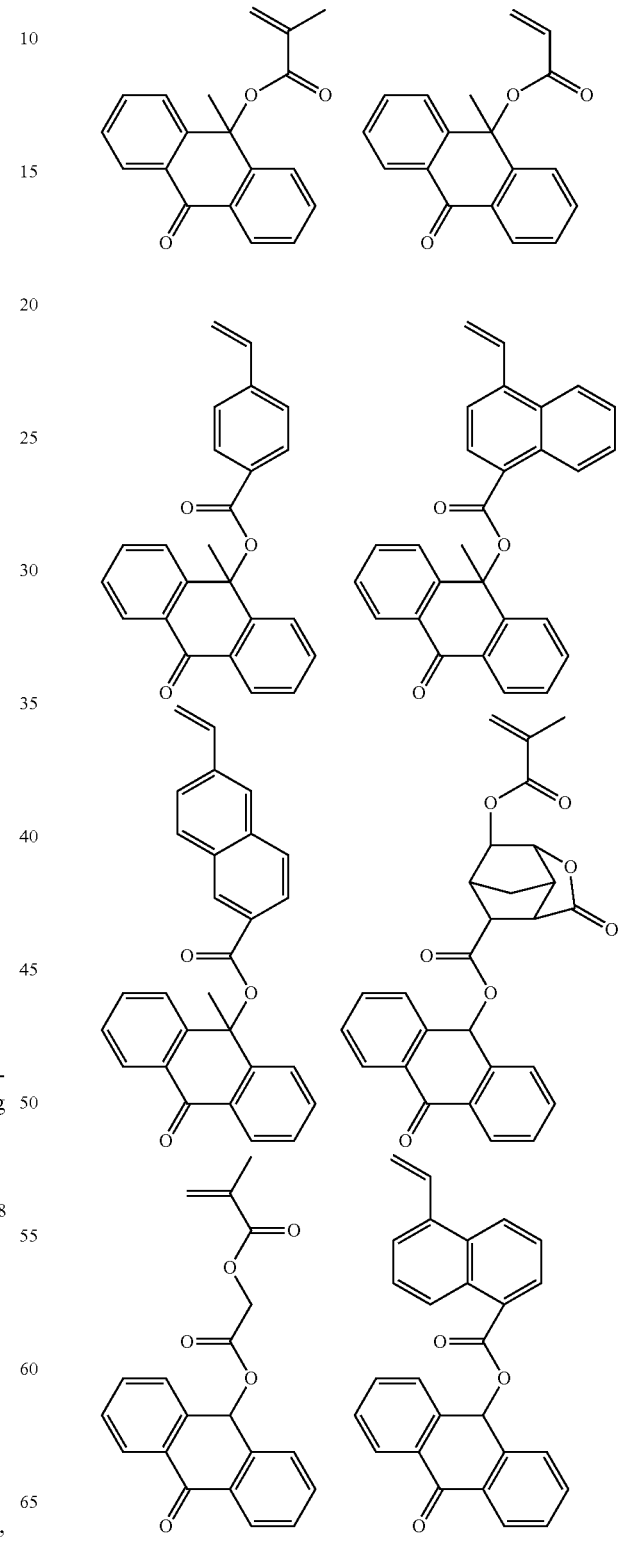

111
-continued
112
-continued
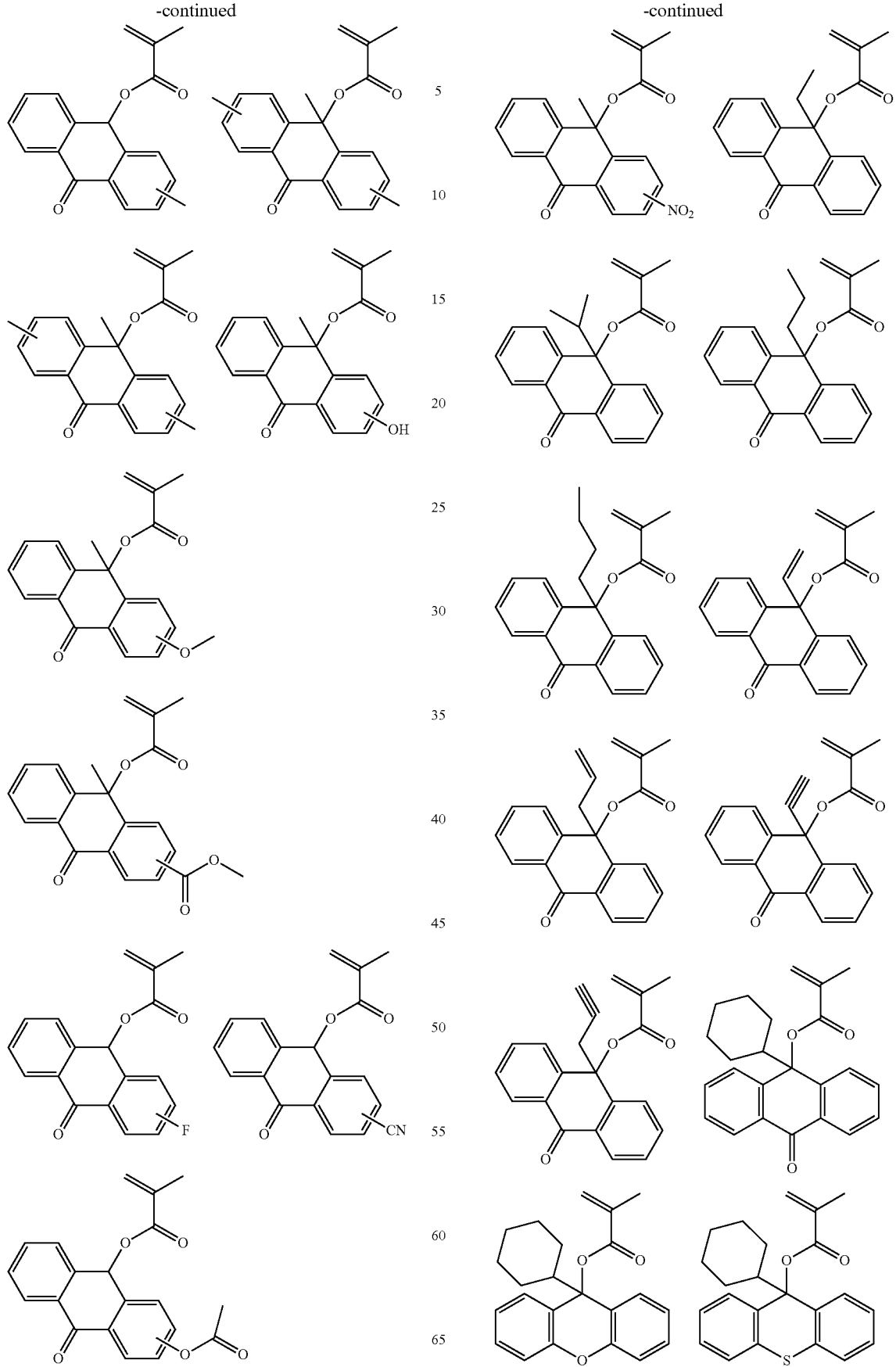

113
-continued
114
-continued
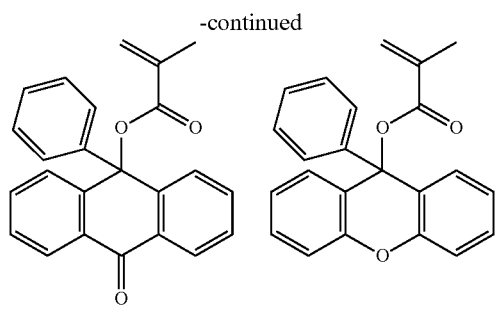
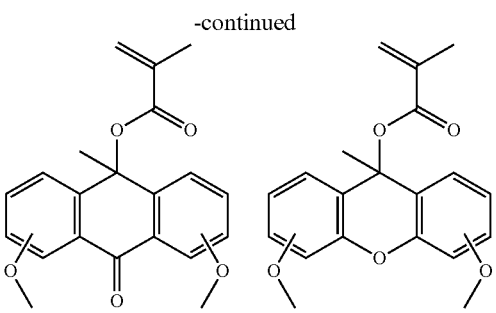

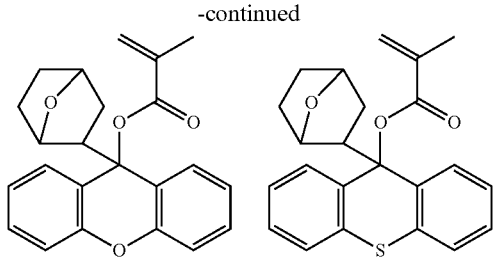
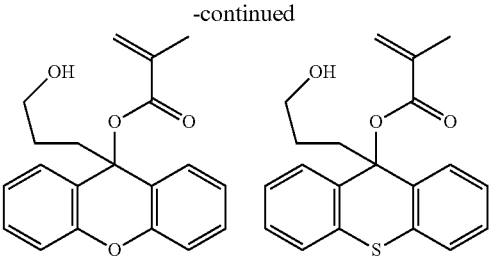
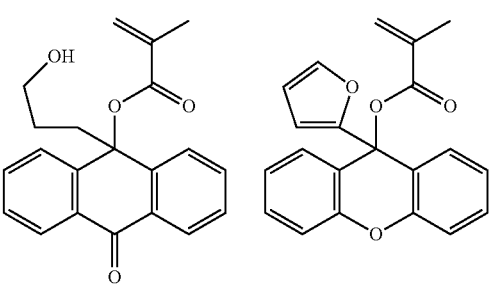
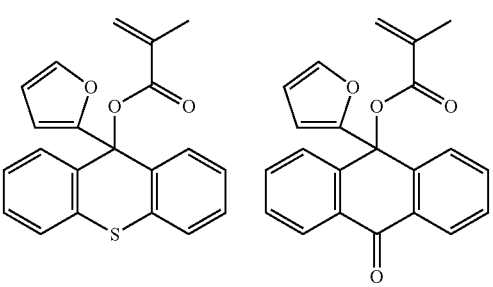
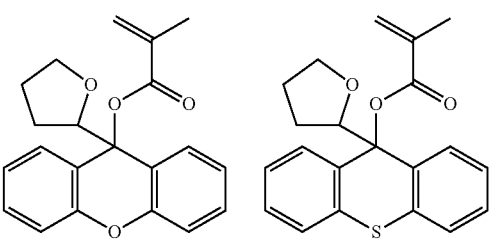
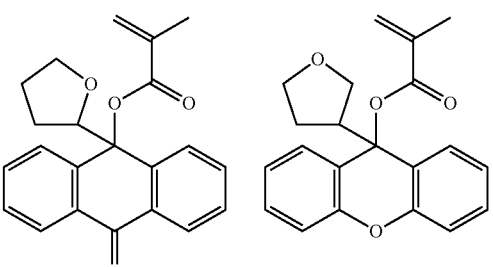
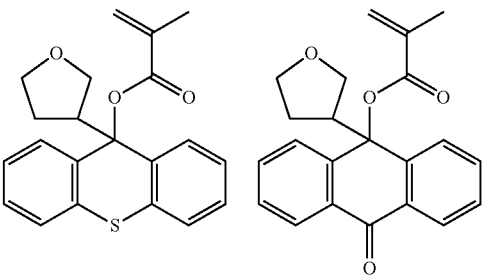

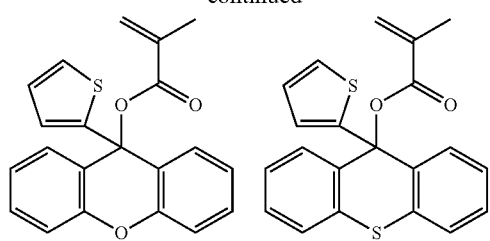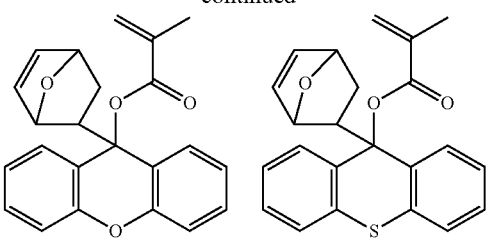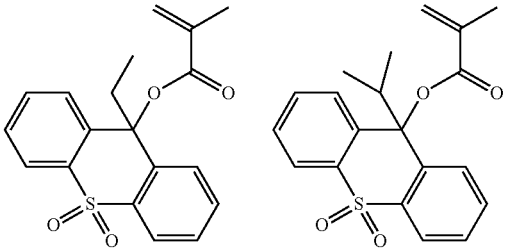

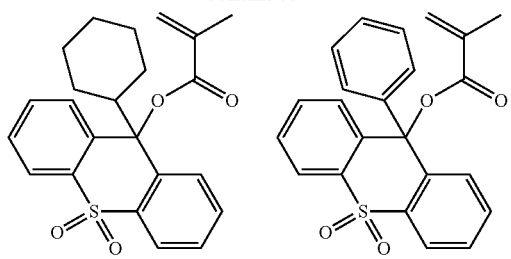
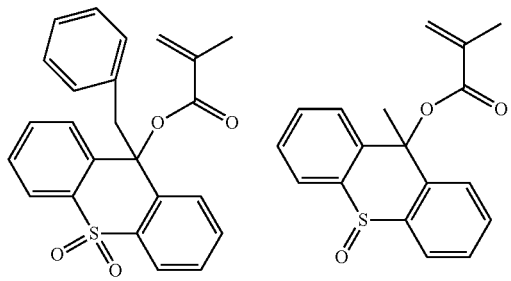
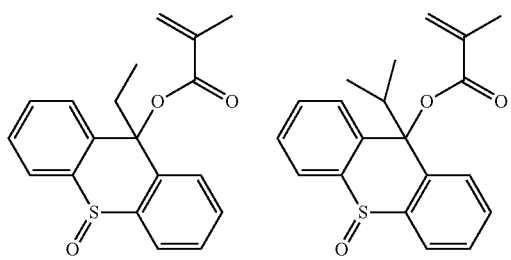
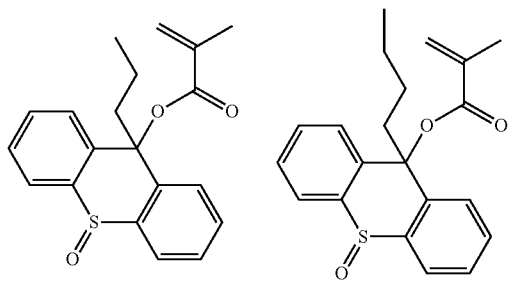
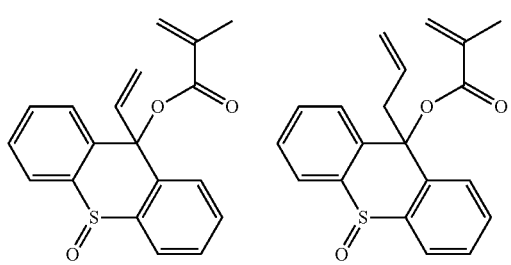
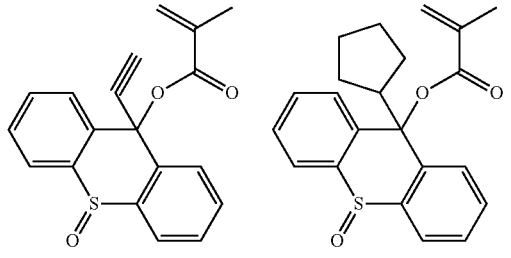
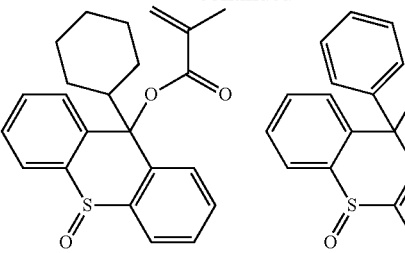
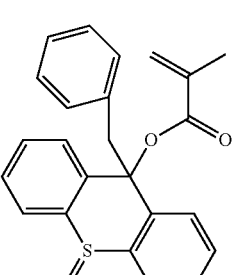
Also included are fluorinated acid labile groups as shown below.
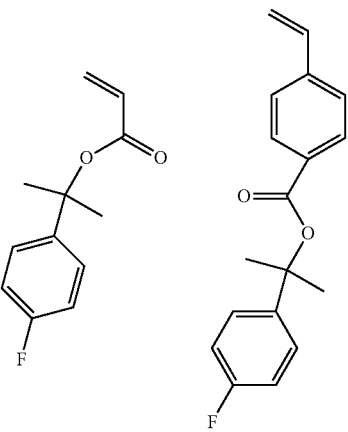
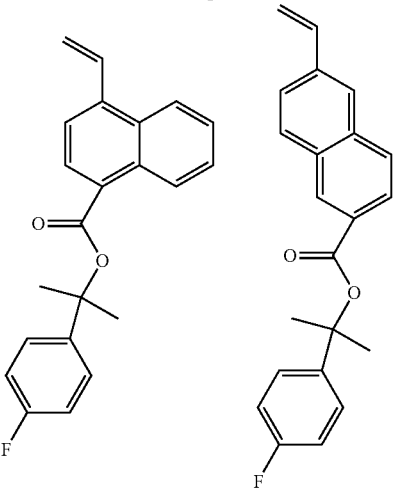

121
-continued
122
-continued
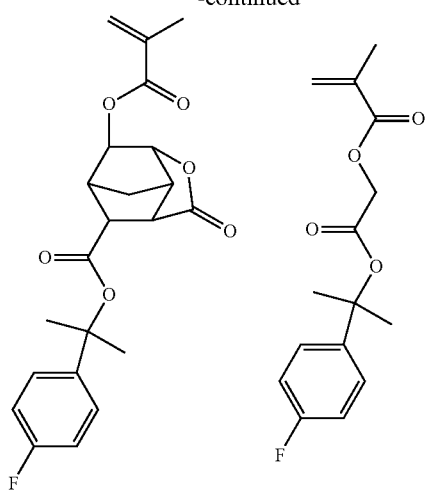
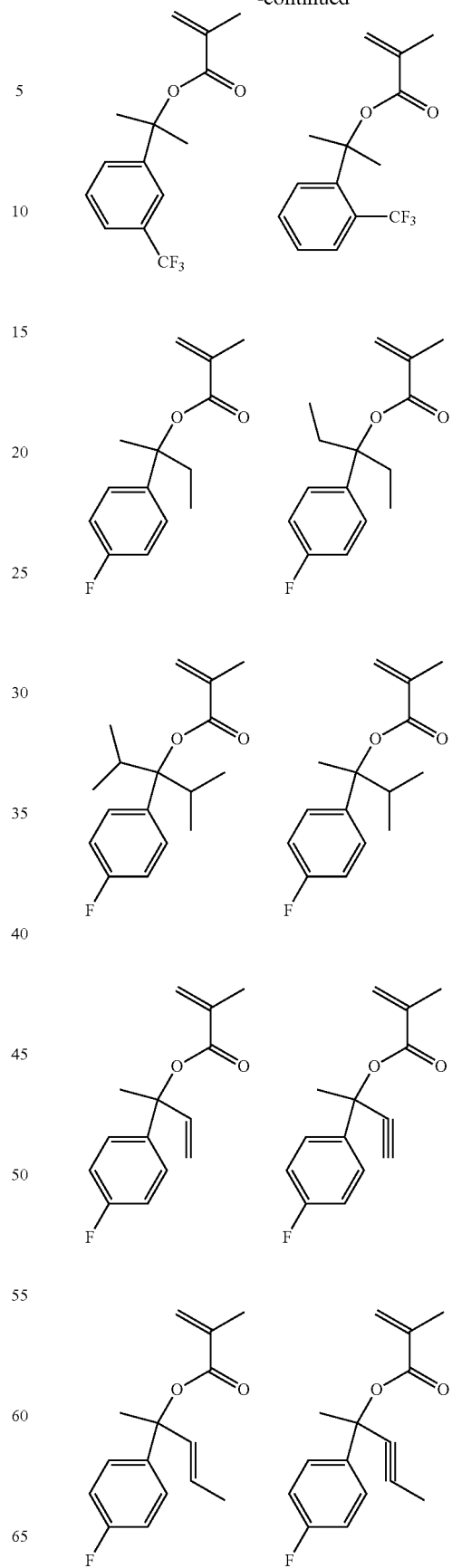

123
-continued
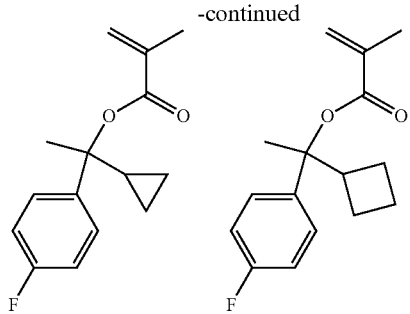
124
-continued
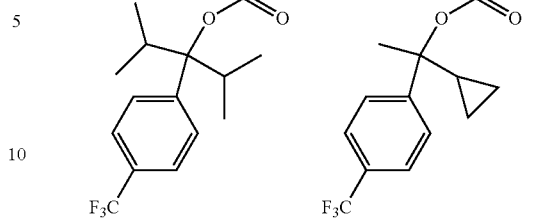
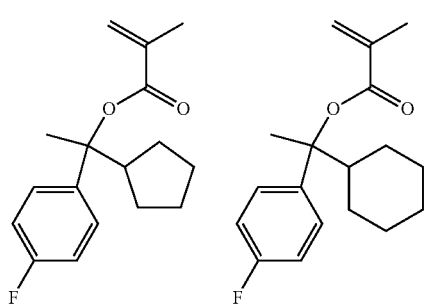
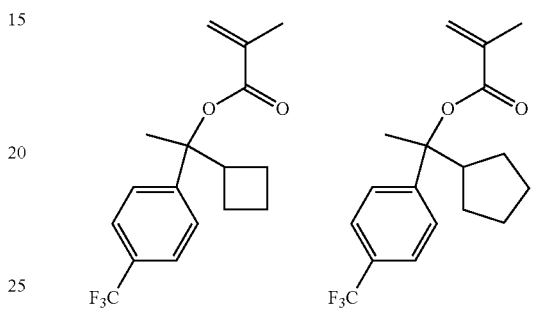
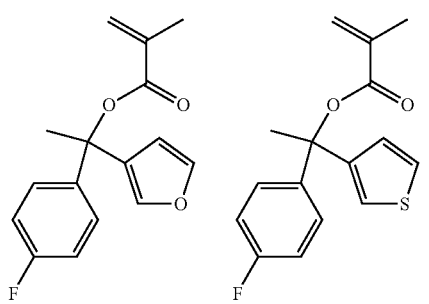
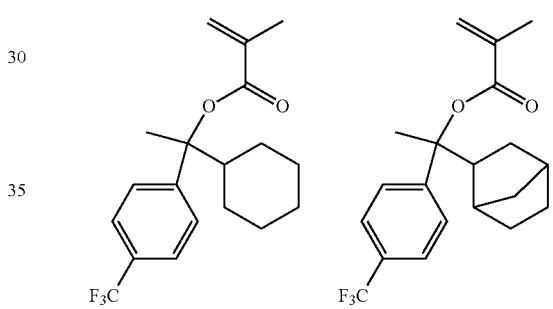
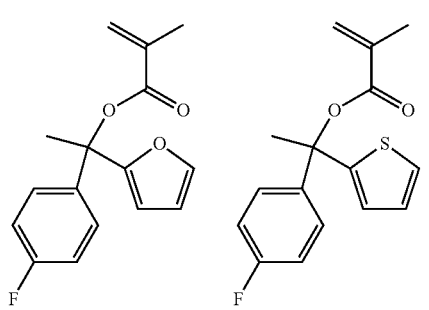
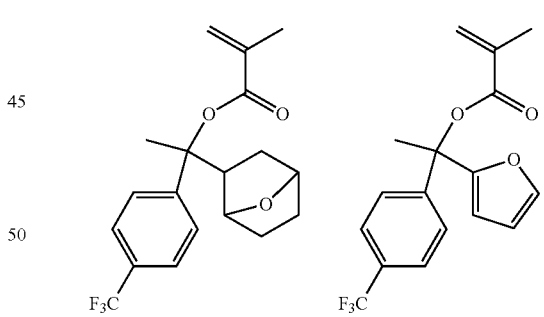
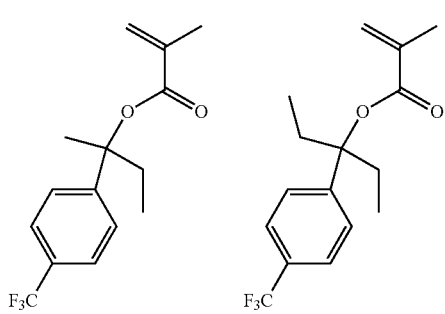
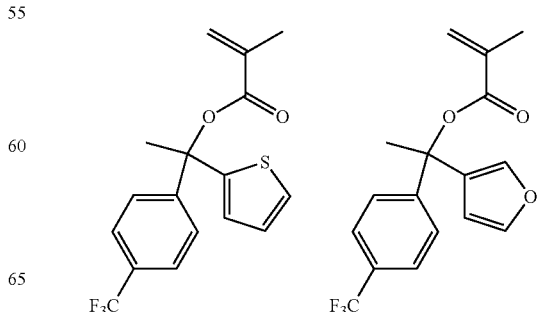

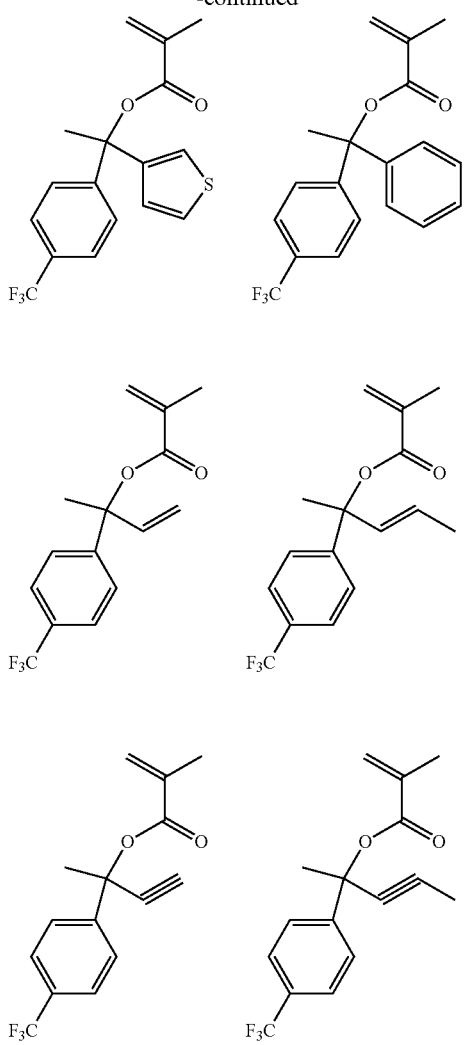
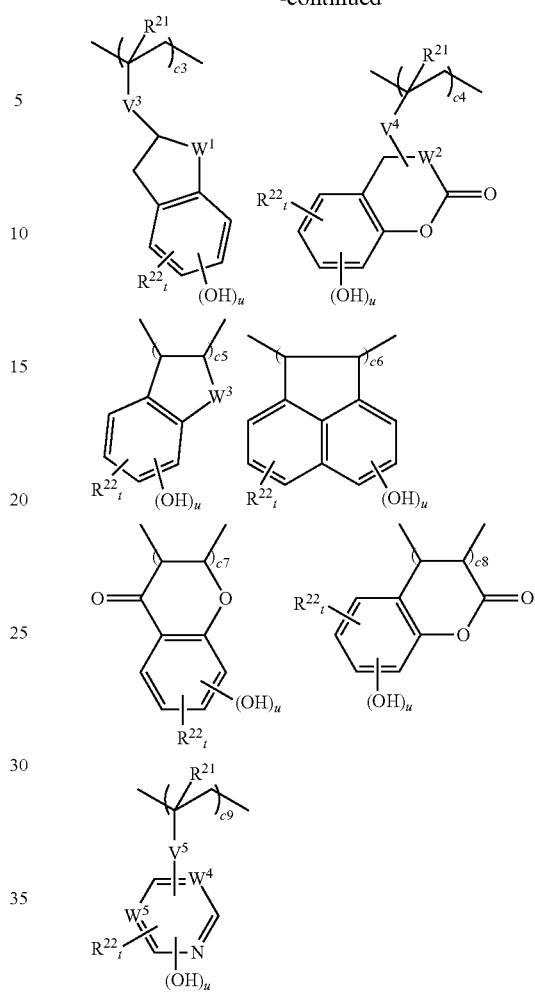

In a preferred embodiment of the polymer serving as base resin, recurring units (c) having an adhesive group may be copolymerized with the recurring units (a1) and (a2) having an acid labile group, represented by formula (3), for the purposes of improving adhesion. Suitable adhesive groups include hydroxyl, carboxyl, lactone ring, carbonyl, carbonate, ester, ether, amide, sulfonamide, cyano, sulfonic acid ester, lactam and the like. The preferred recurring units (c) are those having a phenolic hydroxyl group which has a sensitizing effect in the EB and EUV lithography. The recurring units (c) having a phenolic hydroxyl group are typically selected from units (c1) to (c9) represented by the general formula (9).

(9)

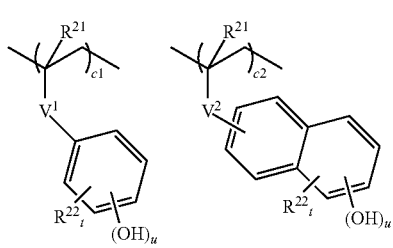

Herein $R^{21}$ is each independently hydrogen or methyl. $V^1$, $V^2$ and $V^5$ each are a single bond or —C(=O)—O—$R^{23}$—, $V^3$ and $V^4$ each are —C(=O)—O—$R^{24}$—, wherein $R^{23}$ and $R^{24}$ each are a single bond or a straight, branched or cyclic $C_1$-$C_{10}$ alkylene group which may contain an ether or ester moiety. $R^{22}$ is each independently hydrogen, or a $C_1$-$C_4$ straight or branched alkyl, alkoxy, cyano, alkoxycarbonyl, acyloxy or acyl group. $W^1$ and $W^2$ each are methylene or ethylene, $W^3$ is methylene, oxygen or sulfur, $W^4$ and $W^5$ each are CH or nitrogen, and u and t each are 1 or 2.

Examples of the monomers from which the recurring units (c1) to (c9) having a phenolic hydroxyl group are derived are given below.

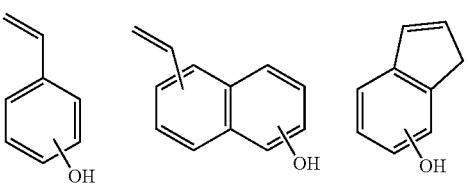

127
-continued
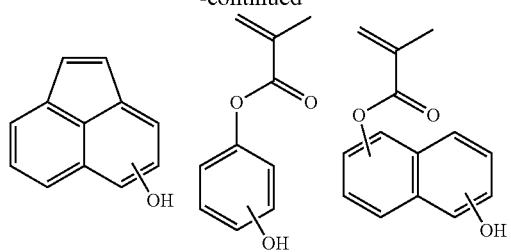
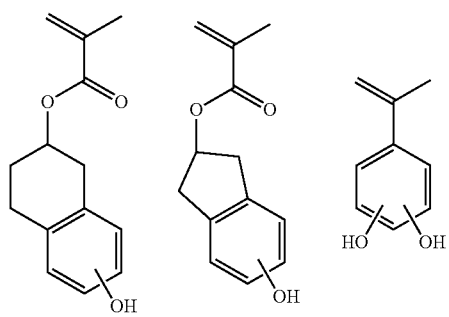
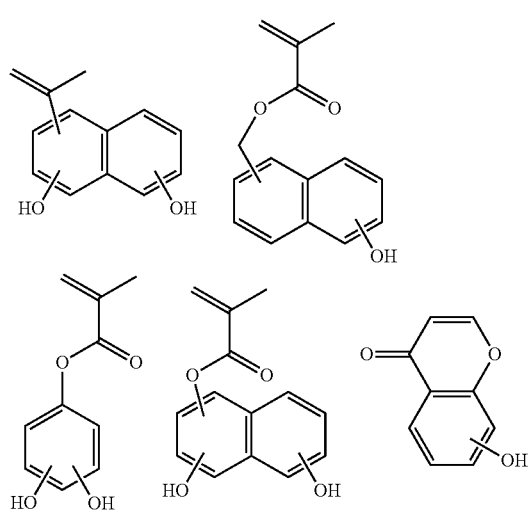
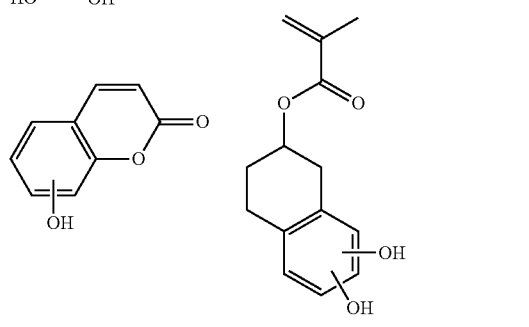
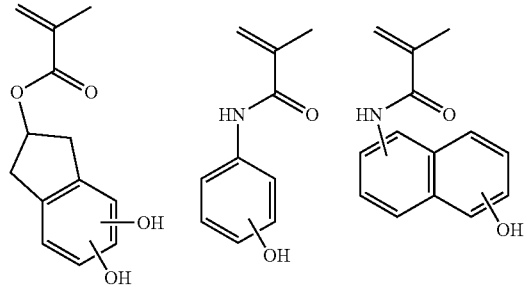
128
-continued
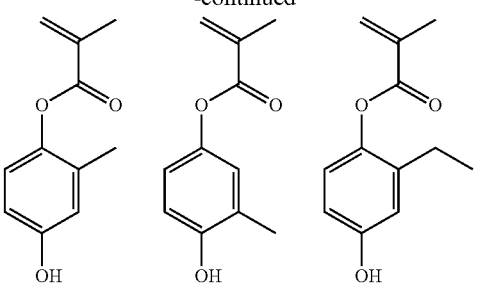
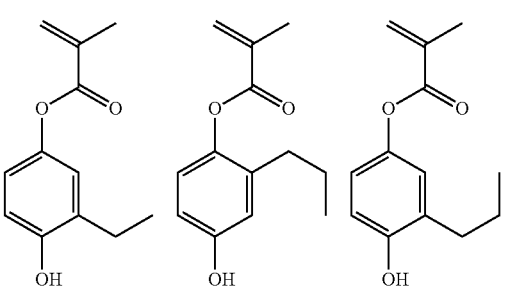
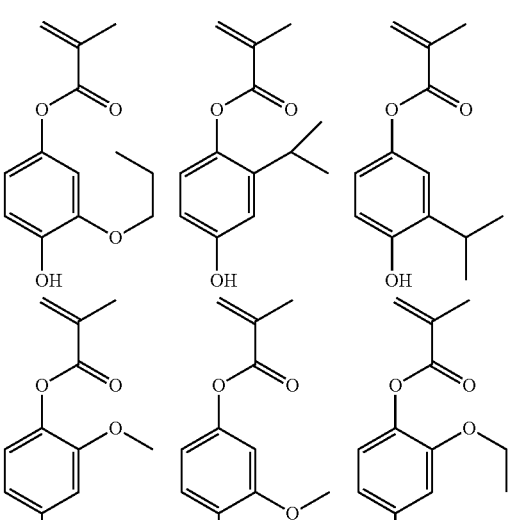
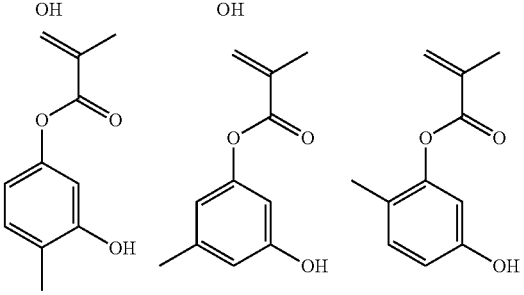

129
-continued
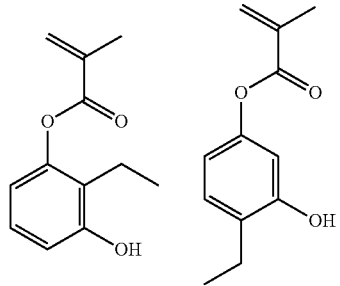
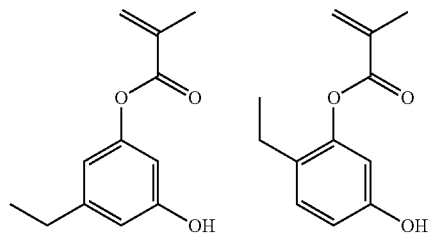
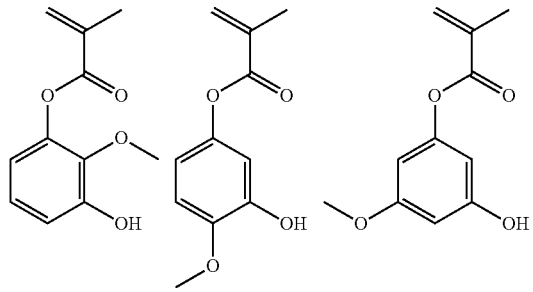
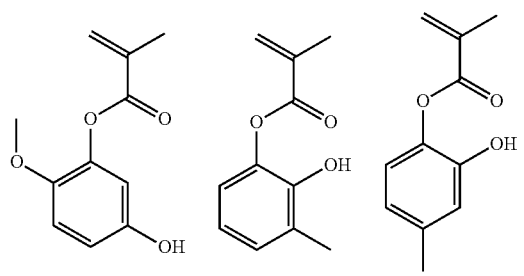
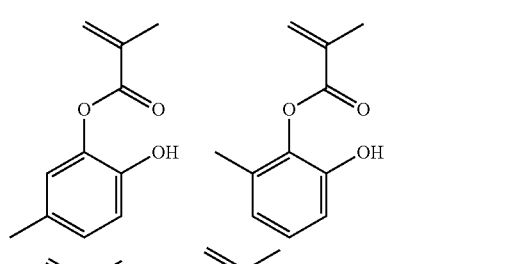
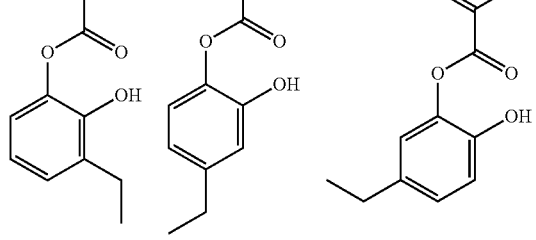
130
-continued
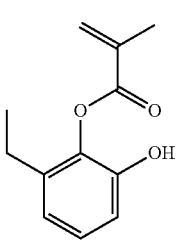
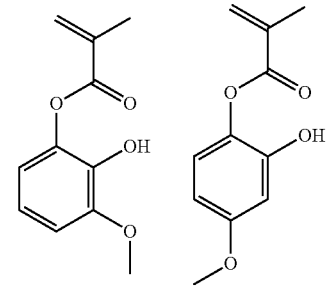
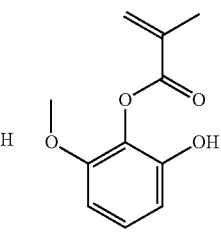
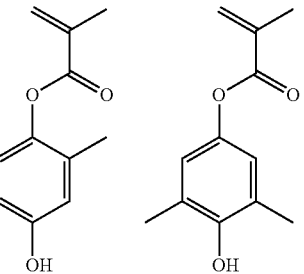
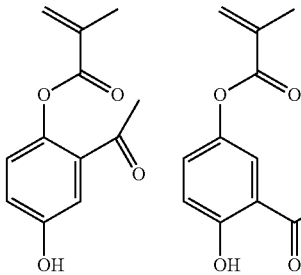
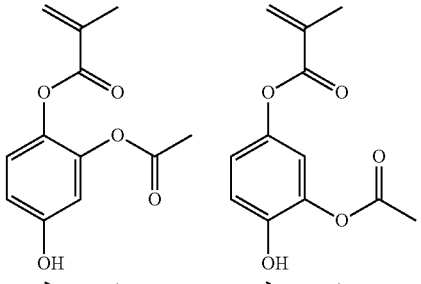
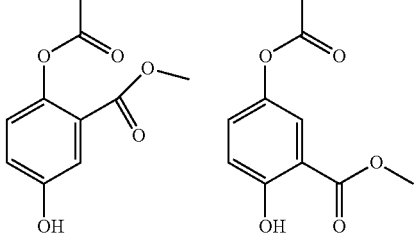

131
-continued
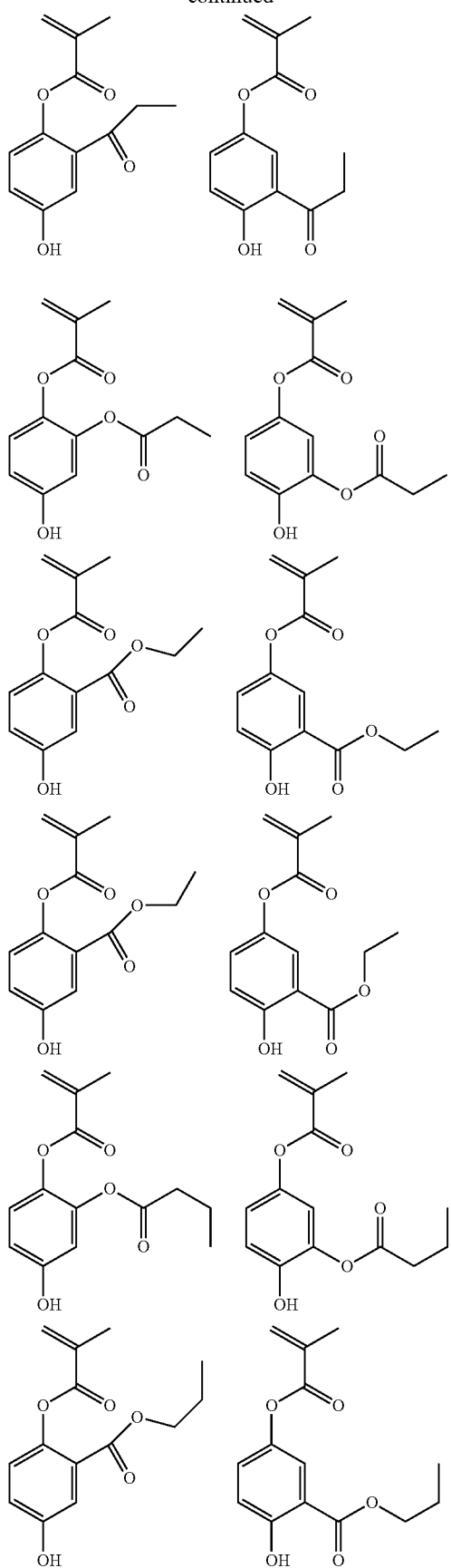
132
-continued
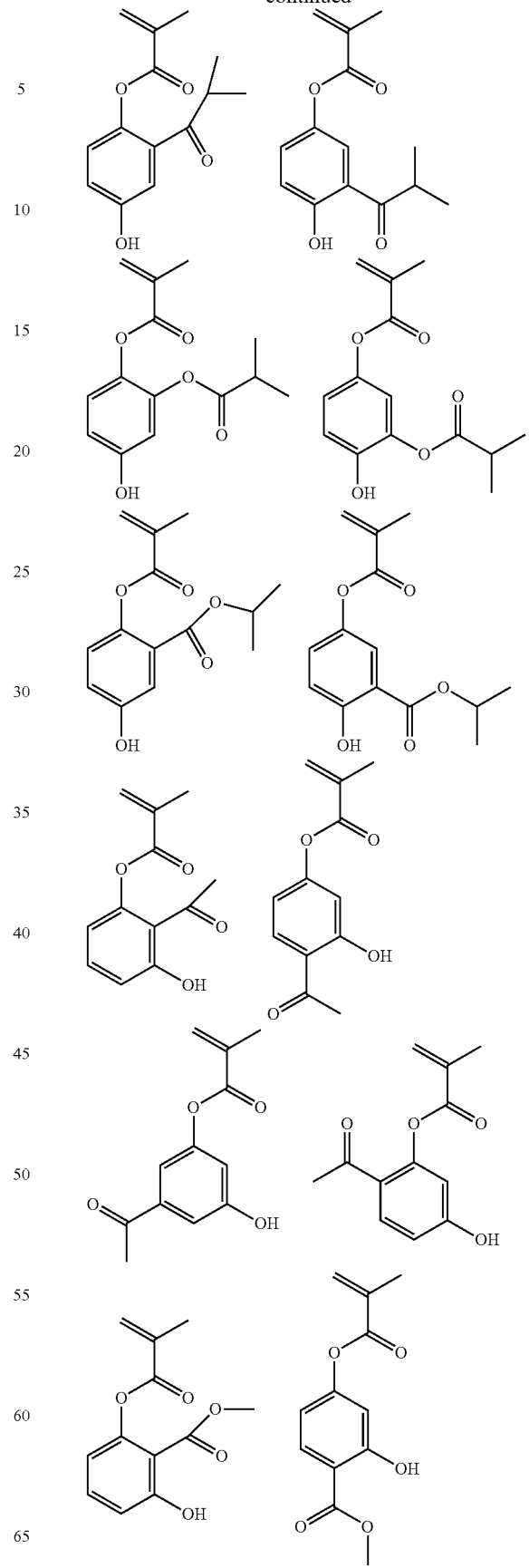

133
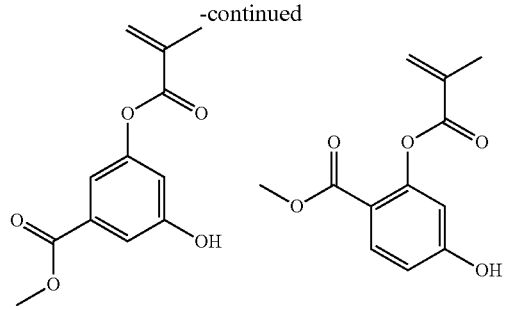
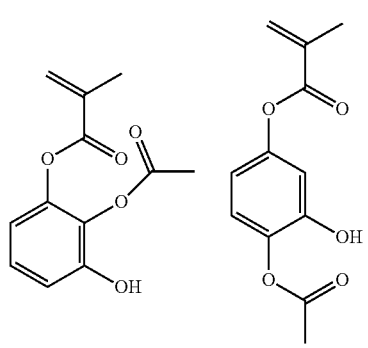
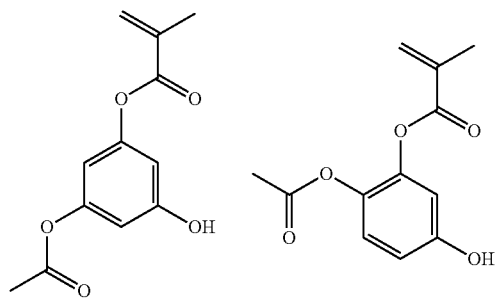
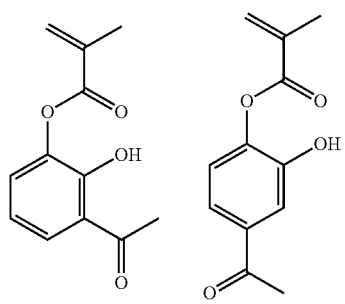
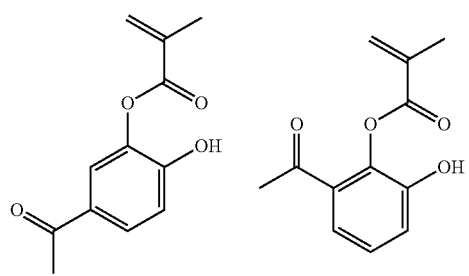
134
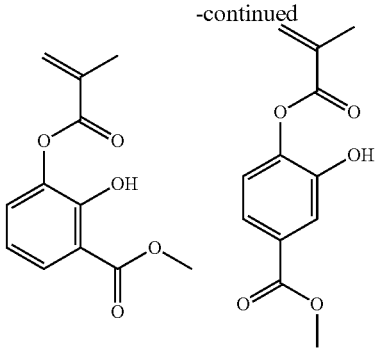
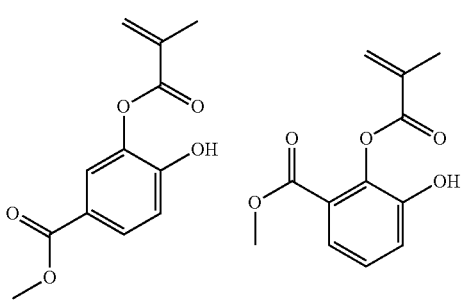
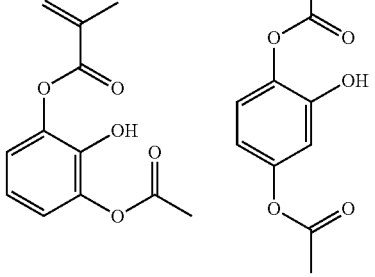
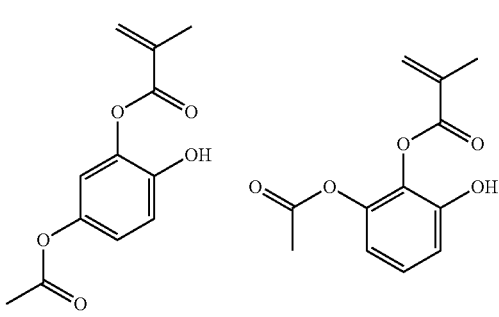
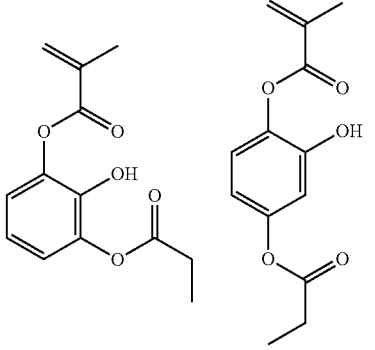

135
-continued
136
-continued
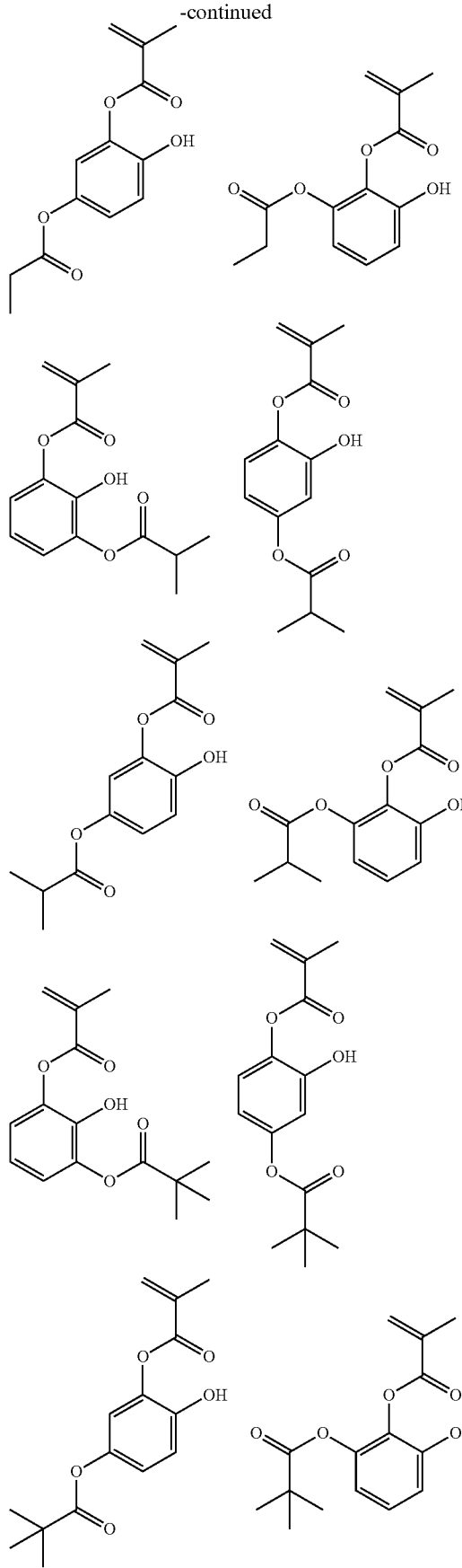
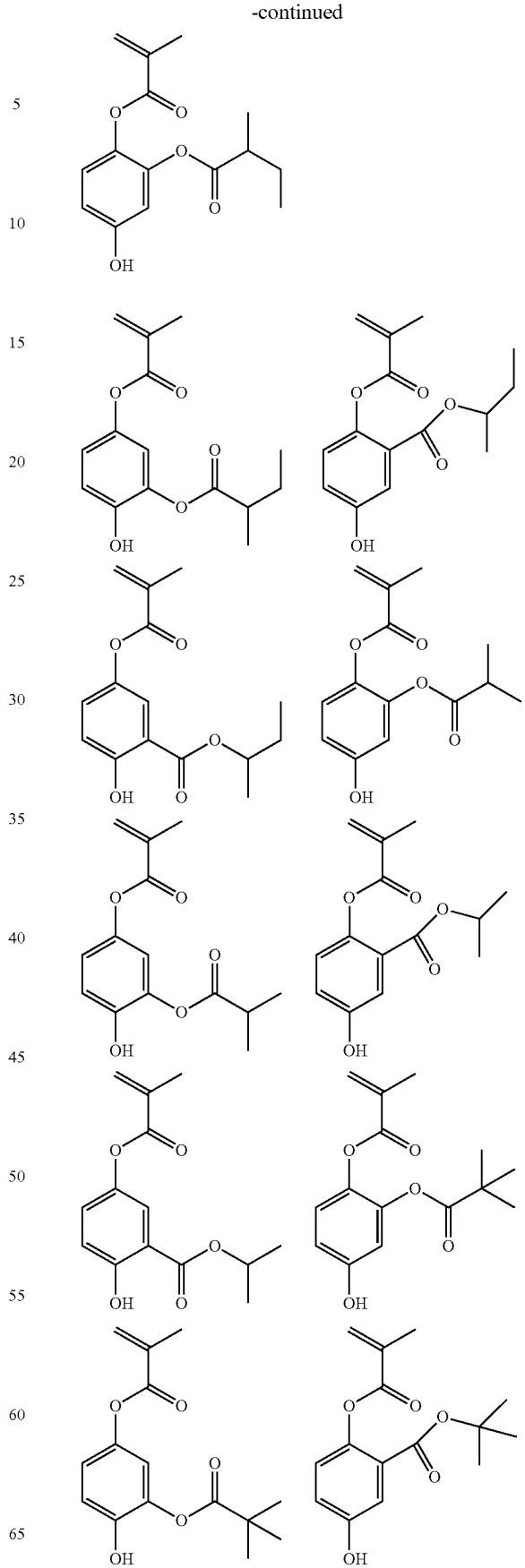

137
-continued
138
-continued
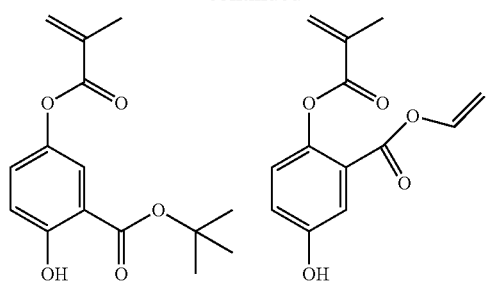
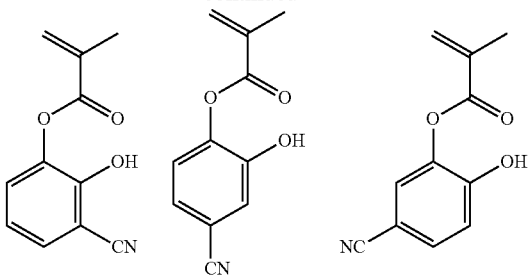

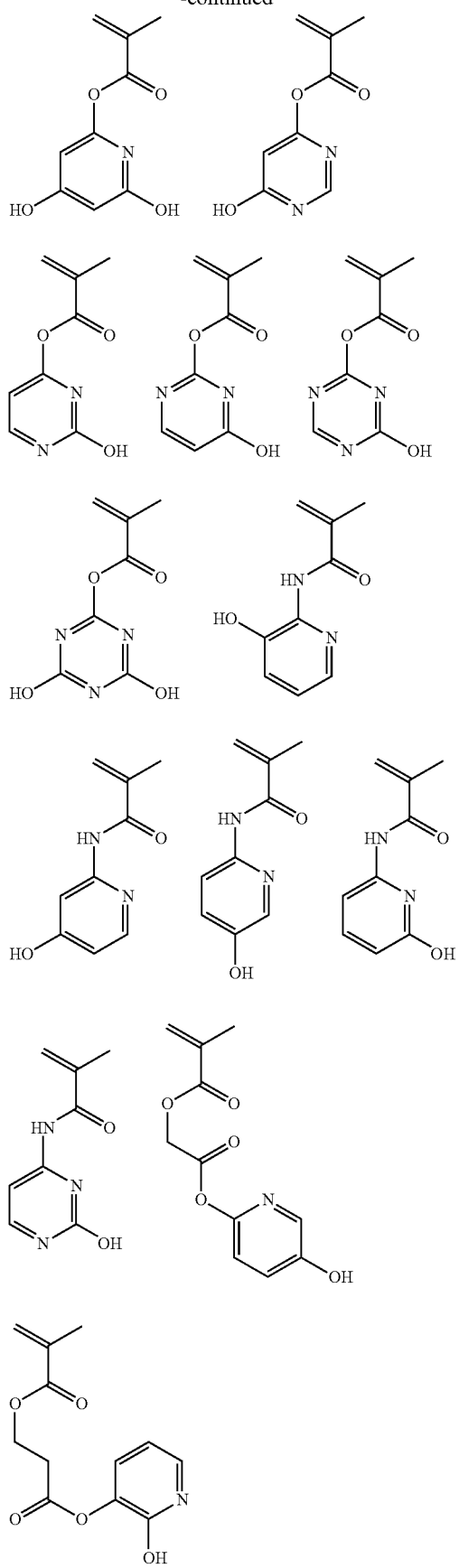
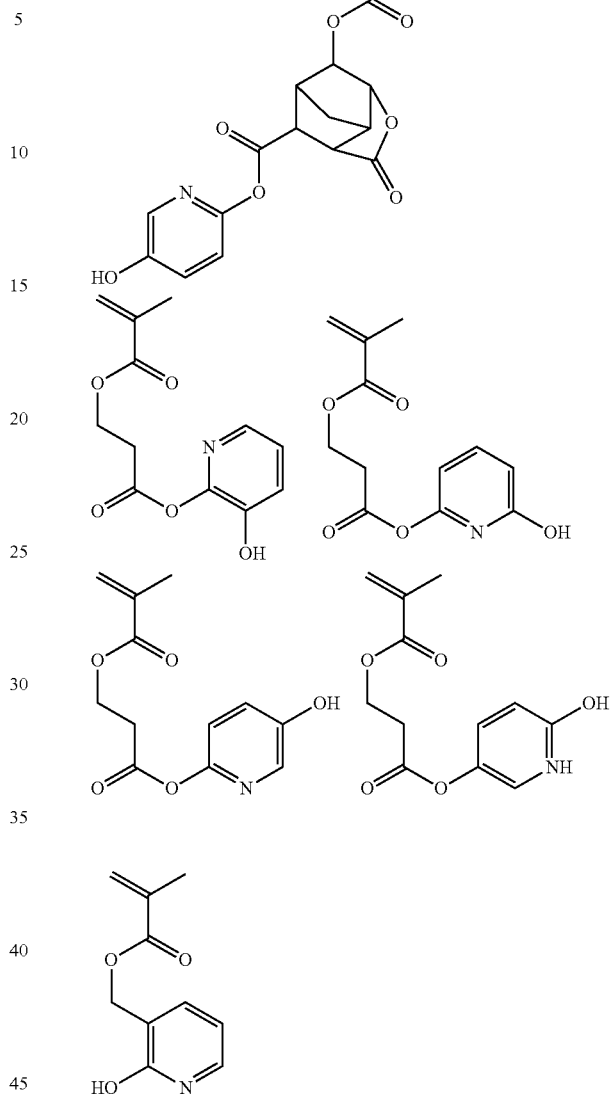
Examples of the monomers from which the recurring units (c) having an adhesive group such as hydroxyl (exclusive of phenolic hydroxyl), lactone ring, ether, ester, carbonyl, cyano, sulfonic acid ester, sulfonamide group, cyclic —O—C(=O)—S— or —O—C(=O)—NH— group are derived are given below.
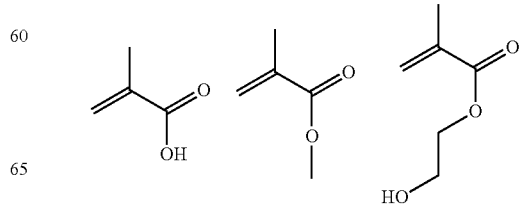

141
-continued
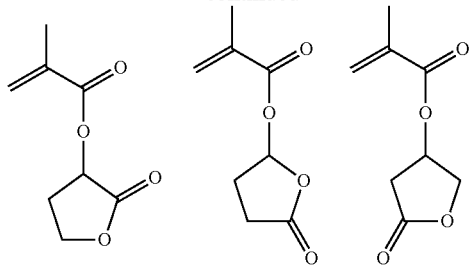
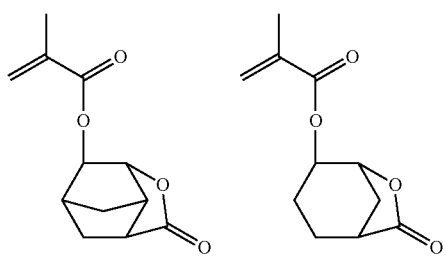
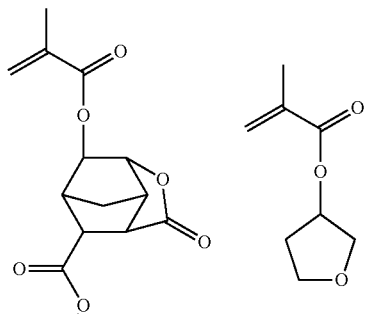
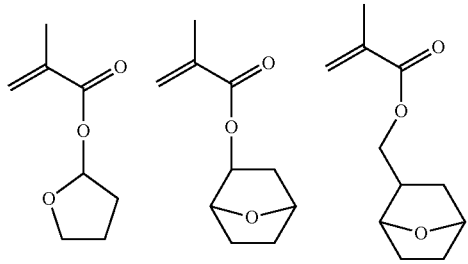
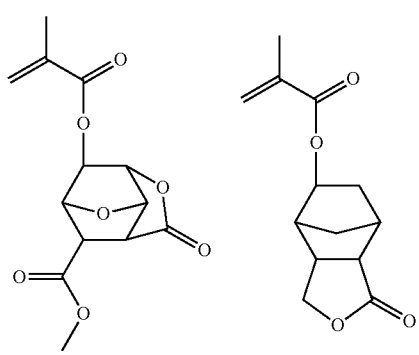
142
-continued
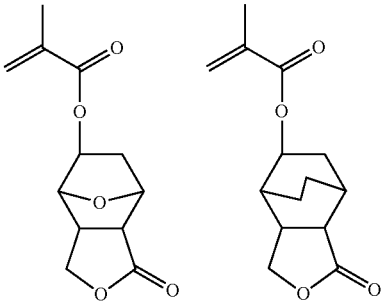
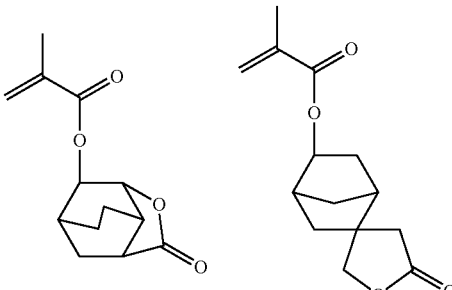
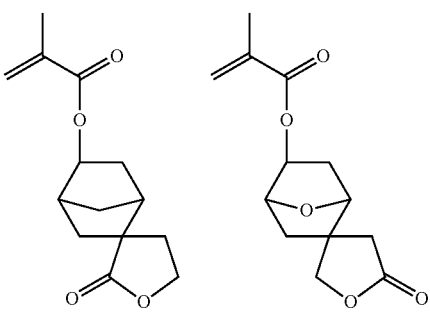
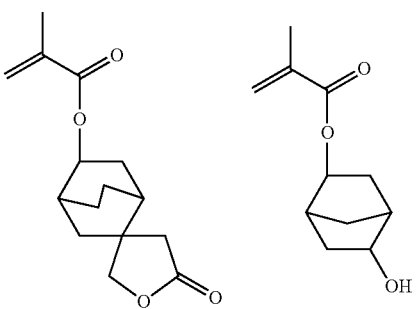
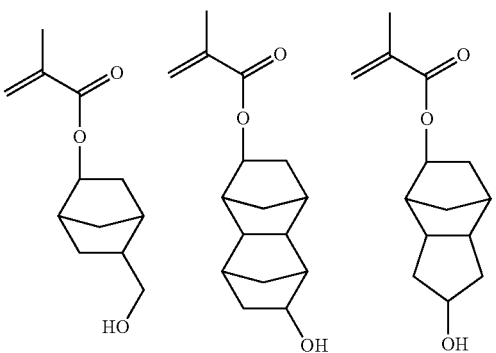

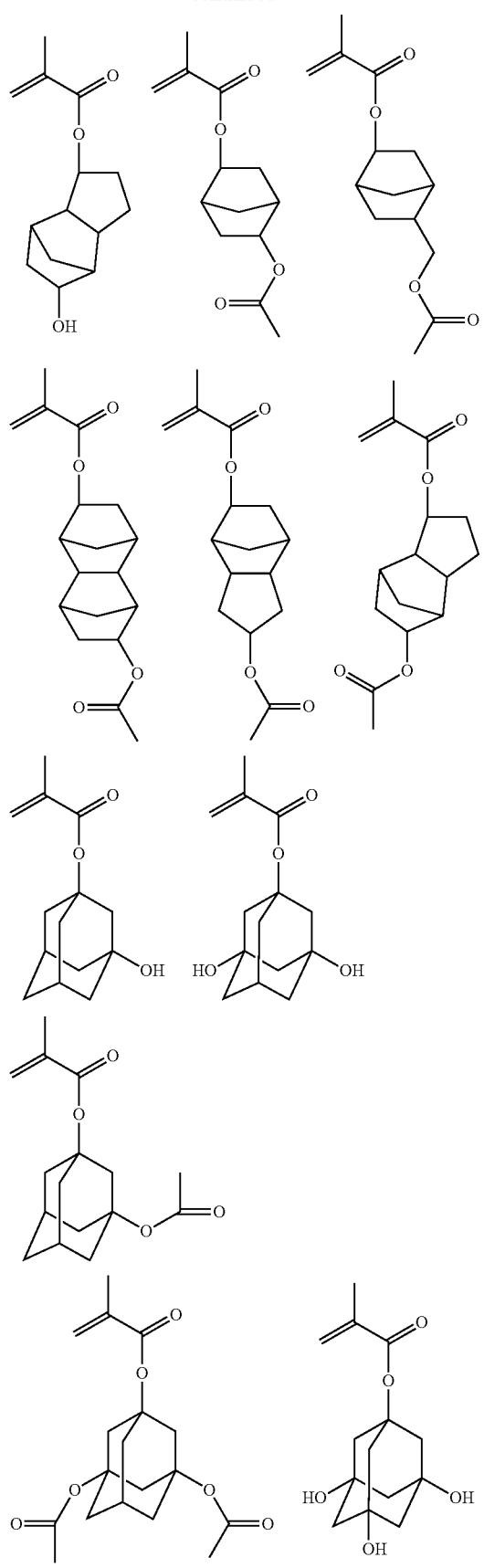
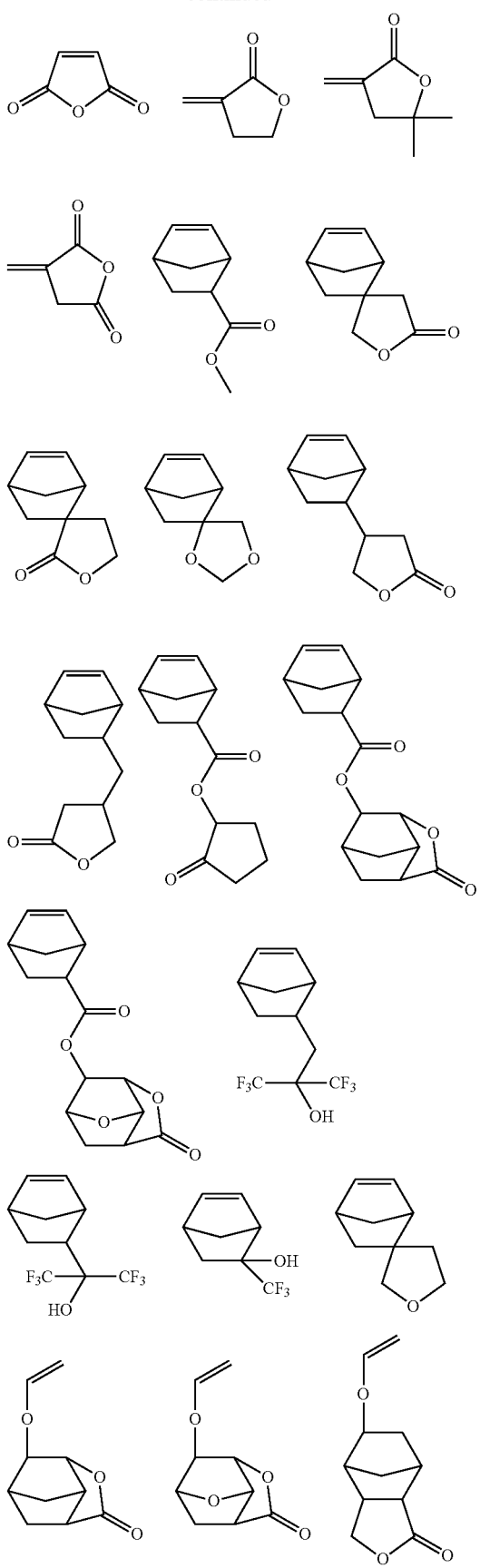

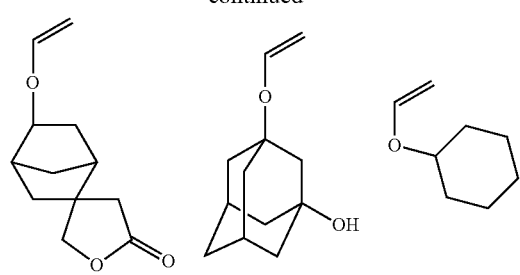
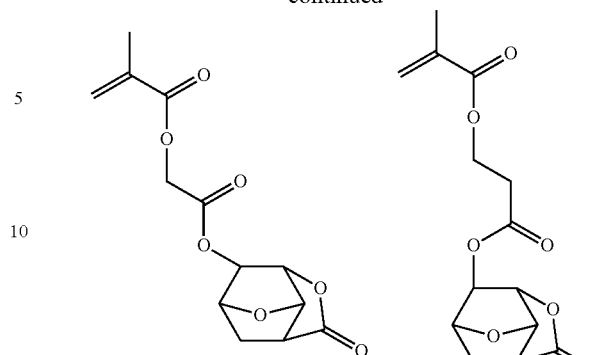
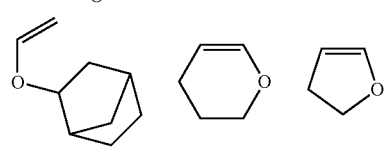
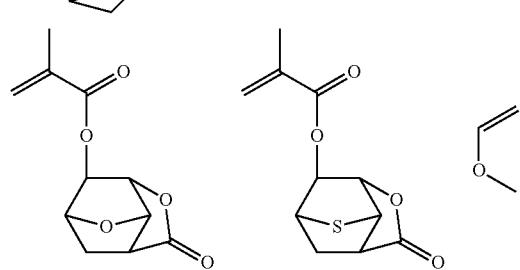
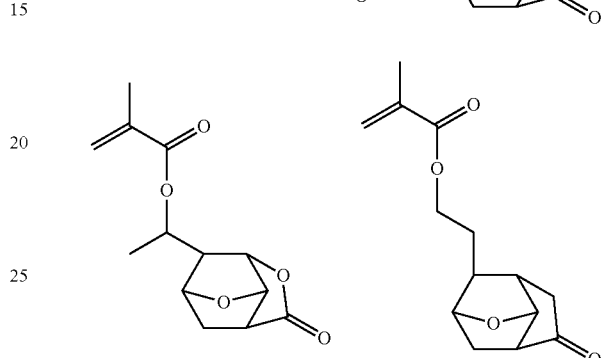
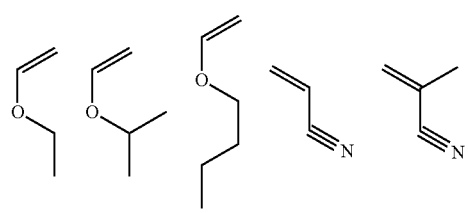
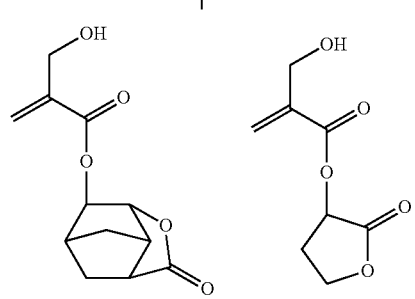
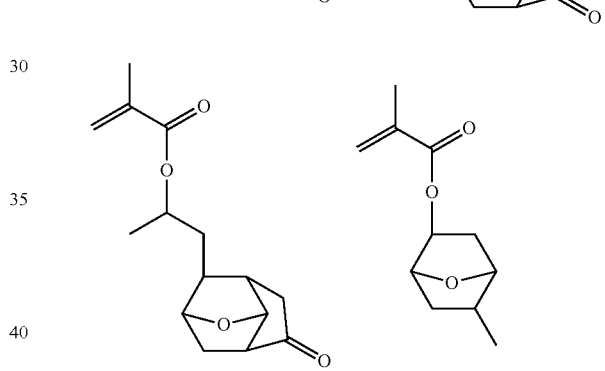
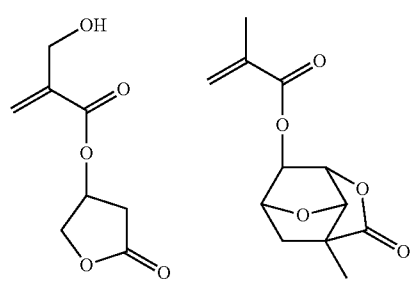
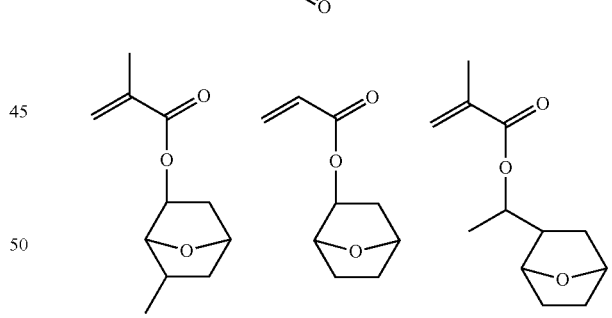
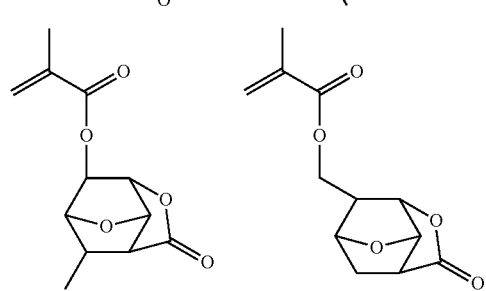
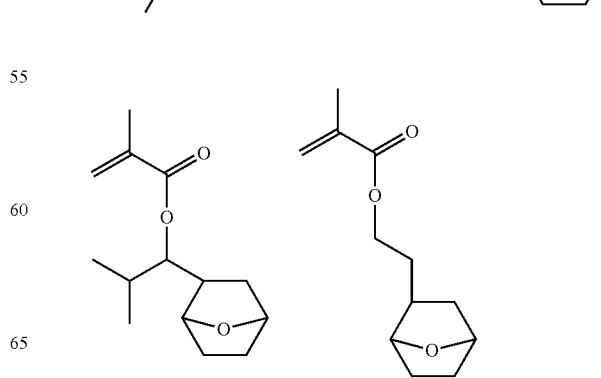

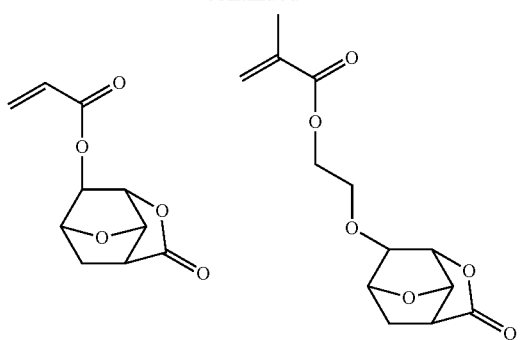
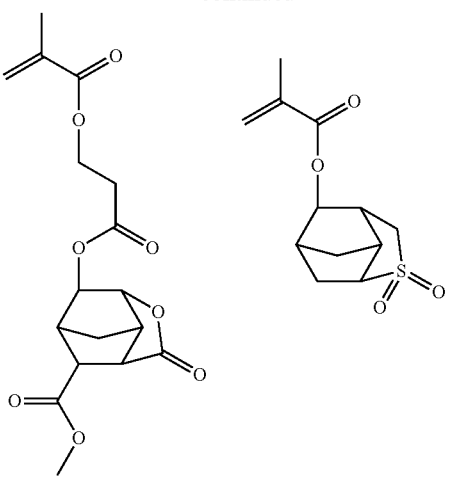
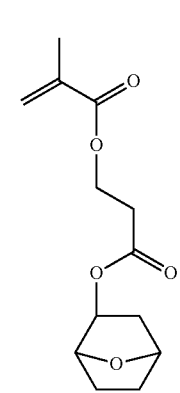
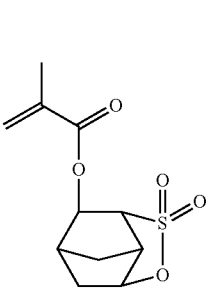
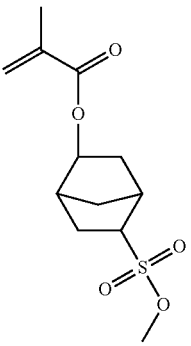
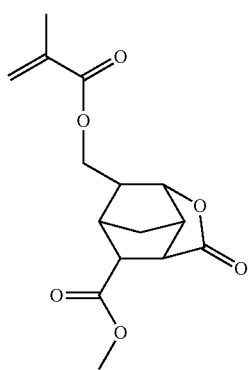
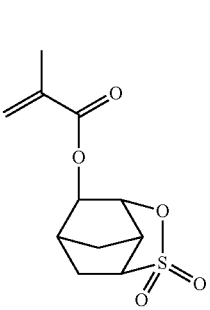
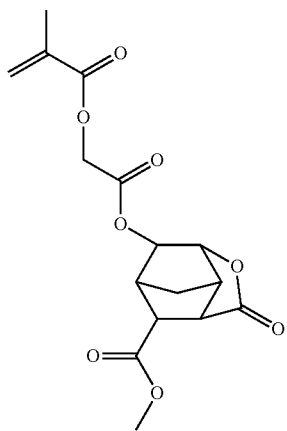 [SMILES: C=C(C)C(=O)OCC(=O)OC1C2CC3C1OC(=O)C3C2C(=O)OC]
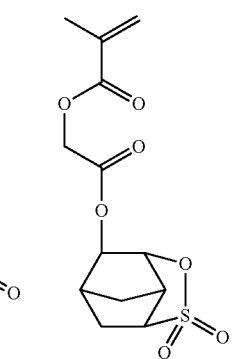

-continued
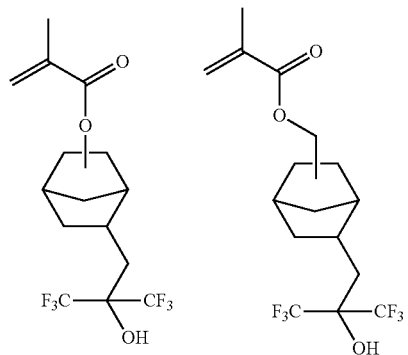
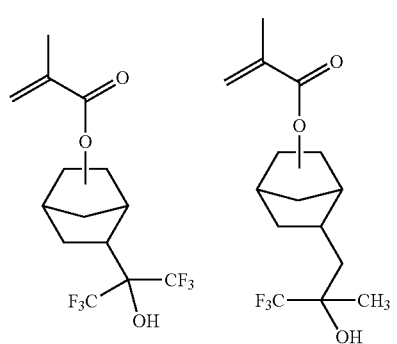
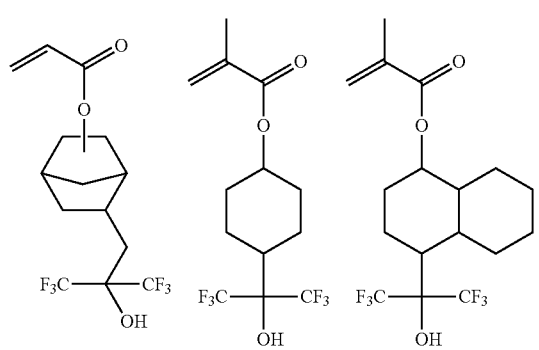
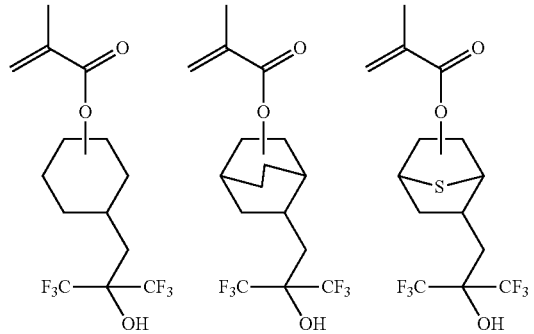
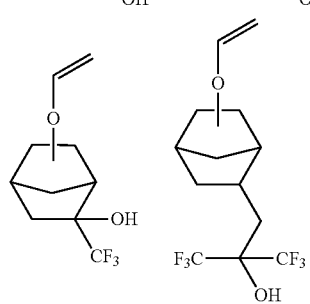
-continued
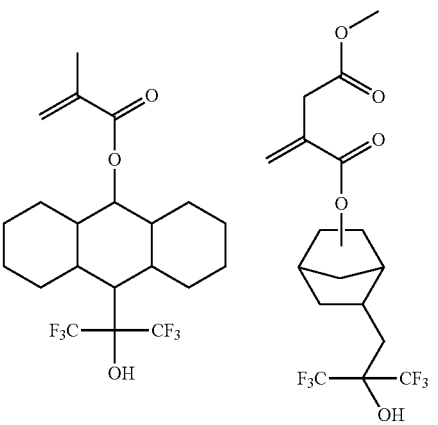
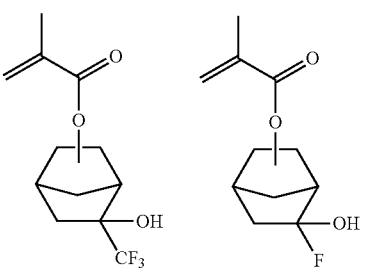
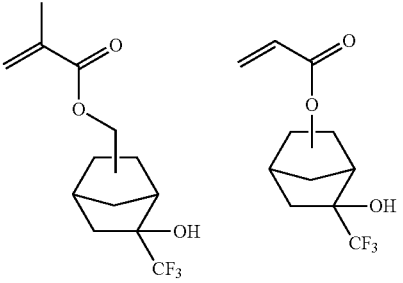
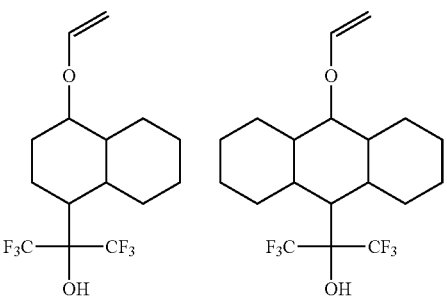
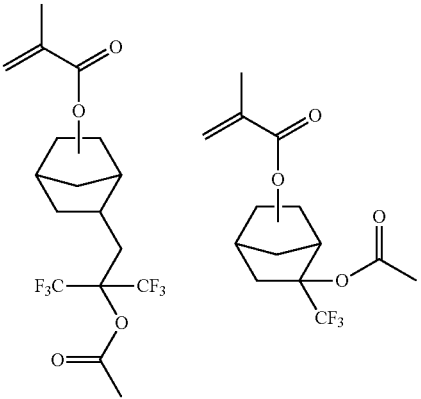

-continued
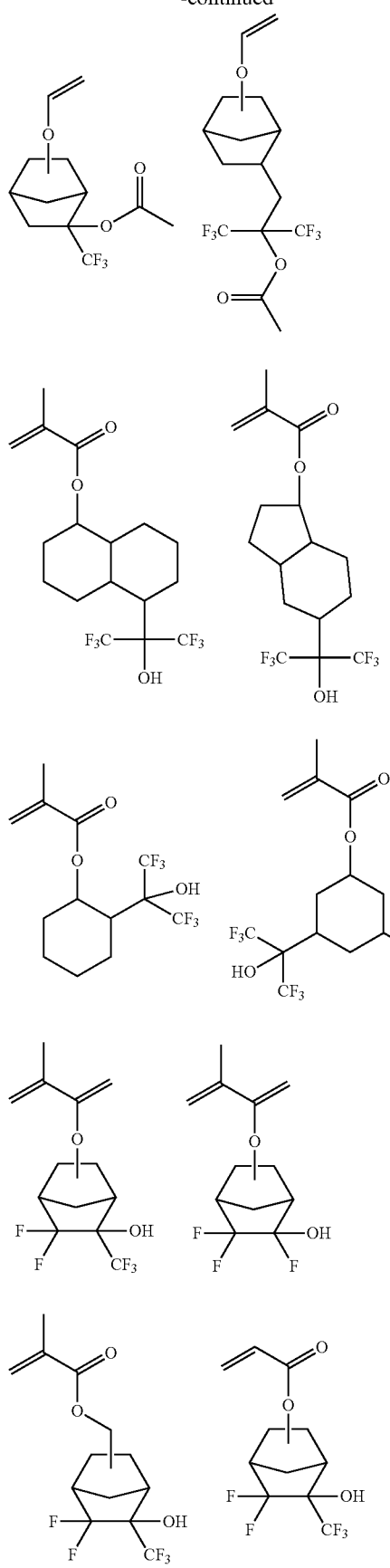
-continued
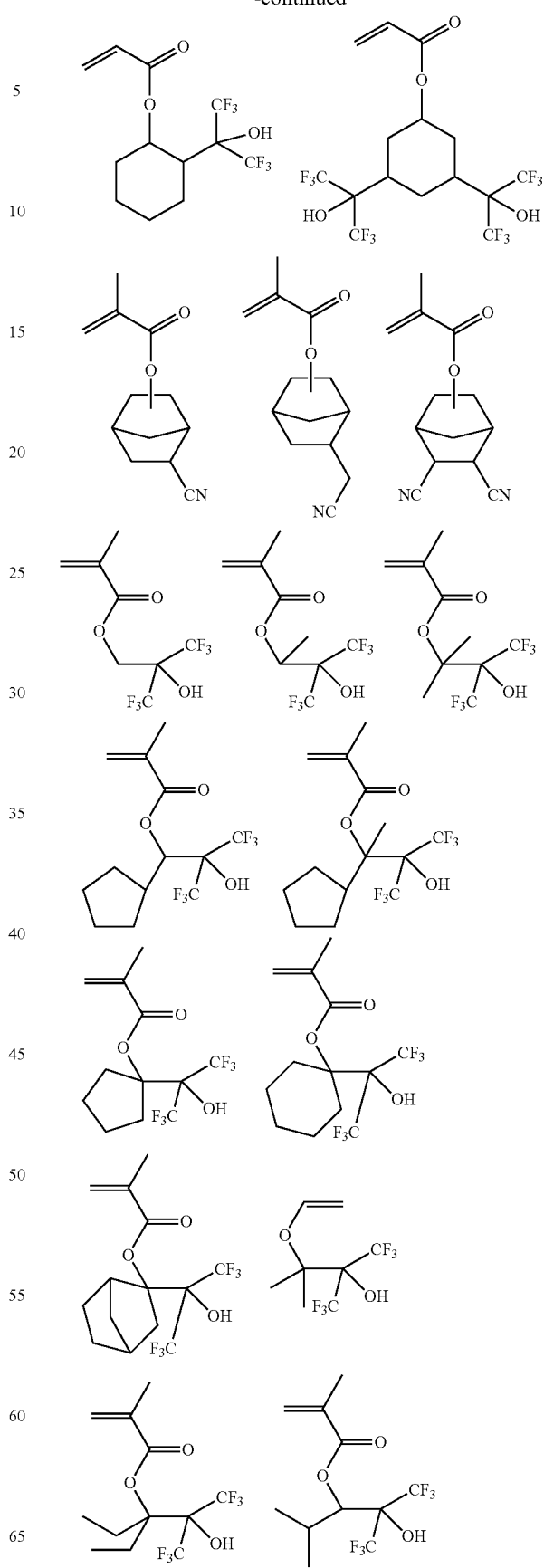

153
-continued
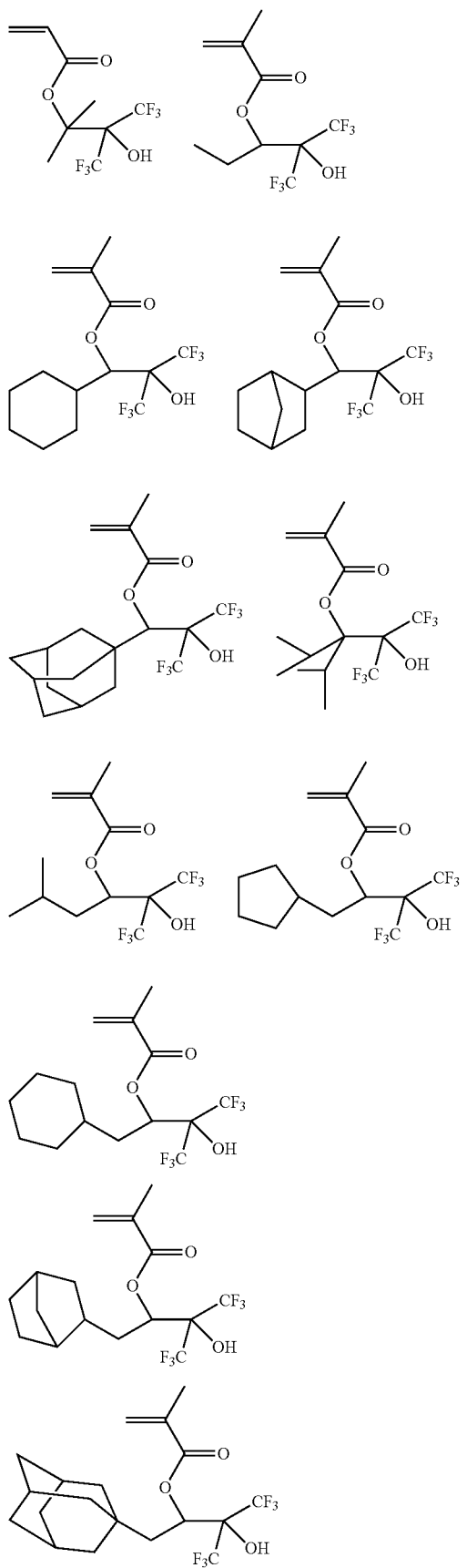
154
-continued
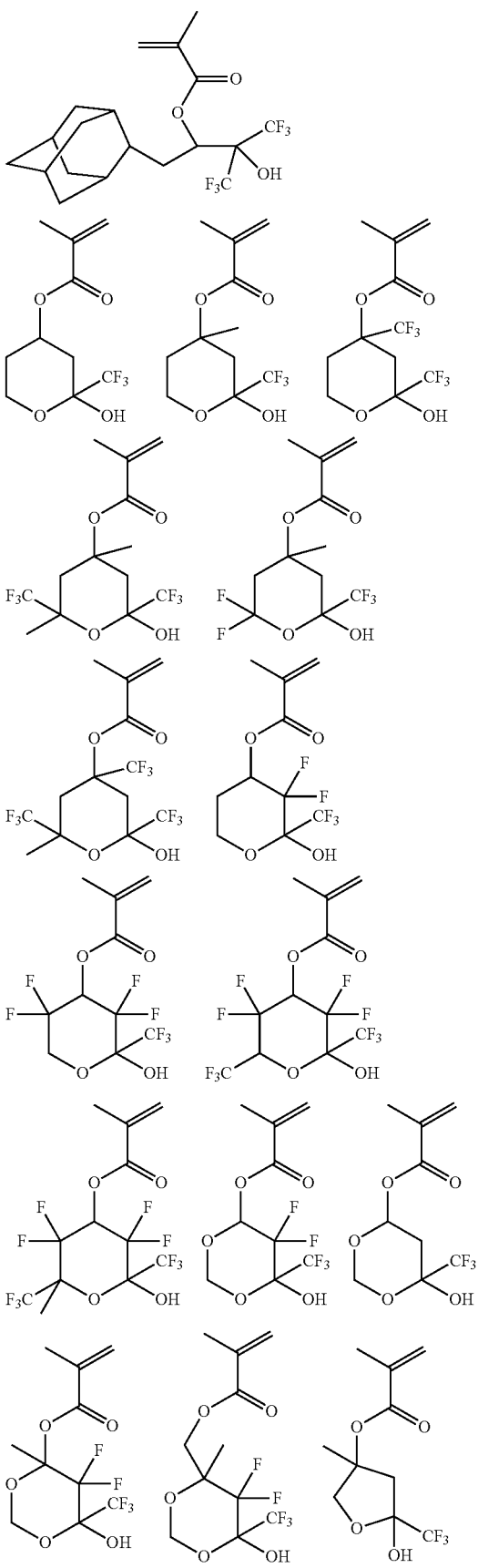

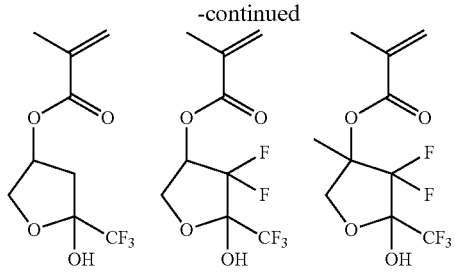
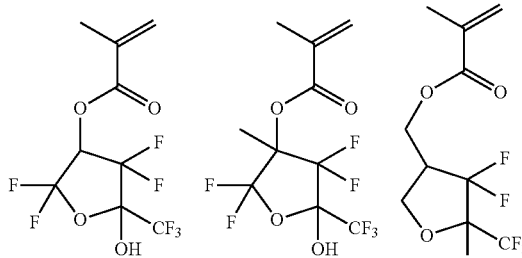
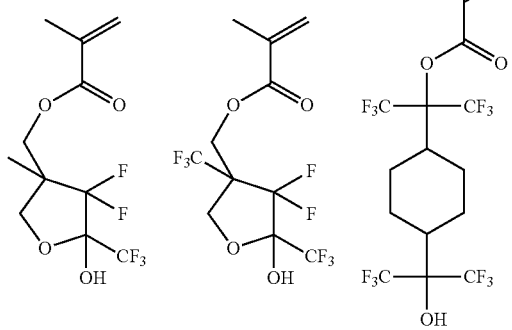
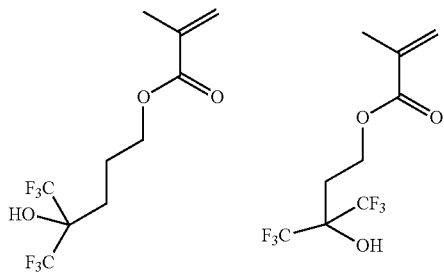
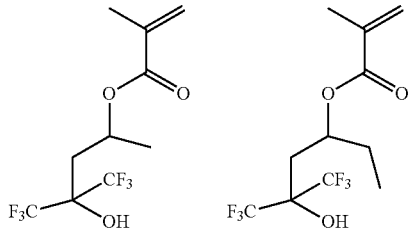
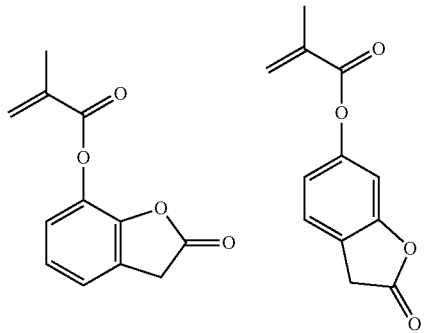
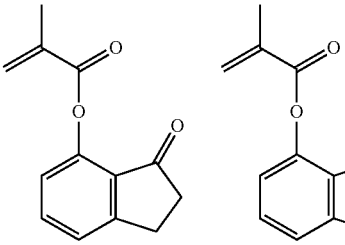
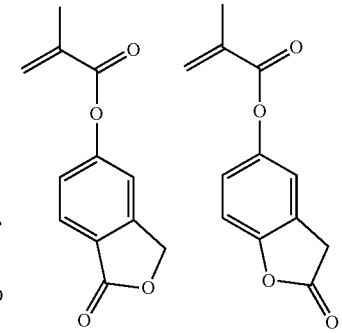
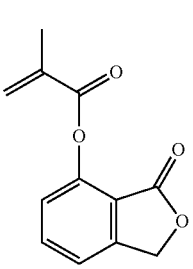
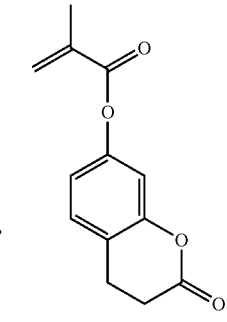
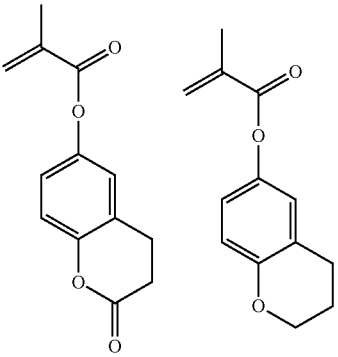

157
-continued
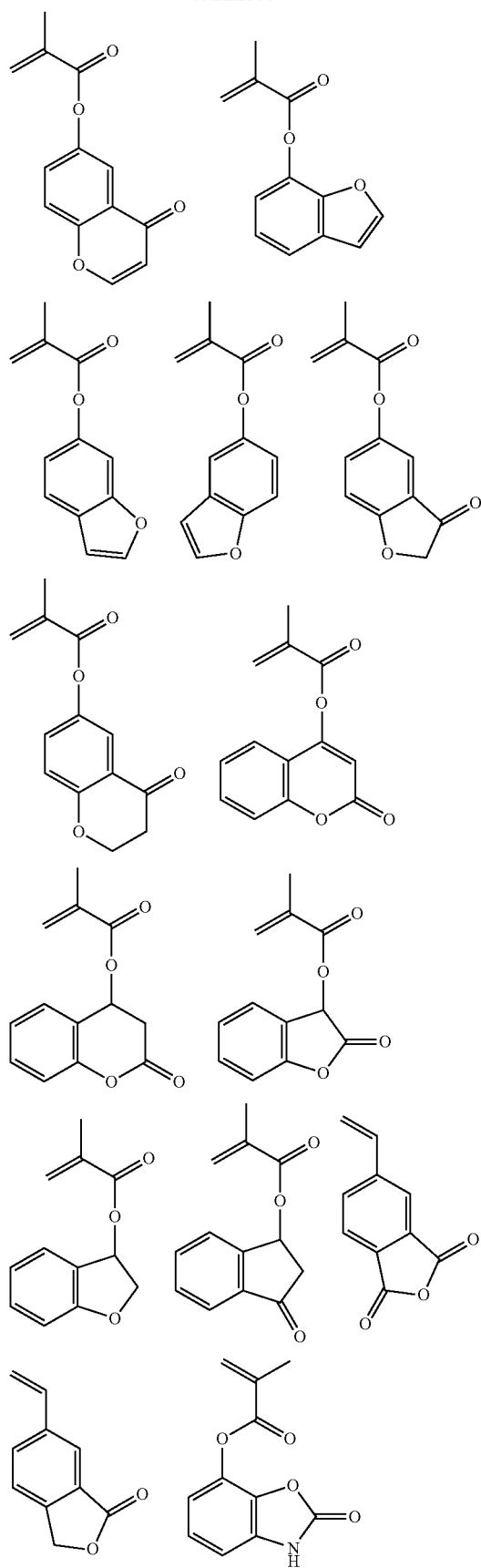
158
-continued
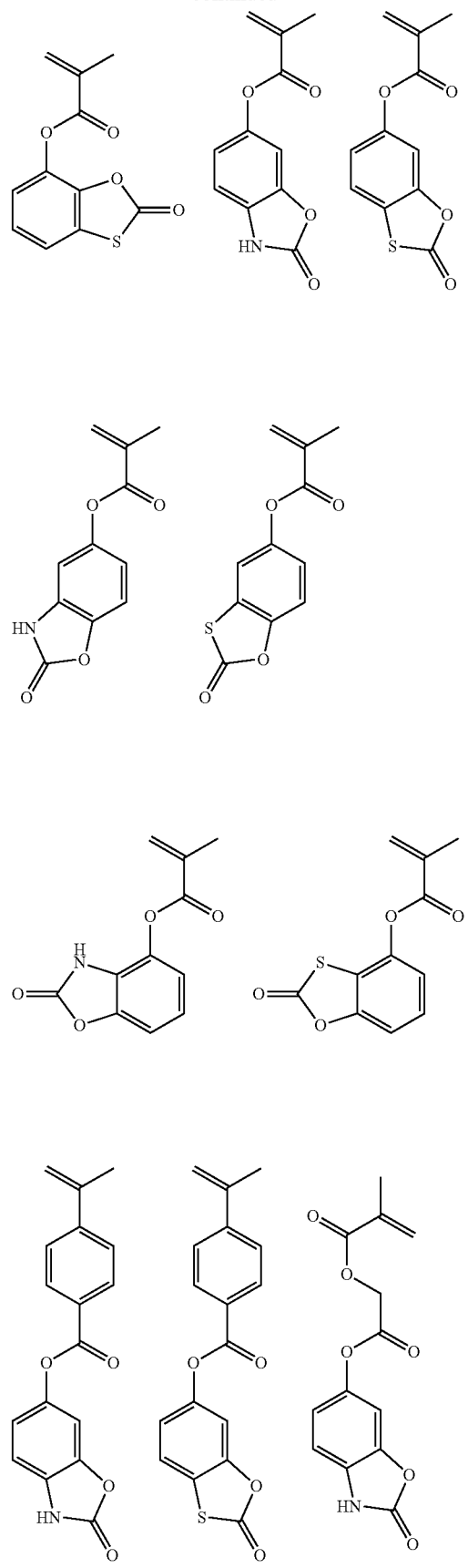

159
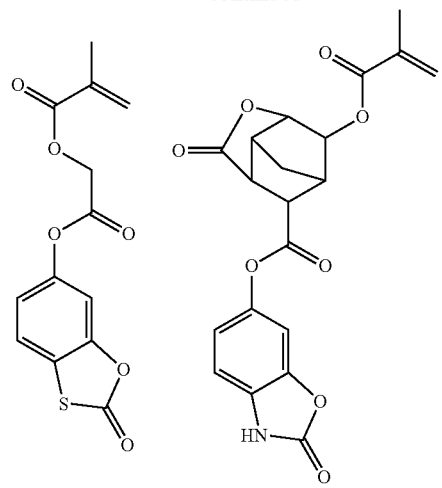
160
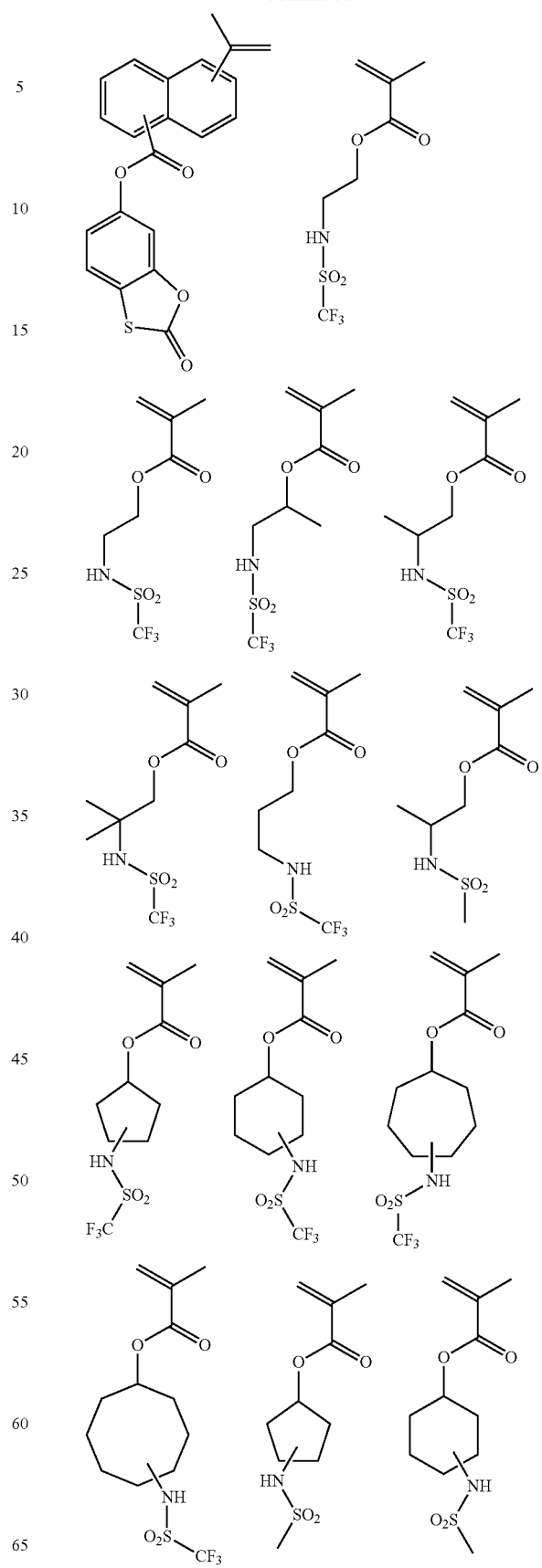

-continued

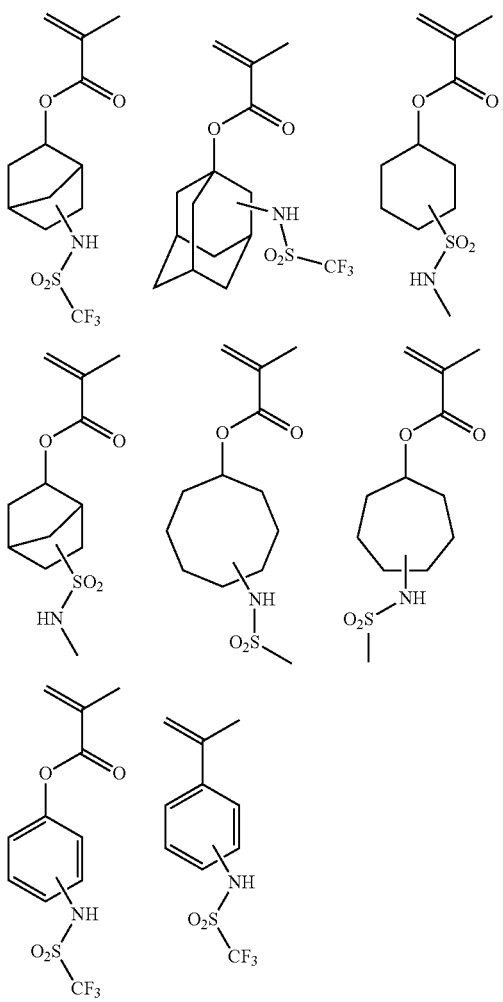

Where a monomer has a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

In a more preferred embodiment, the polymer serving as base resin has further copolymerized therein recurring units (d) selected from units (d1) to (d5) of indene, acenaphthylene, chromone, coumarin, and norbornadiene, or derivatives thereof, represented by the following formula (10).

(10)

-continued

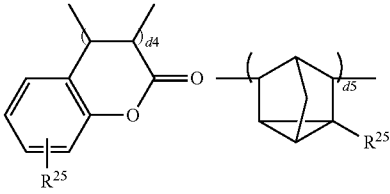

Herein $R^{25}$ is each independently hydrogen, a $C_1$-$C_{30}$ alkyl, haloalkyl, alkoxy, alkanoyl or alkoxycarbonyl group, $C_6$-$C_{10}$ aryl group, halogen, or 1,1,1,3,3,3-hexafluoro-2-propanol group, and $W^6$ is methylene, oxygen or sulfur. As used herein, the term "haloalkyl" refers to alkyl in which some or all hydrogen atoms are substituted by halogen.

Examples of suitable monomers from which recurring units (d1) to (d5) of indene, acenaphthylene, chromone, coumarin, and norbornadiene derivatives are derived are given below.

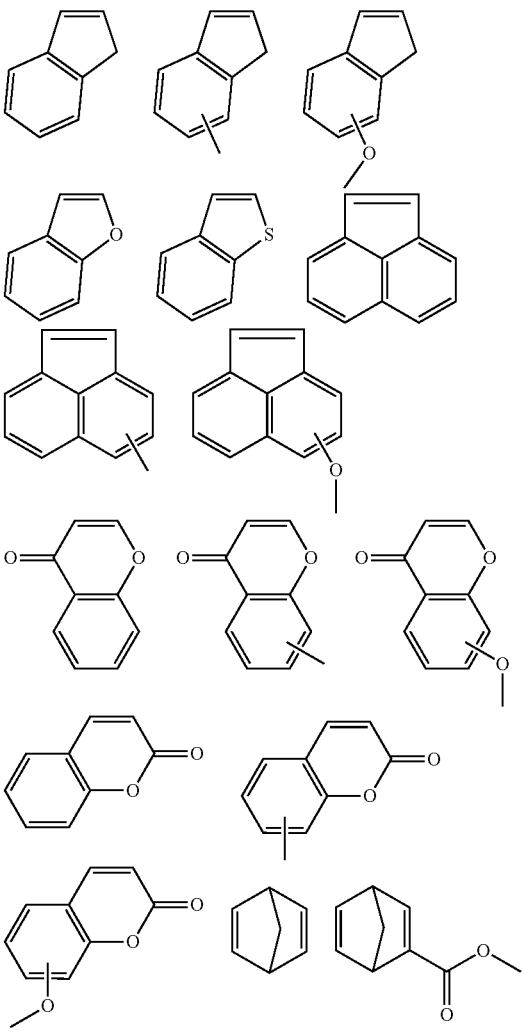

In a further embodiment, an acid generator (b) in the form of an onium salt having polymerizable olefin may be copolymerized with the foregoing monomers. JP-A H04-230645, JP-A 2005-084365, and JP-A 2006-045311 disclose sulfonium salts having polymerizable olefin capable of generating a specific sulfonic acid and similar iodonium salts. JP-A 2006-178317 discloses a sulfonium salt having sulfonic acid directly attached to the main chain.

In this embodiment, the polymer may have further copolymerized therein recurring units (b1) to (b3) having a sulfonium salt, represented by the following formula (4). Sometimes, units (b1) to (b3) are collectively referred to as units (b).

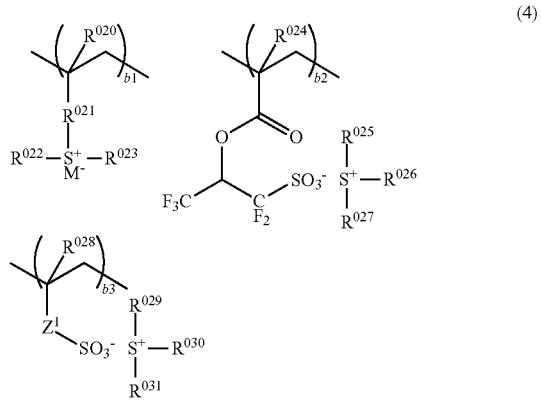

(4)

Herein $R^{020}$, $R^{024}$, and $R^{028}$ each are hydrogen or methyl. $R^{021}$ is a single bond, phenylene, —O—$R^{033}$—, or —C(=O)—Y—$R^{033}$—, wherein Y is oxygen or NH, and $R^{033}$ is a straight, branched or cyclic $C_1$-$C_6$ alkylene group, alkenylene or phenylene group, which may contain a carbonyl (—CO—), ester (—COO—), ether (—O—) or hydroxyl moiety. $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl, or thiophenyl group. $Z^1$ is a single bond, methylene, ethylene, phenylene, fluorinated phenylene, —O—$R^{032}$—, or —C(=O)—$Z^2$—$R^{032}$—. $Z^2$ is oxygen or NH. $R^{032}$ is a straight, branched or cyclic $C_1$-$C_6$ alkylene, alkenylene or phenylene group, which may contain a carbonyl, ester, ether or hydroxyl moiety. $M^-$ is a non-nucleophilic counter ion. Molar fractions b1, b2 and b3 are in the range of $0 \le b1 \le 0.3$, $0 \le b2 \le 0.3$, $0 \le b3 \le 0.3$, and $0 \le b1+b2+b3 \le 0.3$.

Examples of the non-nucleophilic counter ion represented by $M^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

The attachment of an acid generator to the polymer main chain is effective in restraining acid diffusion, thereby preventing a reduction of resolution due to blur by acid diffusion. Also edge roughness (LER or LWR) is improved since the acid generator is uniformly dispersed.

There have been described the additive polymer of formula (1) or (2) as polymeric additive for modifying the resist film surface and the acid labile group-containing polymer of formula (3) as base resin. These polymers may be synthesized by any desired methods, for example, by dissolving suitable monomers selected from the monomers to form recurring units (p), (q), (r) and (s), or recurring units (a) to (d) in an organic solvent, adding a radical polymerization initiator thereto, and effecting heat polymerization.

Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxyacenaphthalene is copolymerized, an alternative method is possible. Specifically, acetoxystyrene or acetoxyvinylnaphthalene is used instead of hydroxyacenaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the base polymer, recurring units (a) to (d) may be incorporated in the following molar fraction: $0 \le a1 \le 0.9$, $0 \le a2 \le 0.9$, $0 \le a1+a2 < 1.0$, preferably $0 \le a1 \le 0.8$, $0 \le a2 \le 0.8$, $0.1 \le a1+a2 \le 0.8$, and more preferably $0 \le a1 \le 0.7$, $0 \le a2 \le 0.7$, $0.2 \le a1+a2 \le 0.7$; $0 \le b1 \le 0.3$, $0 \le b2 \le 0.3$, $0 \le b3 \le 0.3$, and $0 \le b1+b2+b3 \le 0.3$, and when incorporated, $0 < b1+b2+b3 \le 0.3$; $0 \le c < 1.0$, preferably $0 < c \le 0.9$, and more preferably $0 < c \le 0.8$; $0 \le d \le 0.5$, preferably $0 \le d \le 0.4$, and more preferably $0 \le d \le 0.3$; provided that $a1+a2+b1+b2+b3+c+d=1.0$.

The meaning of $a+b+c=1$, for example, is that in a polymer comprising recurring units (a), (b), and (c), the sum of recurring units (a), (b), and (c) is 100 mol % based on the total amount of entire recurring units. The meaning of $a+b+c<1$ is that the sum of recurring units (a), (b), and (c) is less than 100 mol % based on the total amount of entire recurring units, indicating the inclusion of other recurring units.

The base polymer should preferably have a weight average molecular weight (Mw) in the range of 1,000 to 500,000, and more preferably 2,000 to 30,000, as measured by GPC versus polystyrene standards. With too low a Mw, the resist composition may become less heat resistant. A polymer with too high a Mw may lose alkaline solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component polymer should preferably have a narrow dispersity (Mw/Mn) of 1.0 to 2.0, especially 1.0 to 1.5, in order to provide a resist composition suitable for micropatterning to a small feature size.

For the base polymer, a mixture of two or more polymers which differ in compositional ratio, molecular weight or dispersity is acceptable.

The resist composition is based on a blend of an alkali-soluble polymer or additive polymer comprising recurring units (p) and preferably recurring units (q1) to (q4), optionally recurring units (r) and/or (s) which segregates on the resist film surface after coating and functions to suppress outgassing from the resist film, to prevent formation of bridge and blob defects, and to minimize LWR, and an acid labile group-containing polymer or base polymer comprising recurring units (a1), (a2), (b1), (b2), (b3), (c) and (d) which turns soluble in alkaline developer under the action of acid. Typically the additive polymer (i.e., surface segregating polymeric additive) is blended in an amount of 0.1 to 50 parts, preferably 0.2 to 30 parts, and more preferably 0.2 to 20 parts by weight per 100 parts by weight of the base polymer. Also typically, the surface segregating polymeric additive alone has an alkaline dissolution rate of 0.1 to 100,000 nm/s, preferably 1 to 50,000 nm/s, and more preferably 10 to 20,000 nm/s.

Resist Composition

The resist composition may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122] to [0142]). In the embodiment wherein a polymer having recurring units (b) copolymerized therein is used as the base resin, the PAG may be omitted.

The resist composition may further comprise an organic solvent, basic compound, dissolution regulator, surfactant, and acetylene alcohol, alone or in combination.

Examples of the organic solvent used herein are described in JP-A 2008-111103, paragraphs [0144] to [0145] (U.S. Pat. No. 7,537,880). Specifically, exemplary solvents include ketones such as cyclohexanone, cyclopentanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

Exemplary basic compounds are described in JP-A 2008-111103, paragraphs [0146] to [0164], for example, primary, secondary and tertiary amine compounds, specifically amine compounds having a hydroxyl, ether, ester, lactone, cyano or sulfonate group. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The resist composition, typically chemically amplified positive resist composition comprising an additive polymer, an acid labile group-containing polymer, an acid generator, and a basic compound in an organic solvent is used in the fabrication of various integrated circuits. Pattern formation using the resist composition may be performed by well-known lithography processes. The process generally involves coating, prebake, exposure, bake (PEB), and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 μm thick.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 $mJ/cm^2$, more preferably about 10 to 100 $mJ/cm^2$, or 0.1 to 100 $μC/cm^2$, more preferably 0.5 to 50 $μC/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed in a developer in the form of an aqueous alkaline solution for 3 seconds to 3 minutes, preferably 5 seconds to 2 minutes by conventional techniques such as dip, puddle or spray techniques. Suitable developers are 0.1 to 10 wt %, preferably 2 to 10 wt %, more preferably 2 to 8 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as t-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

Alternatively, a negative tone pattern may be formed by organic solvent development. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

EXAMPLE

Examples and Comparative Examples are given below for further illustrating the invention, but they should not be construed as limiting the invention thereto. Mw is a weight average molecular weight as measured by GPC versus polystyrene standards, and Mw/Mn designates molecular weight distribution or dispersity. All parts (pbw) are by weight.

Monomer Synthesis Example 1

Synthesis of Monomer 1

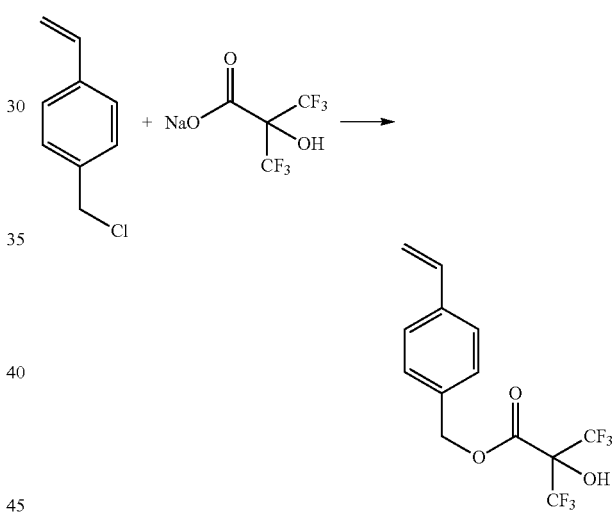

Monomer 1

In 300 g of acetonitrile were dissolved 56.7 g of p-(chloromethyl)styrene, 100 g of sodium 3,3,3-trifluoro-2-hydroxy-2-trifluoromethylpropionate, and 2.8 g of sodium iodide. The contents were stirred for one day at an internal temperature of 40-50° C. To the reaction solution, 200 g of 5 wt % hydrochloric acid was added to quench the reaction, followed by standard aqueous workup. The solvent was distilled off. The product was purified by distillation, obtaining 103.6 g (yield 85%) of Monomer 1.

boiling point: 52-53° C./12 Pa

IR (D-ATR): $\nu$=3465, 3093, 3012, 1757, 1515, 1455, 1410, 1379, 1319, 1262, 1238, 1223, 1161, 1015, 979, 916 cm$^{-1}$ $^1$H-NMR (600 MHz in DMSO-$d_6$):

$\delta$=9.23 (1H, s), 7.50 (2H, d), 7.36 (2H, d), 6.73 (1H, dd), 5.86 (1H, d), 5.40 (2H, s), 5.28 (1H, d) ppm $^{19}$F-NMR (565 MHz in DMSO-$d_6$):

$\delta$=−73.64 (6F, s) ppm

Monomer Synthesis Example 2

Synthesis of Monomer 2

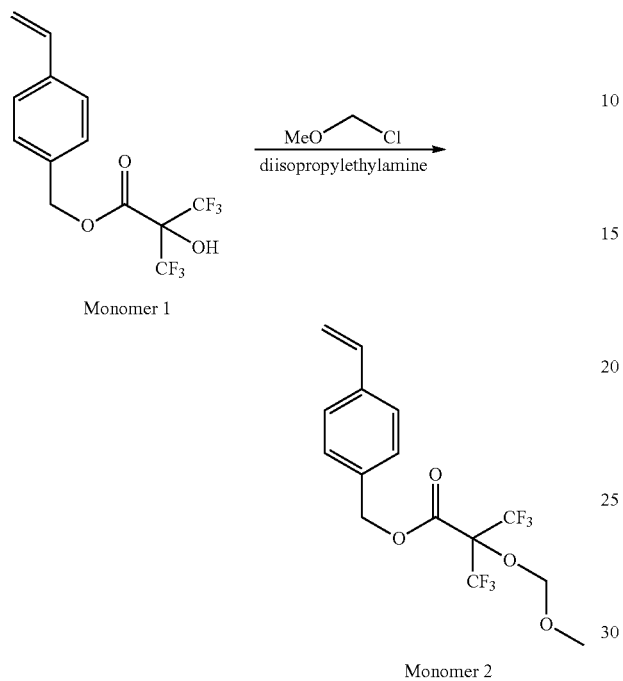

Below 20° C., 9.7 g of chloromethyl methyl ether was added dropwise to a mixture of 32.8 g of Monomer 1, 16.2 g of diisopropylethylamine, and 110 g of acetonitrile. The contents were stirred for 3 hours at the temperature. After standard aqueous workup and solvent distill-off, the product was purified by distillation, obtaining 33.9 g (yield 91%) of Monomer 2.

Monomer Synthesis Example 3

Synthesis of Monomer 3

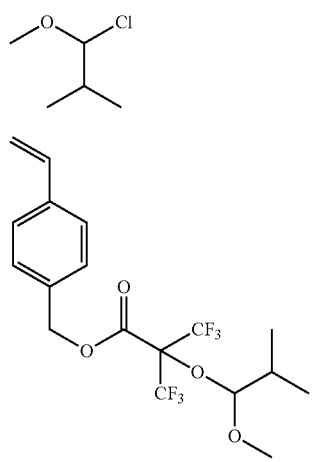

Monomer 3 was synthesized by the same procedure as in Monomer Synthesis Example 2 except that Protecting agent 1 was used instead of methoxymethyl chloride. Yield 93%.

Monomer Synthesis Example 4

Synthesis of Monomer 4

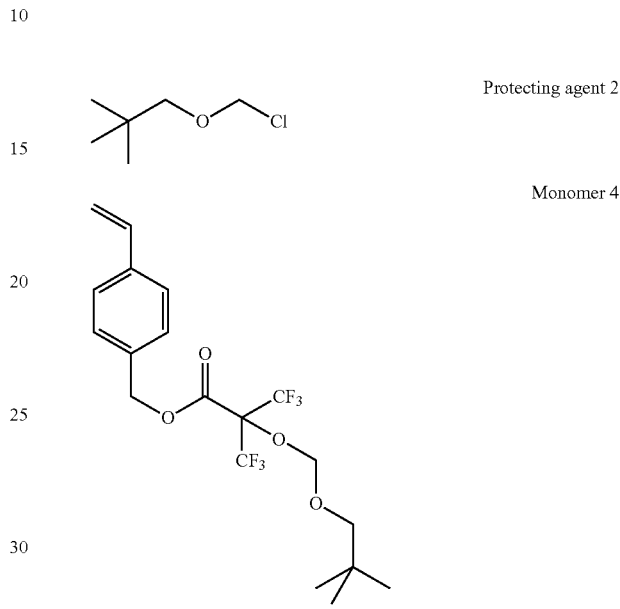

Monomer 4 was synthesized by the same procedure as in Monomer Synthesis Example 2 except that Protecting agent 2 was used instead of methoxymethyl chloride. Yield 88%.

Monomer Synthesis Example 5

Synthesis of Monomer 5

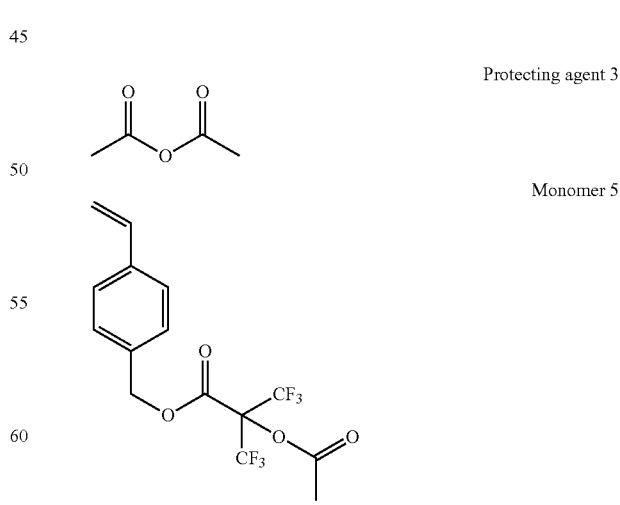

Monomer 5 was synthesized by the same procedure as in Monomer Synthesis Example 2 except that Protecting agent 3 was used instead of methoxymethyl chloride. Yield 92%.

Monomer Synthesis Example 6

Synthesis of Monomer 6

Protecting agent 4

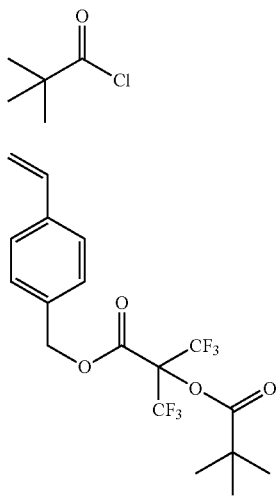

Monomer 6

Monomer 6 was synthesized by the same procedure as in Monomer Synthesis Example 2 except that Protecting agent 4 was used instead of methoxymethyl chloride. Yield 86%.

Monomer Synthesis Example 7

Synthesis of Monomer 7

Protecting agent 5

Monomer 7

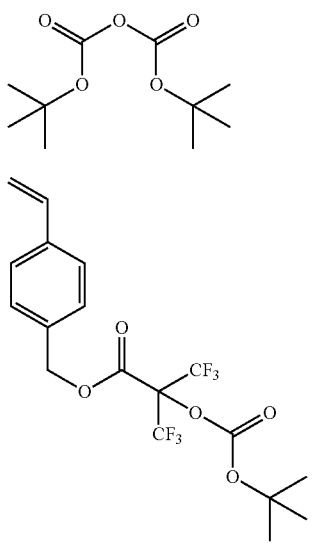

Monomer 7 was synthesized by the same procedure as in Monomer Synthesis Example 2 except that Protecting agent 5 was used instead of methoxymethyl chloride. Yield 81%.

Monomer Synthesis Example 8

Synthesis of Monomer 8

Protecting agent 6

Monomer 8

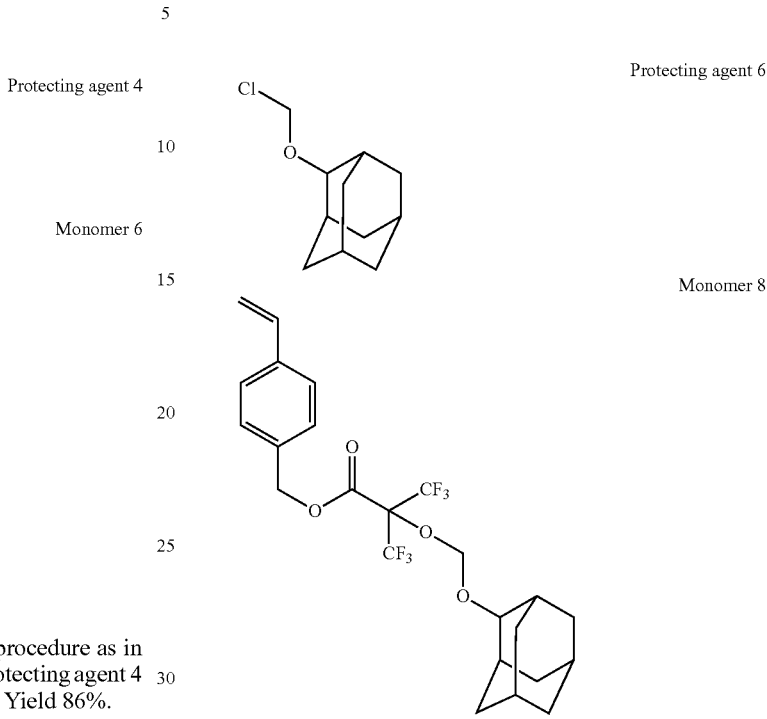

Monomer 8 was synthesized by the same procedure as in Monomer Synthesis Example 2 except that Protecting agent 6 was used instead of methoxymethyl chloride. Yield 84%.

Monomer Synthesis Example 9

Synthesis of Monomer 9

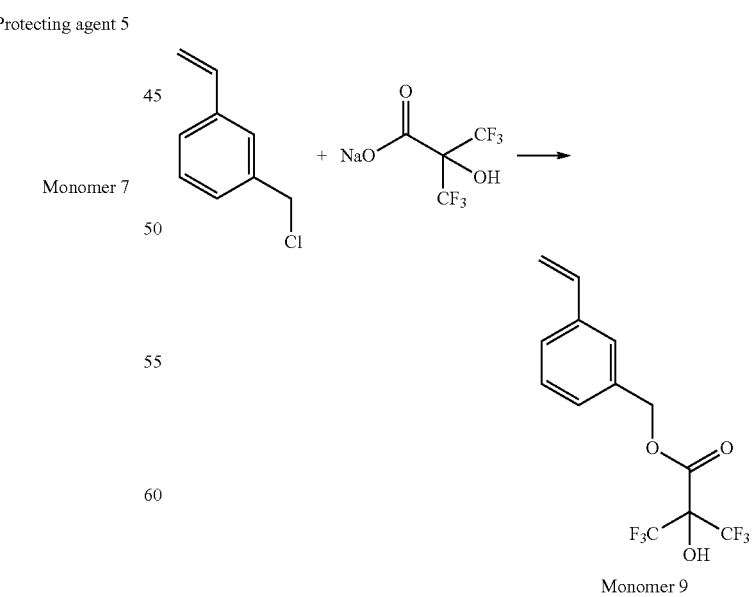

Monomer 9

Monomer 9 was synthesized by the same procedure as in Monomer Synthesis Example 1 except that a mixture of m-(chloromethyl)styrene and p-(chloromethyl)styrene was used instead of p-(chloromethyl)styrene. Yield 84%.

The product obtained at the end of purification was an isomer mixture consisting of major isomer (above formula) and minor isomer in a ratio of 61 mol %:39 mol %.

boiling point: 52-53° C./12 Pa

IR (D-ATR): ν=3463, 3093, 3013, 1757, 1632, 1515, 1455, 1378, 1321, 1262, 1238, 1223, 1162, 1017, 979, 916 cm$^{-1}$ $^1$H-NMR (600 MHz in DMSO-d$_6$, only major isomer):
δ=9.25 (1H, s), 7.48 (2H, dd), 7.37 (1H, dd), 7.28 (1H, d), 6.73 (1H, dd), 5.83 (1H, d), 5.42 (2H, s), 5.29 (1H, d) ppm $^{19}$F-NMR (565 MHz in DMSO-d$_6$, only major isomer):
δ=−73.65 (6F, s) ppm Monomer Synthesis Example 10

Synthesis of Monomer 10

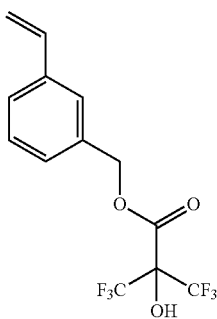

Monomer 9

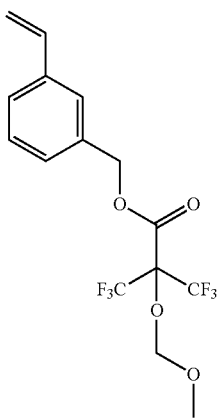

Monomer 10

Monomer 10 was synthesized by the same procedure as in Monomer Synthesis Example 2 except that Monomer 9 was used instead of Monomer 1. Yield 90%.

Preparation of Additive Polymers

Additive polymers (Polymers 1 To 12) to be added to resist compositions were prepared by combining suitable monomers, effecting copolymerization reaction in methyl ethyl ketone solvent, pouring into hexane for crystallization, repeatedly washing with hexane, isolation, and drying. The polymers were analyzed by $^1$H-NMR to determine their composition and by GPC to determine Mw and dispersity Mw/Mn.

Synthesis Example 1

A 2-L flask was charged with 32.8 g of Monomer 1 and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of azobisisobutyronitrile (AIBN) was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)
Monomer 1=1.0 (indicative of homopolymer)
Mw=8,100
Mw/Mn=1.85
This is designated Polymer 1.

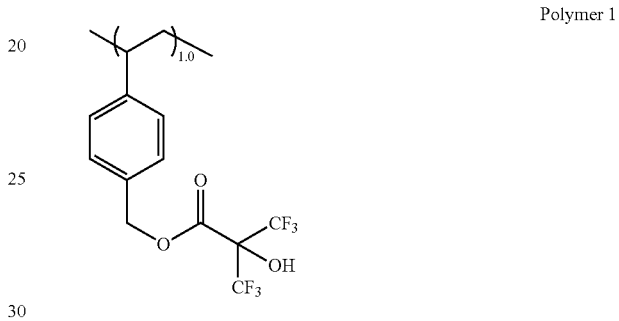

Polymer 1

Synthesis Example 2

A 2-L flask was charged with 16.4 g of Monomer 1, 5.2 g of styrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)
Monomer 1:styrene=0.5:0.5
Mw=9,900
Mw/Mn=1.98
This is designated Polymer 2.

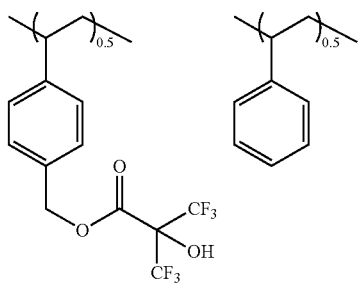

Polymer 2

Synthesis Example 3

A 2-L flask was charged with 16.4 g of Monomer 1, 4.2 g of styrene, 2.7 g of trans-stilbene and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)
  Monomer 1:styrene:trans-stilbene=0.5:0.4:0.1
Mw=7,200
Mw/Mn=1.98
  This is designated Polymer 3.

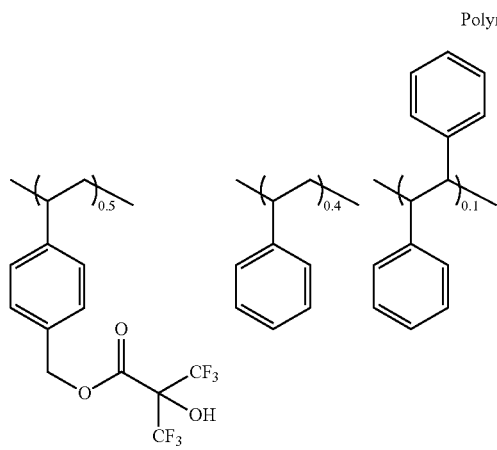

Polymer 3

Synthesis Example 4

A 2-L flask was charged with 16.4 g of Monomer 1, 18.5 g of Monomer 5, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)
  Monomer 1:Monomer 5=0.5:0.5
Mw=8,600
Mw/Mn=1.88

This is designated Polymer 4.

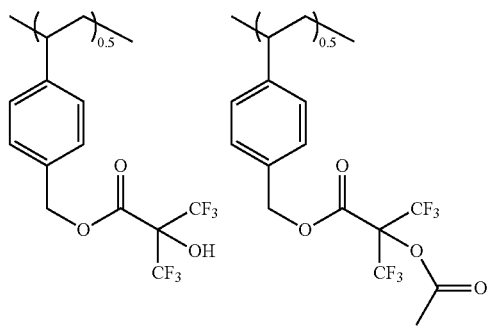

Polymer 4

Synthesis Example 5

A 2-L flask was charged with 22.3 g of Monomer 10, 6.2 g of 2-vinylnaphthalene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)
  Monomer 10:2-vinylnaphthalene=0.6:0.4
Mw=6,100
Mw/Mn=1.64
  This is designated Polymer 5.

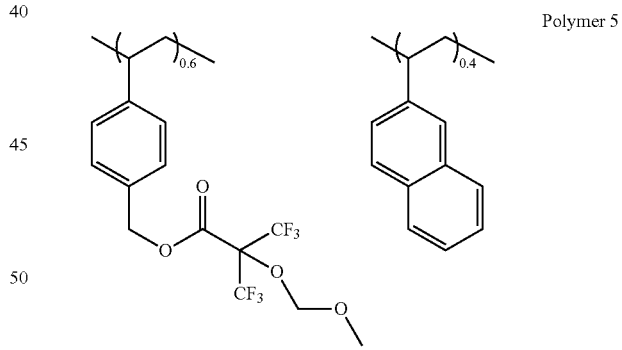

Polymer 5

Synthesis Example 6

A 2-L flask was charged with 19.7 g of Monomer 1, 6.1 g of acenaphthalene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)

Monomer 1:acenaphthalene=0.6:0.4

Mw=6,100

Mw/Mn=1.84

This is designated Polymer 6.

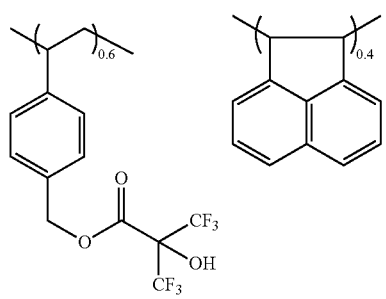

Polymer 6

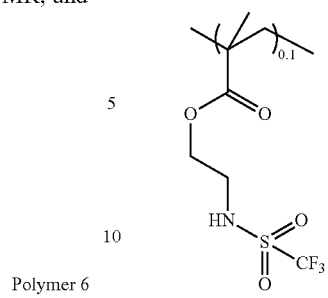

Synthesis Example 7

A 2-L flask was charged with 16.4 g of Monomer 1, 6.1 g of acenaphthalene, 2.6 g of 2-trifluoromethylsulfonamide-ethyl methacrylate, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)

Monomer 1:acenaphthylene:trifluoromethylsulfonamide-ethyl methacrylate=0.5:0.4:0.1

Mw=6,500

Mw/Mn=1.81

This is designated Polymer 7.

Polymer 7

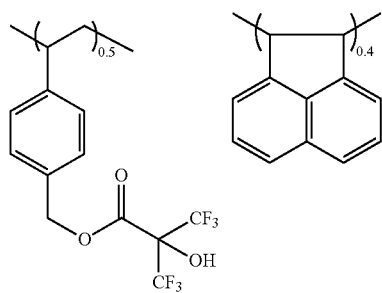

Synthesis Example 8

A 2-L flask was charged with 16.4 g of Monomer 1, 6.1 g of acenaphthalene, 1.5 g of 4-styrenecarboxylic acid and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)

Monomer 1:acenaphthalene:4-styrenecarboxylic acid=0.5:0.4:0.1

Mw=6,100

Mw/Mn=1.69

This is designated Polymer 8.

Polymer 8

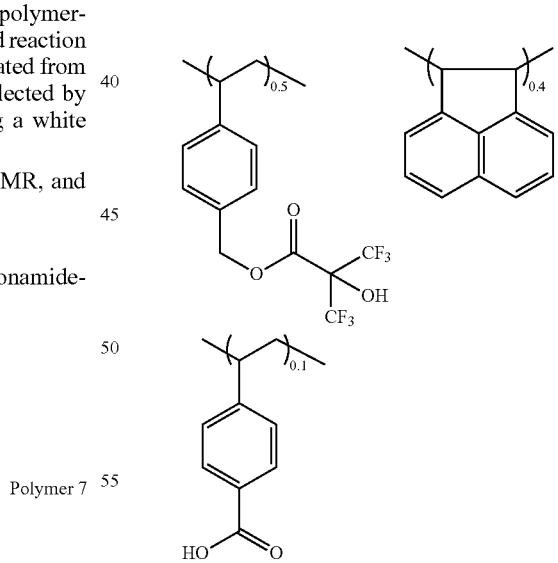

Synthesis Example 9

A 2-L flask was charged with 9.8 g of Monomer 9, 2.9 g of indene, 13.5 g of 4-(1,1,1,3,3,3-hexafluoro-2-propanol)-styrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)
  Monomer 9:indene:4-(1,1,1,3,3,3,3-hexafluoro-2-propanol)styrene=0.3:0.2:0.5
Mw=6,700
Mw/Mn=1.61

This is designated Polymer 9.

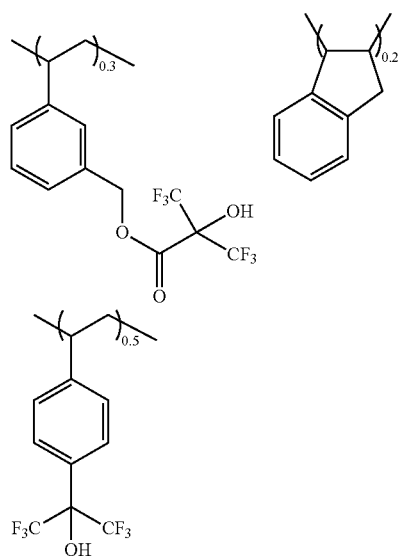

Polymer 9

Synthesis Example 10

A 2-L flask was charged with 16.4 g of Monomer 1, 4.6 g of acenaphthalene, 5.8 g of Monomer 11, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer Composition (Molar Ratio)
  Monomer 1:acenaphthalene:Monomer 11=0.5:0.3:0.2
Mw=7,100
Mw/Mn=1.69

This is designated Polymer 10.

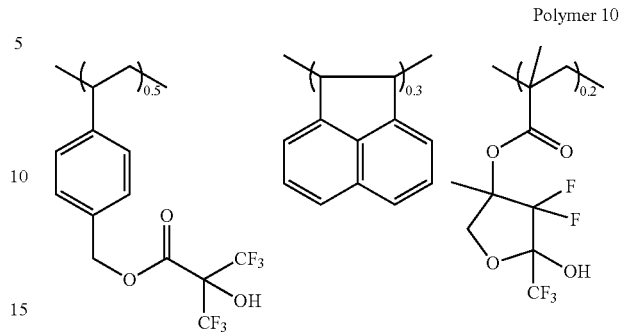

Polymer 10

Monomer 11

Synthesis Example 11

A 2-L flask was charged with 8.1 g of 3-ethyl-3-exo-tetracyclo[4.4.0.1$^{2,5}$.1$^{7,10}$]dodecanyl methacrylate, 16.4 g of Monomer 1, 3.0 g of acenaphthalene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^1$H-NMR, and GPC, with the analytical data shown below.

Copolymer composition (molar ratio)
  3-ethyl-3-exo-tetracyclo[4.4.0.1$^{2,5}$.1$^{7,10}$]dodecanyl methacrylate:Monomer 1:acenaphthalene=0.3:0.5:0.2
Mw=7,900
Mw/Mn=1.88

This is designated Polymer 11.

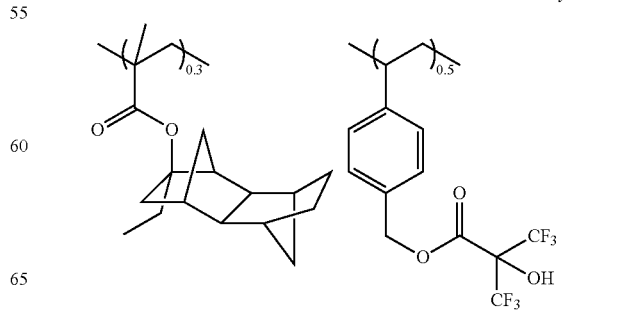

Polymer 11

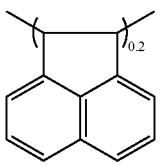

Synthesis Example 12

A 2-L flask was charged with 6.7 g of Monomer 12 (shown below), 16.4 g of Monomer 1, 3.0 g of acenaphthalene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^{1}$H-NMR, and GPC, with the analytical data shown below.

Copolymer Composition (Molar Ratio)
Monomer 12:Monomer 1:acenaphthylene=0.3:0.5:0.2
Mw=7,100
Mw/Mn=1.81

This is designated Polymer 12.

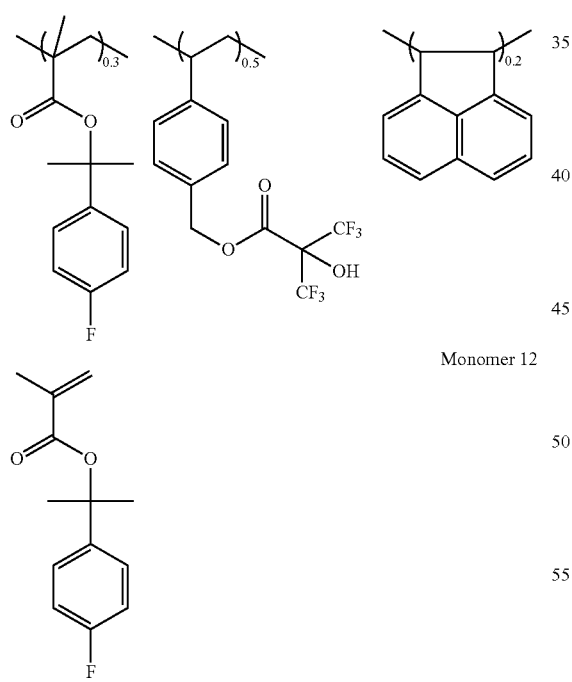

Polymer 12

Monomer 12

Comparative Synthesis Example 1

A 2-L flask was charged with 20.5 g of Monomer 13 (shown below), 3.1 g of styrene, and 40 g of tetrahydrofuran as solvent. The reactor was cooled to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and dried in vacuum at 60° C., yielding a white polymer.

The polymer was analyzed by $^{13}$C-NMR, $^{1}$H-NMR, and GPC, with the analytical data shown below.

Copolymer Composition (Molar Ratio)
Monomer 13:styrene=0.7:0.3
Mw=8,200
Mw/Mn=1.69

This is designated Reference Polymer 1.

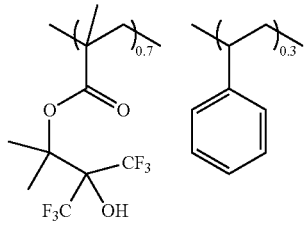

Reference Polymer 1

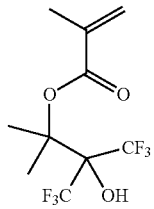

Monomer 13

EXAMPLES AND COMPARATIVE EXAMPLES

Preparation of Resist Composition

A positive resist composition in solution form was prepared by dissolving an additive polymer, i.e., resist film surface-modifying polymer (Polymers 1 to 12, shown above), a polymer obtained by conventional radical polymerization (Resist Polymers 1 to 5, shown below) and components in a solvent in accordance with the formulation of Table 1 and filtering through a filter with a pore size of 0.2 µm.

EUV Lithography Patterning Test

On a silicon substrate having a diameter of 4 inches, a silicon-containing SOG film of SHB-A940 (Shin-Etsu Chemical Co., Ltd.) was formed to a thickness of 35 nm. The positive resist composition was coated on the SOG film and prebaked on a hot plate at 110° C. for 60 seconds to form a resist film of 35 nm thick. The resist film was exposed to EUV through a pseudo phase-shift-mask (PSM) in an exposure tool (NA 0.3), baked (PEB) at the temperature shown in Table 2, developed in 0.20N tetrabutylammonium hydroxide (TBAH) aqueous solution for 30 seconds, rinsed with deionized water, and spin dried, forming a resist pattern. Sensitivity is the dose at which a 20-nm line-and-space pattern was formed. Maximum resolution is the minimum size which was resolved at that dose. The pattern was measured for edge roughness (LWR) under SEM. The results are shown in Table 2.

Resist Polymer 1
Mw=6,700
Mw/Mn=1.58
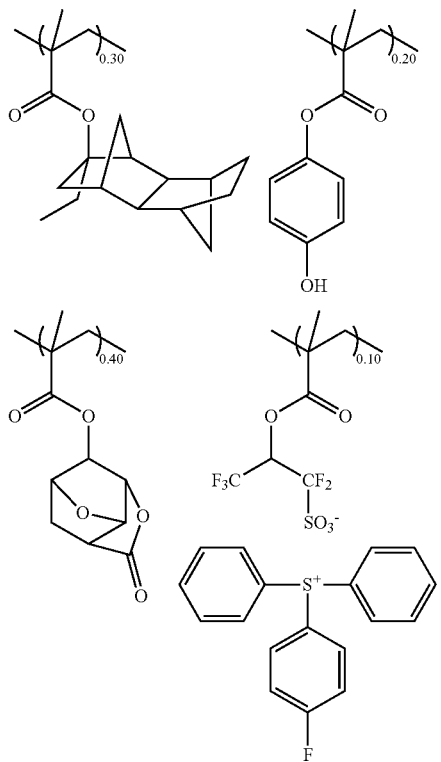
Resist Polymer 2
Mw=6,900
Mw/Mn=1.68
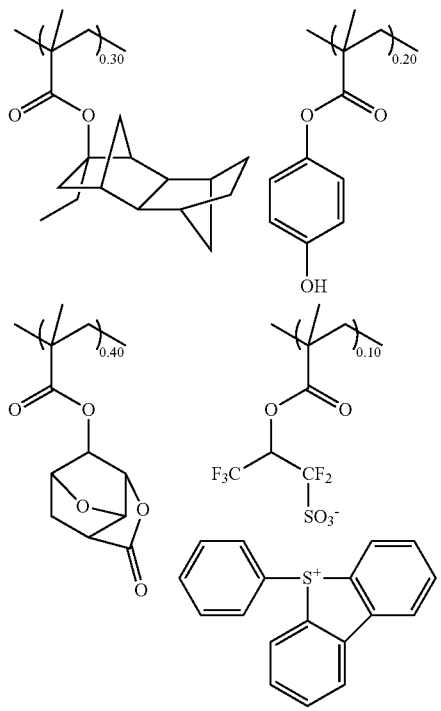
Resist Polymer 3
Mw=6,200
Mw/Mn=1.81
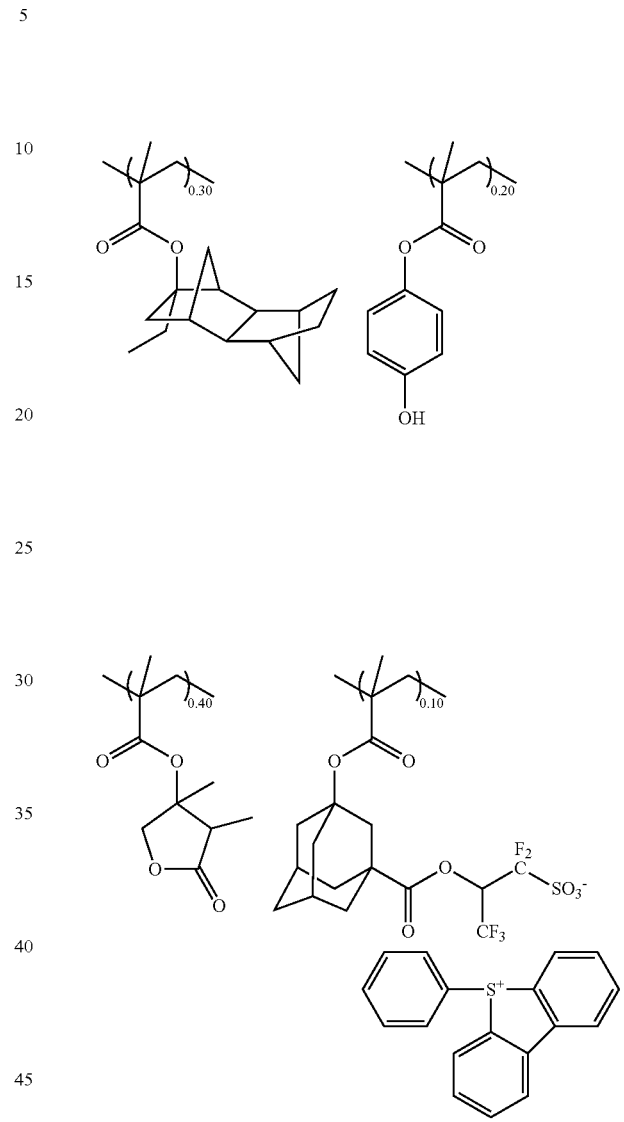
Resist Polymer 4
Mw=7,200
Mw/Mn=1.51
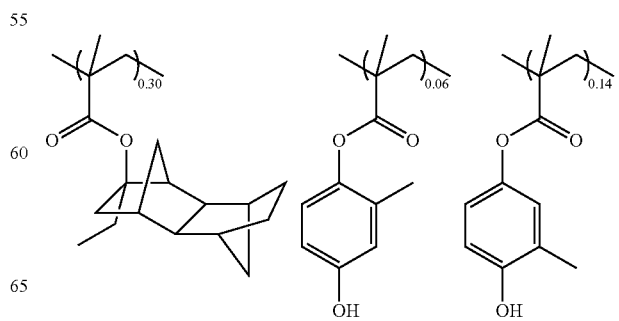

-continued
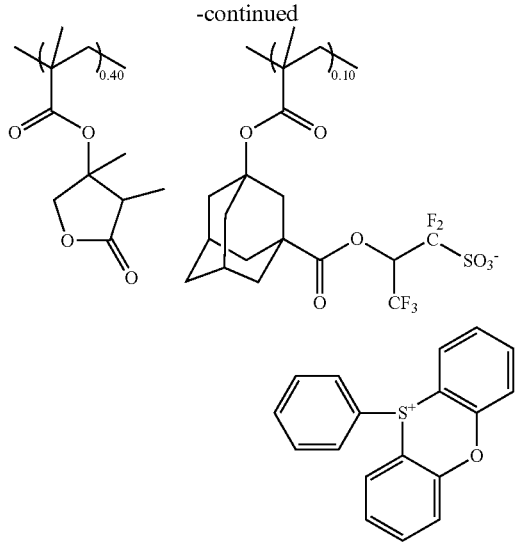
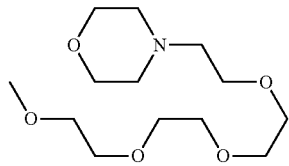
Quencher 1
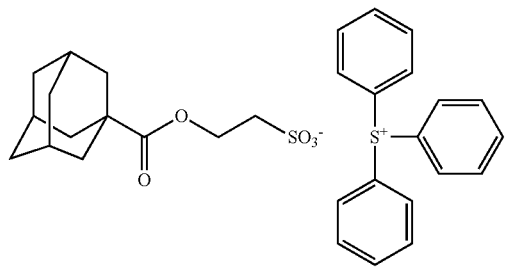
Quencher 2
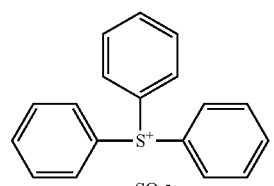
PAG 1
Resist Polymer 5
Mw=5,200
Mw/Mn=1.61
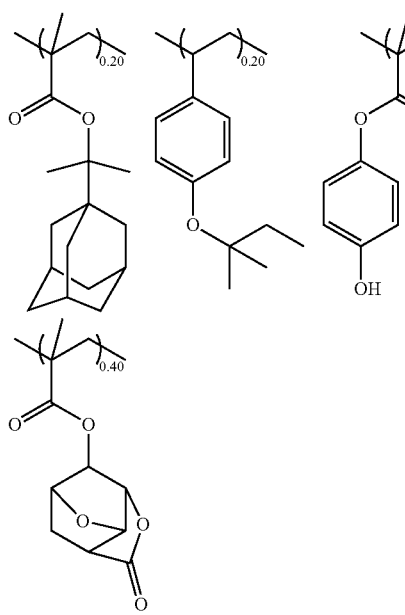
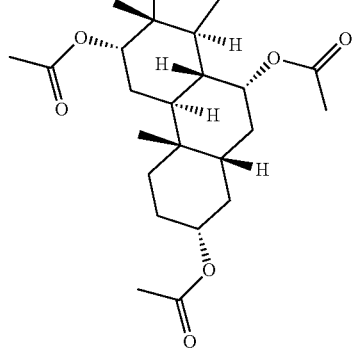
TABLE 1
|  |  | Polymer (pbw) | PAG (pbw) | Quencher (pbw) | Additive (pbw) | Surfactant (pbw) | Solvent (pbw) |
|---|---|---|---|---|---|---|---|
| Resist | 1 | Resist Polymer 1 (100) | — | Quencher 1 (1.123) | Polymer 1 (5.0) | FC-4430 (0.001) | PGMEA (2,000) PGME (1,000) cyclohexanone (3,000) |
|  | 2 | Resist Polymer 2 (100) | — | Quencher 1 (1.123) | Polymer 1 (5.0) | FC-4430 (0.001) | PGMEA (2,000) PGME (1,000) cyclohexanone (3,000) |
|  | 3 | Resist Polymer 3 (100) | — | Quencher 1 (1.123) | Polymer 1 (5.0) | FC-4430 (0.001) | PGMEA (2,000) PGME (1,000) cyclohexanone (3,000) |

TABLE 1-continued

| | | Polymer (pbw) | PAG (pbw) | Quencher (pbw) | Additive (pbw) | Surfactant (pbw) | Solvent (pbw) |
|---|---|---|---|---|---|---|---|
| | 4 | Resist Polymer 4 (100) | — | Quencher 1 (1.123) | Polymer 1 (5.0) | FC-4430 (0.001) | PGMEA (2,000) PGME (1,000) cyclohexanone (3,000) |
| | 5 | Resist Polymer 5 (100) | PAG 1 (25) | Quencher 1 (1.123) | Polymer 1 (5.0) | FC-4430 (0.001) | PGMEA (4,000) cyclohexanone (2,000) |
| | 6 | Resist Polymer 1 (100) | — | Quencher 1 (1.123) | Polymer 2 (5.0) | FC-4430 (0.001) | PGMEA (2,000) PGME (1,000) cyclohexanone (3,000) |
| | 7 | Resist Polymer 1 (100) | — | Quencher 1 (1.123) | Polymer 3 (5.0) | FC-4430 (0.001) | PGMEA (2,000) PGME (1,000) cyclohexanone (3,000) |
| | 8 | Resist Polymer 1 (100) | — | Quencher 1 (1.123) | Polymer 4 (5.0) | FC-4430 (0.001) | PGMEA (2,000) PGME (1,000) cyclohexanone (3,000) |
| | 9 | Resist Polymer 1 (100) | — | Quencher 1 (1.123) | Polymer 5 (5.0) | FC-4430 (0.001) | PGMEA (2,000) PGME (1,000) cyclohexanone (3,000) |
| | 10 | Resist Polymer 1 (100) | — | Quencher 1 (1.123) | Polymer 6 (5.0) | FC-4430 (0.001) | PGMEA (2,000) PGME (1,000) cyclohexanone (3,000) |
| | 11 | Resist Polymer 1 (100) | — | Quencher 1 (1.123) | Polymer 7 (5.0) | FC-4430 (0.001) | PGMEA (2,000) PGME (1,000) cyclohexanone (3,000) |
| | 12 | Resist Polymer 1 (100) | — | Quencher 1 (1.123) | Polymer 8 (5.0) | FC-4430 (0.001) | cyclopentanone (4,000) cyclohexanone (3,000) |
| | 13 | Resist Polymer 1 (100) | — | Quencher 1 (1.123) | Polymer 9 (5.0) | FC-4430 (0.001) | cyclopentanone (4,000) cyclohexanone (3,000) |
| | 14 | Resist Polymer 1 (100) | — | Quencher 1 (1.123) | Polymer 10 (5.0) | FC-4430 (0.001) | cyclopentanone (4,000) cyclohexanone (3,000) |
| | 15 | Resist Polymer 1 (100) | — | Quencher 1 (1.123) | Polymer 11 (5.0) | FC-4430 (0.001) | cyclopentanone (4,000) cyclohexanone (3,000) |
| | 16 | Resist Polymer 1 (100) | — | Quencher 1 (1.123) | Polymer 12 (5.0) | FC-4430 (0.001) | cyclopentanone (4,000) cyclohexanone (3,000) |
| Comparative Resist | 1 | Resist Polymer 1 (100) | — | Quencher 1 (1.123) | — | FC-4430 (0.001) | PGMEA (2,000) PGME (1,000) cyclohexanone (3,000) |
| | 2 | Resist Polymer 1 (100) | — | Quencher 1 (1.123) | Reference Polymer 1 (5.0) | FC-4430 (0.001) | PGMEA (2,000) PGME (1,000) cyclohexanone (3,000) |

PGMEA: propylene glycol monomethyl ether acetate
PGME: propylene glycol monomethyl ether
FC-4430: fluorochemical surfactant by 3M-Sumitomo Co., Ltd.

TABLE 2

| | | PEB temperature (° C.) | Sensitivity (mJ/cm$^2$) | Maximum resolution (nm) | LWR (nm) |
|---|---|---|---|---|---|
| Resist | 1 | 90 | 17 | 18 | 4.8 |
| | 2 | 85 | 17 | 18 | 4.7 |
| | 3 | 85 | 17 | 17 | 4.6 |
| | 4 | 85 | 17 | 17 | 4.6 |
| | 5 | 85 | 15 | 18 | 4.7 |
| | 6 | 90 | 15 | 17 | 4.7 |
| | 7 | 90 | 15 | 18 | 4.7 |
| | 8 | 90 | 15 | 17 | 4.4 |
| | 9 | 90 | 15 | 18 | 4.4 |
| | 10 | 90 | 15 | 17 | 4.5 |
| | 11 | 90 | 15 | 17 | 4.3 |
| | 12 | 90 | 15 | 17 | 4.7 |
| | 13 | 90 | 15 | 17 | 4.4 |
| | 14 | 90 | 15 | 17 | 4.6 |
| | 15 | 90 | 15 | 17 | 4.7 |
| | 16 | 90 | 14 | 17 | 4.7 |
| Comparative Resist | 1 | 90 | 15 | 20 | 6.0 |
| | 2 | 90 | 15 | 18 | 5.2 |

Japanese Patent Application No. 2012-281961 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer capable of increasing alkali solubility under the action of acid as base resin, and a polymer comprising recurring units (p) of the general formula (1) as polymeric additive,

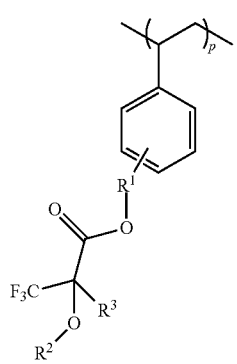

wherein $R^1$ is a straight or branched $C_1$-$C_4$ alkylene group, $R^2$ is $C_1$-$C_{15}$ acyl group or acid labile group, $R^3$ is hydrogen, methyl or trifluoromethyl, and p is in the range: $0<p\leq1.0$.

2. The resist composition of claim 1 wherein the additive polymer has the general formula (2):

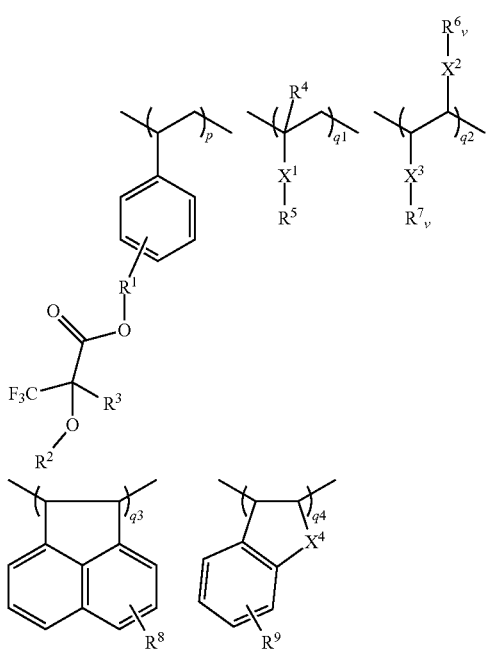

(2)

wherein $R^1$ to $R^3$ are as defined above, $R^4$ is hydrogen or methyl, $X^1$ is a single bond, —C(=O)—O— or —O—, $X^2$ and $X^3$ each are phenylene or naphthylene, $X^4$ is methylene, oxygen or sulfur, $R^5$ is a $C_6$-$C_{20}$ aryl or aralkyl group which may contain a hydroxyl, straight, branched or cyclic alkyl or alkoxy, ester (—OCOR or —COOR wherein R is $C_1$-$C_6$ alkyl), ketone (—COR wherein R is $C_1$-$C_6$ alkyl), fluorine, trifluoromethyl, nitro, amino or cyano moiety, $R^6$, $R^7$, $R^8$, and $R^9$ are each independently hydrogen, hydroxyl, straight, branched or cyclic $C_1$-$C_{10}$ alkyl, alkoxy or acyloxy group, cyano, nitro, amino, halogen, ester (—OCOR or —COOR wherein R is $C_1$-$C_6$ alkyl or fluoroalkyl), or carboxyl group, v is 1 or 2, p, q1, q2, q3 and q4 are in the range: $0<p<1.0$, $0\leq q1<1.0$, $0\leq q2<1.0$, $0\leq q3<1.0$, $0\leq q4<1.0$, and $0<q1+q2+q3+q4<1.0$.

3. The resist composition of claim 1 which is a chemically amplified positive resist composition.

4. The resist composition of claim 3 wherein the polymer as base resin comprises recurring units having an acid labile group and recurring units having a hydroxyl and/or lactone ring adhesive group.

5. The resist composition of claim 4 wherein the polymer as base resin has a weight average molecular weight of 1,000 to 500,000, and the recurring units having an acid labile group are recurring units of at least one type selected from recurring units (a1) and (a2) having a carboxyl and/or phenolic hydroxyl group substituted with an acid labile group, as represented by the general formula (3):

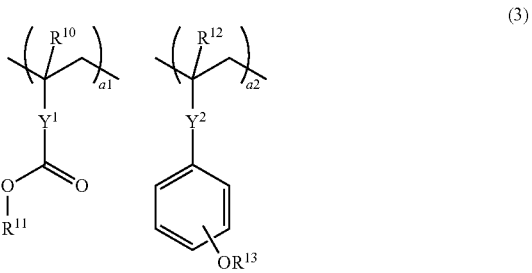

(3)

wherein $R^{10}$ and $R^{12}$ are each independently hydrogen or methyl, $R^{11}$ and $R^{13}$ each are an acid labile group, $Y^1$ is a single bond, a $C_1$-$C_{12}$ linking group having at least one of ester (—COO—), lactone ring, phenylene and naphthylene, a phenylene group or a naphthylene group, $Y^2$ is a single bond, ester (— COO—) group or amide (—CONH—) group, a1 and a2 are numbers in the range: $0\leq a1\leq 0.9$, $0\leq a2\leq 0.9$, and $0<a1+a2<1.0$.

6. The resist composition of claim 5 wherein the polymer comprising recurring units of at least one type selected from recurring units (a1) and (a2) having a carboxyl and/or phenolic hydroxyl group substituted with an acid labile group, represented by the general formula (3), has further copolymerized therein recurring units of at least one type selected from sulfonium salt units (b1) to (b3), as represented by the general formula (4):

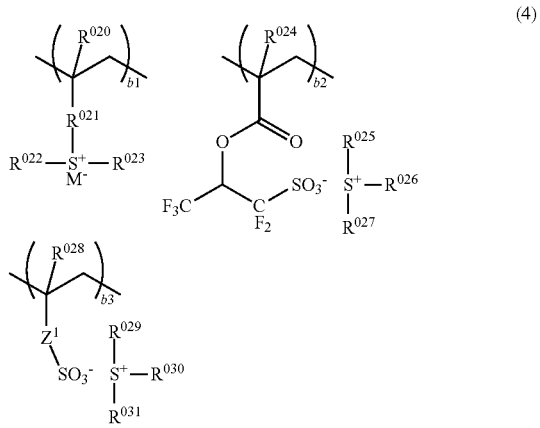

(4)

wherein $R^{020}$, $R^{024}$, and $R^{028}$ each are hydrogen or methyl, $R^{021}$ is a single bond, phenylene, —O—$R^{033}$—, or —C(=O)—Y—$R^{033}$—, Y is oxygen or NH, $R^{033}$ is a straight, branched or cyclic $C_1$-$C_6$ alkylene group, alkenylene group or phenylene group, which may contain a carbonyl, ester, ether, or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $Z^1$ is a single bond, methylene, ethylene, phenylene, fluorinated phenylene, —O—$R^{032}$—, or —C(=O)—$Z^2$—$R^{032}$—, $Z^2$ is oxygen or NH, $R^{032}$ is a straight, branched or cyclic $C_1$-$C_6$ alkylene, alkenylene or phenylene group which may contain a carbonyl, ester, ether or hydroxyl moiety, M⁻ is a non-nucleophilic counter ion, b1, b2 and b3 are in the range: $0\leq b1\leq 0.3$, $0\leq b2\leq 0.3$, $0\leq b3\leq 0.3$, and $0<b1+b2+b3\leq 0.3$.

7. The resist composition of claim 1, further comprising at least one of an organic solvent, basic compound, dissolution regulator, and surfactant.

8. The resist composition of claim 1 wherein 0.1 to 50 parts by weight of the additive polymer is present per 100 parts by weight of the polymer as base resin.

9. A pattern forming process comprising the steps of applying the resist composition of claim 1 onto a substrate to form a coating, baking, exposing the coating to high-energy radiation, and developing the exposed coating in a developer.

10. The pattern forming process of claim 9 wherein the high-energy radiation is KrF excimer laser of wavelength 248 nm, ArF excimer laser of wavelength 193 nm, electron beam or soft x-ray of wavelength 3 to 15 nm.

11. A polymer represented by the general formula (2) and having a weight average molecular weight of 1,000 to 500,000,

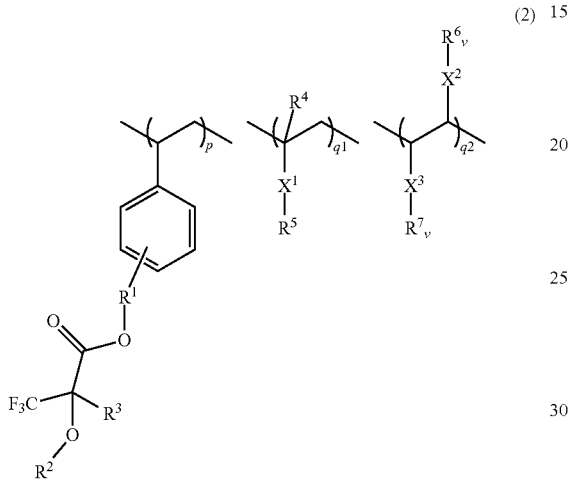

(2)

-continued

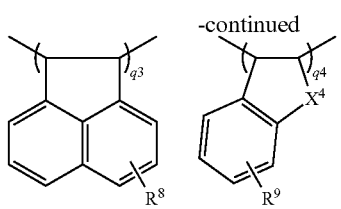

wherein $R^1$ is a straight or branched $C_1$-$C_4$ alkylene group, $R^2$ is $C_1$-$C_{15}$ acyl group or acid labile group, $R^3$ is hydrogen, methyl or trifluoromethyl, $R^4$ is hydrogen or methyl, $X^1$ is a single bond, —C(=O)—O— or —O—, $X^2$ and $X^3$ each are phenylene or naphthylene, $X^4$ is methylene, oxygen or sulfur, $R^5$ is a $C_6$-$C_{20}$ aryl or aralkyl group which may contain a hydroxyl, straight, branched or cyclic alkyl or alkoxy, ester (—OCOR or —COOR wherein R is $C_1$-$C_6$ alkyl), ketone (—COR wherein R is $C_1$-$C_6$ alkyl), fluorine, trifluoromethyl, nitro, amino or cyano moiety, $R^6$, $R^7$, $R^8$, and $R^9$ are each independently hydrogen, hydroxyl, straight, branched or cyclic $C_1$-$C_{10}$ alkyl, alkoxy or acyloxy group, cyano, nitro, amino, halogen, ester (—OCOR or —COOR wherein R is $C_1$-$C_6$ alkyl or fluoroalkyl), or carboxyl group, v is 1 or 2, p, q1, q2, q3 and q4 are in the range: $0<p<1.0$, $0\leq q1<1.0$, $0\leq q2<1.0$, $0\leq q3<1.0$, $0\leq q4<1.0$, and $0<q1+q2+q3+q4<1.0$.

\* \* \* \* \*